United States Patent
Tani et al.

(10) Patent No.: US 6,900,749 B2
(45) Date of Patent: May 31, 2005

(54) ANALOG-TO-DIGITAL CONVERSION CIRCUIT

(75) Inventors: Kuniyuki Tani, Ogaki (JP); Atsushi Wada, Ogaki (JP); Shigeto Kobayashi, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/663,984

(22) Filed: Sep. 17, 2003

(65) Prior Publication Data

US 2004/0125006 A1 Jul. 1, 2004

(30) Foreign Application Priority Data

Sep. 20, 2002 (JP) ........................................ 2002-275509
Sep. 10, 2003 (JP) ........................................ 2003-318834

(51) Int. Cl.[7] ................................................ H03M 1/10
(52) U.S. Cl. ........................................ 341/118; 341/162
(58) Field of Search .......................... 341/118–121, 156, 341/161–162

(56) References Cited

U.S. PATENT DOCUMENTS 5,047,772 A * 9/1991 Ribner ........................ 341/156
5,635,937 A * 6/1997 Lim et al. ................... 341/161
6,304,206 B1 10/2001 Wada et al.
6,369,744 B1 * 4/2002 Chuang ....................... 341/161

FOREIGN PATENT DOCUMENTS

JP 9-69776 3/1997
JP 11-88172 3/1999

* cited by examiner

Primary Examiner—Howard L. Williams
(74) Attorney, Agent, or Firm—McDermott Will & Emery LLP

(57) ABSTRACT

Digital signals of the most significant bit to the least significant bit are supplied to a digital calibration operation unit from a redundancy correction circuit, and an intermediate high order 2-bit digital signal is supplied to a correction value selection circuit. A DC control signal is supplied to the correction value selection circuit. A plurality of groups of correction values corresponding to the values of the intermediate high order 2-bit digital signal are stored in advance in a correction value ROM. The correction value selection circuit reads out a correction value from the correction value ROM based on the DC control signal and the intermediate high order 2-bit digital signal. The digital calibration operation unit adds the correction value AM to the digital signals of the most significant bit to the least significant bit, and outputs a resulting value as a digital output value.

19 Claims, 36 Drawing Sheets

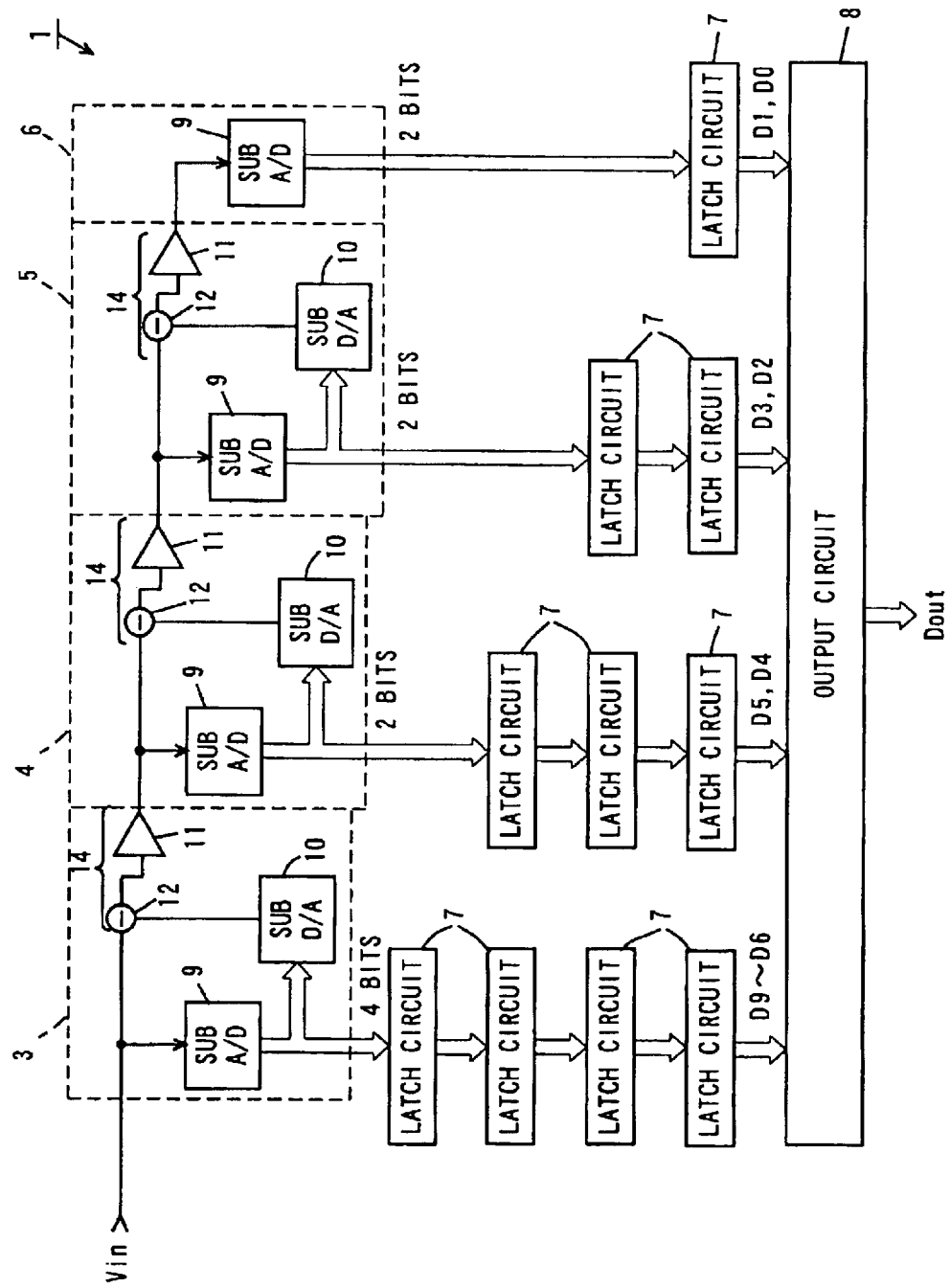

TBL

|  |  | DC CONTROL SIGNAL IN1, IN2 | | | |
|---|---|---|---|---|---|
| D5 | D4 | 0,0 | 0,1 | 1,0 | 1,1 |
| 1 | 1 | 00(0) | 01(1) | 10(2) | 11(3) |
| 1 | 0 | 00(0) | 01(1) | 01(1) | 10(2) |
| 0 | 1 | 00(0) | 00(0) | 01(1) | 01(1) |
| 0 | 0 | 00(0) | 00(0) | 00(0) | 00(0) |

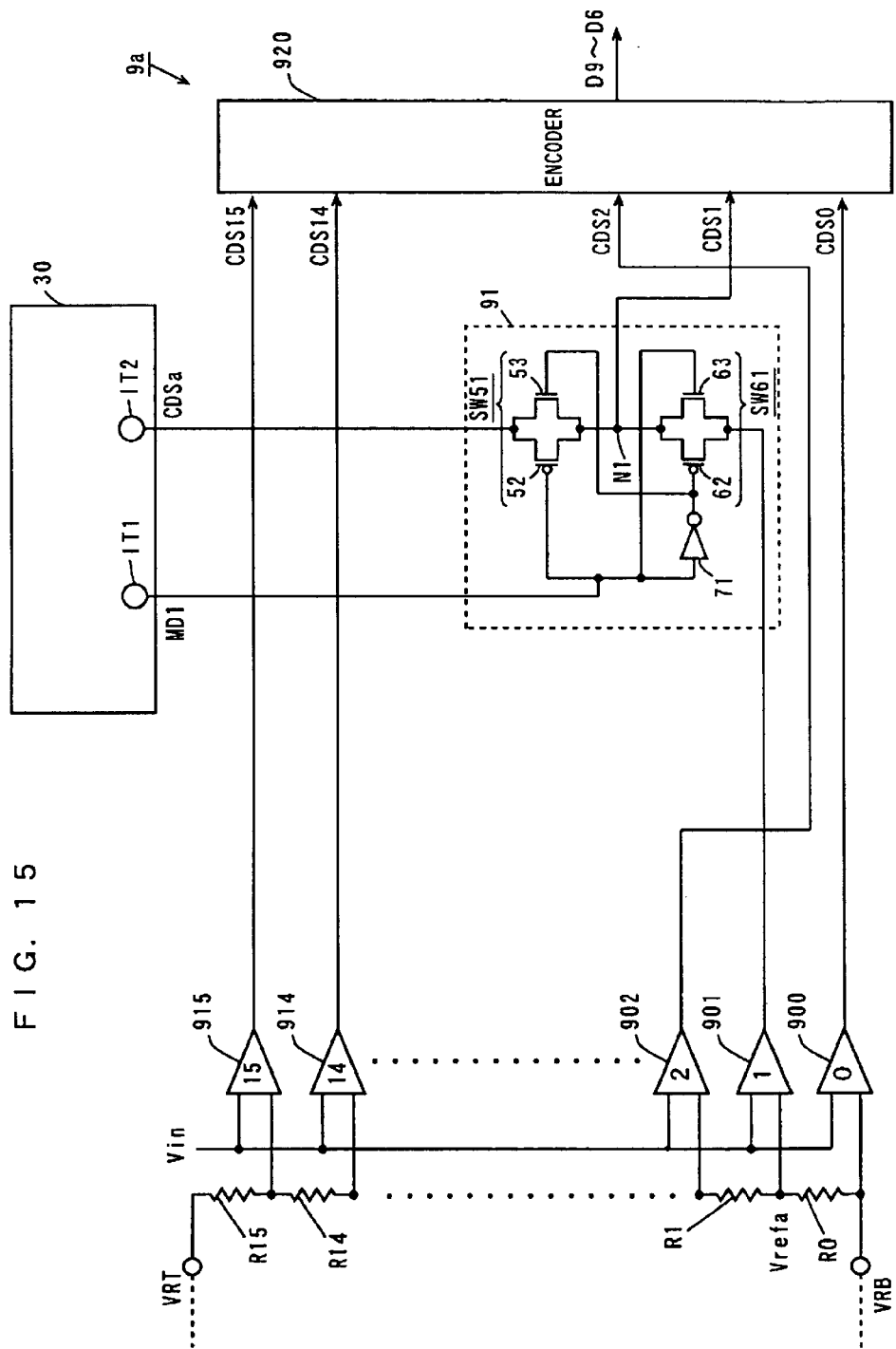
F I G. 1 5

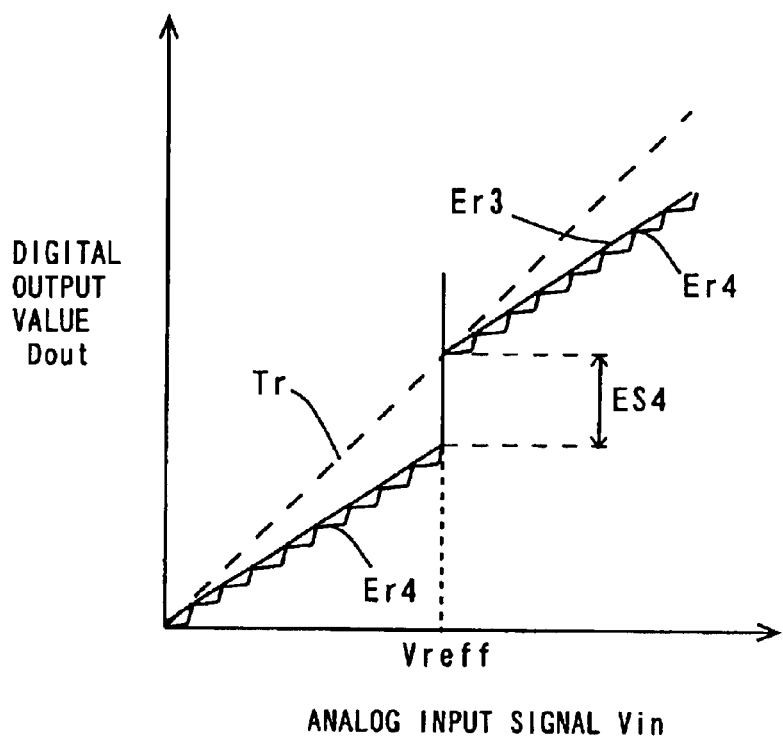
F I G. 2 7

F I G. 3 0
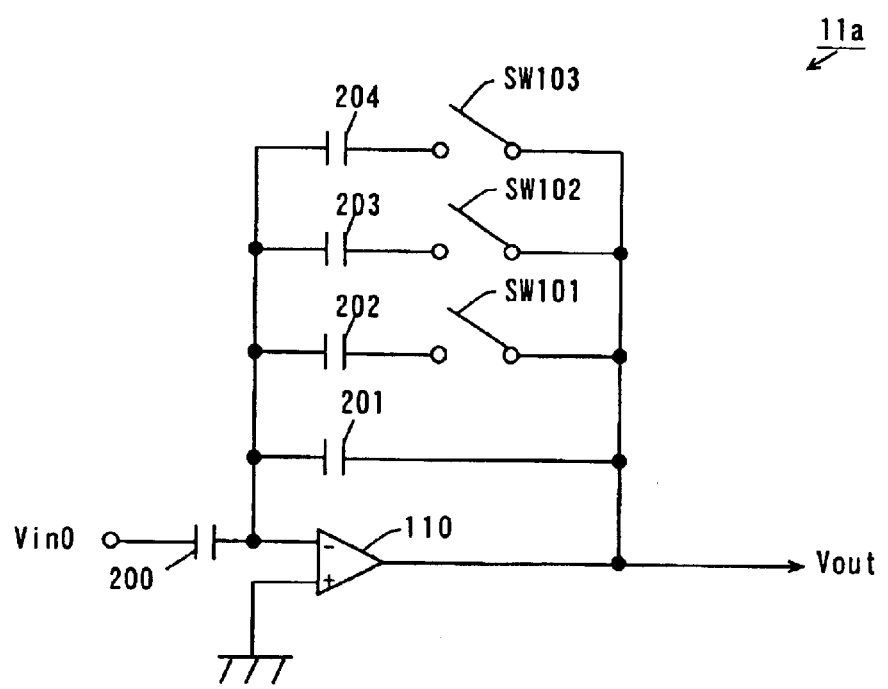

ANALOG-TO-DIGITAL CONVERSION CIRCUIT

BACKGROUND OF THE INVENTION

1. Field of the Invention

This invention relates to an analog-to-digital conversion circuit which converts an analog signal into a digital signal.

2. Description of the Background Art

In recent years, the demands for analog-to-digital conversion circuits (A/D converters) for processing video signals have grown with advance in digital processing techniques for video signals. The high-speed conversion operations are required for the analog-to-digital conversion circuits for processing video signals. For this reason, conventionally, two-step flash (two-step parallel) systems have been widely used.

However, with an increase in the number of converted bits, it has become difficult to obtain sufficient conversion accuracy in the two-step flash systems. Therefore, analog-to-digital conversion circuits having multi-stage pipeline structures have been developed.

FIG. 35 is a block diagram showing the structure of an analog-to-digital conversion circuit having a conventional multi-stage pipeline structure. The analog-to-digital conversion circuit shown in FIG. 35 has a 10-bit four-stage pipeline structure.

In FIG. 35, the analog-to-digital conversion circuit 101 comprises a first-stage circuit 103, a second-stage circuit 104, a third-stage circuit 105, a fourth-stage circuit 106, a plurality of latch circuits 107, and an output circuit 108.

Each of the first (initial)-to third-stage circuits 103 to 105 comprises a sub-A/D converter 109, a sub-D/A (digital-to-analog) converter 110, a subtraction circuit 112, and an operational amplifier 111. The fourth (final)-stage circuit 106 comprises only a sub-A/D converter 109. In the following description, the subtraction circuit 112 and the operational amplifier 111 constitute a differential amplifier circuit 114.

The first-stage circuit 103 has a 4-bit configuration, and each of the second- to fourth-stage circuits has a 2-bit configuration. In each of the first- to third-stage circuits 103 to 105, the respective numbers of bits (bit configurations) of the sub-A/D converter 109 and the D/A converter 110 are set to the same value.

The operations of the analog-to-digital conversion circuit 101 will be then described. Analog-to-digital conversion will be hereinafter abbreviated to A/D conversion.

First, an analog input signal Vin is transferred to the first-stage circuit 103. In the first-stage circuit 103, the sub-A/D converter 109 subjects the analog input signal Vin to A/D conversion. A high order 4-bit digital output D9, D8, D7, D6, which is the result of the A/D conversion by the sub-A/D converter 109, is transferred to the sub-D/A converter 110, and is also transferred to the output circuit 108 through the four latch circuits 107.

The subtraction circuit 112 subtracts the result of the D/A conversion by the sub-D/A converter 110 from the analog input signal Vin. The operational amplifier 111 amplifies an output from the subtraction circuit 112. An output from the operational amplifier 111 is transferred to the second-stage circuit 104.

The second-stage circuit 104 carries out the same operations as those of the first-stage circuit 103 with respect to the output from the operational amplifier 111 in the first-stage circuit 103. The third-stage circuit 105 also carries out the same operations as those of the first-stage circuit 103 with respect to an output from the operational amplifier 111 in the second-stage circuit 104. Accordingly, an intermediate high order 2-bit digital signal D5, D4 is obtained from the second-stage circuit 104, and an intermediate low order two-bit digital signal D3, D2 is obtained from the third-stage circuit 105.

In the fourth-stage circuit 106, the sub-A/D converter 109 subjects an output from the operational amplifier 111 in the third-stage circuit 105 to A/D conversion, such that a low order two-bit digital signal D1, D0 is obtained.

The digital signals D9 to D0 from the first- to fourth-stage circuits 103 to 106 simultaneously reach the output circuit 108 through the respective latch circuits 107. In other words, the latch circuits 107 are provided to synchronize the respective outputs of the digital signals D9 to D0 from the circuits 103 to 106 with each other.

The output circuit 108 outputs a 10-bit digital output value Dout of the analog input signal Vin.

In the analog-to-digital conversion circuit 101, in each of the circuits 103 to 105, the operational amplifier 111 amplifies the difference between the analog input signal Vin or the output from the operational amplifier 111 in the previous stages of circuits 103 or 104 and the result of the D/A conversion of the digital output in the current stage of circuit 103, 104, or 105.

Consequently, even if the number of converted bits increases to reduce the LSB (Least Significant Bit), the resolution of each of comparators constituting the sub-A/D converter 109 can be substantially improved, thereby obtaining sufficient conversion accuracy.

FIG. 36 is a circuit diagram showing one example of the differential amplifier 114 shown in FIG. 35. FIG. 37 is a diagram for explaining the operations of the differential amplifier circuit 114 shown in FIG. 36.

In FIG. 36, an inverse input terminal of the operational amplifier 111 is connected to a node nb, and a non-inverse input terminal is grounded. An output terminal of the operational amplifier 111 is connected to a node no, and is also connected to the inverse input terminal through a capacitor 102. A switch SW1 is connected between the inverse input terminal and the non-inverse input terminal, and a capacitor 103 is connected between the node nb and a node na. The node na is connected to a node n1 through a SW2, and is also connected to a node n2 through a switch SW3. A voltage V1 is inputted to the node n1, a voltage V2 is inputted to the node n2, a voltage V0 is outputted from the node no.

Referring now to FIG. 37, the operations of the differential amplifier circuit 114 shown in FIG. 36 will be described. Let C be a capacitance value of the capacitor 102, KC be a capacitance value of the capacitor 103, and VG be a ground potential. K is a constant.

First, as shown in FIG. 37, the switch SW1 and the switch SW2 are turned on, and the switch SW3 is turned off. Consequently, the voltage at the node na is V1. Furthermore, the voltage at the node no is 0. At the time, the charge Qa at the node nb is expressed by the following equation:

$$Qa = (VG - V1)KC \qquad (1)$$

Secondly, as shown in FIG. 37, the switch SW1 is turned off, and then the switch SW2 is turned off and the switch SW3 is turned on. Consequently, the voltage at the node na is V2, and the voltage at the node no is V0. At this time, the node nb is virtually grounded. Therefore, the charge Qb at the node nb is expressed by the following equation:

$$Qb=(VG-V2)KC+(VG-V0)C \qquad (2)$$

Since there is no path through which charge flows out at the node nb, Qa=Qb from the principle of conservation of charge. Consequently, the following equation holds:

$$(VG-V1)KC=(VG-V2)KC+(VG-V0)C \qquad (3)$$

From the foregoing equation, the voltage V0 at the node no is expressed by the following equation:

$$V0=VG+(V1-V2)K \qquad (4)$$

In this manner, the voltage V2 is subtracted from the voltage V1, and the subtracted value is amplified by a factor of K.

These are, however, ideal operations of the differential amplification circuit 114. In reality, an error may occurs in the ratio of accuracy of the capacitance due to manufacturing variations in the differential amplifier circuit 114. Let (K-err) C be the capacitance value of the capacitor 103, and the voltage V0 at the node no by the equation (4) is expressed by the following equation:

$$\begin{aligned}VO &= VG + (V1 - V2) \cdot (K - err) \qquad (5)\\ &= VG + (V1 - V2)K - (V1 - V2)err\end{aligned}$$

where the third item at the right side of the equation (5) represents the gain error of the differential amplification circuit 114 caused by the error in the ratio of accuracy of the capacitance, and err represents the gradient of the gain error.

FIG. 38 is a diagram showing the input/output characteristics of the analog-to-digital conversion circuit 101 shown in FIG. 35. FIG. 39 is an enlarged view of a part of the input/output characteristics shown in FIG. 38. In FIGS. 38 and 39, the abscissa shows the analog input signal Vin, and the ordinate shows the digital output value Dout.

In FIG. 38, the broken line Tr shows the ideal input/output characteristics of the analog-to-digital conversion circuit 101, and the solid line Er shows the input/output characteristics in a case where the differential amplifiers 114 of the analog-to-digital conversion circuit 101 have gain errors.

Ideally, it is desired that the digital output value Dout has a constant proportional relationship with the analog input signal Vin, as shown by the broken line Tr. In a case where the differential amplifier circuits 114 have gain errors, however, a non-linearity error (hereinafter referred to as an interstage gain error) occurs in the input/output characteristics of the analog-to-digital conversion circuit 101, as shown by the solid line Er.

In the analog-to-digital conversion circuit 101 shown in FIG. 35, the gain error of the differential amplifier circuit 114 in the first-stage circuit 103, the gain error of the differential amplifier circuit 114 in the second-stage circuit 104, and the gain error of the differential amplifier circuit 114 in the third-stage circuit 105 impact the input/output characteristics. Since the first-stage circuit 103 outputs the high order 4-bit digital signal D9 to D6, the gain error of the differential amplification circuit 114 in the first-stage circuit 103 impacts the input/output characteristics the most.

Accordingly, by correcting the interstage gain error due to the gain error of the differential amplification circuit 114 in the first-stage circuit, it is possible to reduce the interstage gain error in the input/output characteristics of the analog-to-digital conversion circuit 101.

Gain error components in the input/output characteristics can be found from the digital output value Dout and the gradient err of the gain error in the analog-to-digital conversion circuit 101 before correction. It is thus possible to reduce the interstage gain error by correcting these gain error components by way of digital operations as shown below.

A circuit correcting an error based on an error signal err (D) will be then described.

FIG. 40 is a block diagram showing one example of the structure of the output circuit 108 shown in FIG. 35.

As shown in FIG. 40, the output circuit 108 includes a multiplier 501 and a digital calibration operation unit 502. The digital calibration operation unit 502 is composed of a 10-bit adder.

To the output circuit 108, the digital signals outputted from the first- to fourth-stage circuits 103 to 106 shown in FIG. 35 are inputted. Here, the interstage gain error is corrected using the digital signal D5, D4, which is impacted by the gain error of the differential amplifier circuit 114 in the first-stage.

The digital signals D9 to D0 outputted from the first-to fourth-stage circuits 103 to 106 are supplied to the digital calibration operation unit 502. Of the digital signals D9 to D0, the digital signal D5, D4 outputted from the second-stage circuit 104 is supplied to the multiplier 501.

Furthermore, the error signal err (D) representing the digital value corresponding to the gradient err of the gain error of the differential amplifier circuit 114 in the first-stage is supplied to the multiplier 501. This error signal err is predetermined. The multiplier 501 multiplies the error signal err (D) and the digital signal D5, D4, and supplies the result of multiplication to the digital calibration operation unit 502 as a correction value. The digital calibration operation circuit 502 adds the correction value to the digital signals D9 to D0, and outputs a resulting value as a digital output value Dout.

FIG. 41 is a diagram showing one example of the correction of the interstage gain errors in the output circuit 108 shown in FIG. 40. In FIG. 41, the solid line Tr shows the ideal input/output characteristics, the broken line Er shows the input/output characteristics of the analog-to-digital circuit 101 in a case where the differential amplifier circuits 114 have gain errors, and the solid line Ta shows the input/output characteristics after correction.

In the example of FIG. 41, the maximum value of the interstage gain error in the input/output characteristics is 4LSB. In this case, the error signal err (D) is set to 1LSB. In a case where the digital signal D5, D4 is "0, 0", the correction value is set to "00" (=0), in a case where "0, 1", the correction value is set to "01" (=1), in a case where "1, 0", the correction value is set to "10" (=2), and in a case where "1, 1", the correction value is set to "11" (=3). By adding this correction value to the values of the 10-bit digital signals D9 to D0, the maximum value of the error in the input/output characteristics after correction to the ideal input/output characteristics is reduced to 1 LSB.

FIG. 42 is a diagram showing another example of the correction of the interstage gain error in the output circuit 108 shown in FIG. 40. In FIG. 42, the solid line Tr shows the ideal input/output characteristics of the analog-to-digital conversion circuit 101, the broken line Er shows the input/output characteristics in a case where the differential amplifier circuits 114 have gain errors, and the solid line Ta shows the input/output characteristics after correction.

In the example of FIG. 42, the maximum value of the interstage gain error in the input/output characteristics is set to 2LSB. In this case, the error signal err (D) is set to 1 LSB. In a case where the digital signal D5, D4 is "0, 0", the correction value is "00" (=0), in a case where "0, 1", the correction value is "01" (=1), in a case where "1, 0", the correction value is "10" (=2), and in a case where "1, 1", the correction value is "11" (=3). By adding this correction value to the values of the 10-bit digital signal D9 to D0, the maximum value of the error in the input/output characteristics after correction to the ideal input/output characteristics is reduced to 1.5 LSB.

In this manner, the interstage gain error in the input/output characteristics of the analog-to-digital conversion circuit 101 due to the gain errors of the differential amplifier circuits 114 can be reduced.

However, the output circuit 108 in the conventional analog-to-digital conversion circuit 101 includes a multiplier 501. Therefore, its circuit scale is increased.

Furthermore, since the correction value is calculated using the multiplier 501, the correction value is limited to the combination of 0×err (D), 1×err (D), 2×err (D), and 3×err (D). As described in the foregoing, in a case where the correction signal err (D) is set to the minimum value of 1LSB, the correction value is limited to the combination of 0 LSB, 1 LSB, 2 LSB, and 3 LSB. Thus, it is difficult to sufficiently reduce the interstage gain error in the input/output characteristics of the analog-to-digital conversion circuit 101 due to the gain errors of the differential amplifier circuits 114.

SUMMARY OF THE INVENTION

It is an object of the present invention to provide an analog-to-digital conversion circuit having a multi-stage pipeline structure in which an interstage gain error in the input/output characteristics due to a gain error of a differential amplifier circuit can be sufficiently reduced without increasing the circuit scale.

It is another object of the present invention to provide an analog-to-digital circuit in which an error of the analog-to-digital conversion can be sufficiently reduced without increasing the circuit scale.

It is still another object of the present invention to provide an analog-to-digital conversion circuit in which an interstage gain error in the input/output characteristics can be detected.

An analog-to-digital conversion circuit according to one aspect of the present invention comprises an analog-to-digital converter that converts an analog input signal into a digital signal for output; a group of correction values being preset for each value of an arbitrary digital signal outputted from the analog-to-digital converter, a correction value output circuit that outputs a corresponding correction value based on the digital signal outputted from the analog-to-digital converter; and a correction circuit that corrects the digital signal by way of operation based on the correction value outputted from the correction value output circuit.

In the analog-to-digital conversion circuit, the group of correction values is preset for each value of the arbitrary digital signal outputted from the analog-to-digital converter. The analog input signal is converted into the digital signal by the analog-to-digital converter for output, the corresponding correction value is outputted from the correction value output circuit based on the digital signal outputted from the analog-to-digital converter, and the digital signal is corrected by way of operation based on the correction value outputted from the correction value output circuit.

In this case, the correction value corresponding to the digital signal is outputted among the preset group of correction values, and the digital signal is corrected by way of operation based on the correction value outputted, thereby eliminating a need to employ multiplier, resulting in reduced circuit scale. In addition, the correction values can be preset, thereby making it possible to reduce the error of the analog-to-digital conversion.

An analog-to-digital conversion circuit according to another aspect of the present invention is an analog-to-digital conversion circuit having a multi-pipeline structure composed of a plurality of stages of circuits for converting an analog input signal into a digital output value, wherein each of the stages of circuits except the final stage includes an analog-to-digital converter that converts an inputted analog signal into a digital signal; a digital-to-analog converter that converts the digital signal outputted from the analog-to-digital converter into an analog signal; and a differential amplifier circuit that amplifies the difference between the inputted analog signal and the analog signal outputted from the digital-to-analog converter, digital signals outputted from the analog-to-digital converters in the plurality of stages of circuits constituting the digital output value, a correction value for correcting an error of the digital output value due to a gain error of the differential amplifier circuit in at least one stage of circuit in the plurality of stages being preset for each value of the digital signal outputted from the analog-to-digital converter in a subsequent stage of circuit, the analog-to-digital conversion circuit comprising: a correction value output circuit that outputs a corresponding correction value based on the digital signal outputted from the analog-to-digital converter in the subsequent stage of circuit; and a correction circuit that corrects the digital output value based on the correction value outputted from the correction value output circuit.

In the analog-to-digital conversion circuit, in each of the stages of circuits except the final stage, the inputted analog signal is converted into the digital signal, the digital signal outputted from the analog-to-digital converter is converted into the analog signal by the digital-to-analog converter, and the difference between the inputted analog signal and the analog signal outputted from the digital-to-analog converter is amplified by the differential amplifier circuit. The digital output value is constituted by the digital signals outputted from the analog-to-digital converters in the plurality of stages of circuits.

Meanwhile, the correction value for correcting the error of the digital output value due to the gain error of the differential amplifier circuit in the at least one stage of circuit of the plurality of stages is preset in the correction value output circuit for each value of the digital signal outputted from the analog-to-digital converter in the subsequent stage of circuit, and the corresponding correction value is outputted based on the digital signal outputted from the analog-to-digital converter in the subsequent stage of circuit. The digital output value is corrected by the correction circuit based on the correction value outputted from the correction value output circuit.

In this case, the correction value corresponding to the digital signal outputted among the correction values each preset for each value of the digital output value is selected to correct the digital output value, thereby eliminating a need to employ multiplier, resulting in reduced circuit scale. In addition, correction values unable to be calculated with a multiplier can be arbitrarily set, so as to sufficiently reduce the error of the digital output value due to the gain error.

The correction value output circuit may include a storage circuit that stores a correction value for each value of the digital signal outputted from the analog-to-digital converter in the subsequent stage of circuit, and a selection circuit that selects a corresponding correction value among the correction values stored in the storage circuit based on the digital signal outputted from the analog-to-digital converter in the subsequent stage of circuit for output.

In this case, a correction values is stored in advance in the storage circuit for each value of the digital signal outputted from the analog-to-digital converter in the subsequent stage of circuit, and the corresponding correction value is selected by the selection circuit among the correction values stored based on the digital signal outputted from the analog-to-digital converter in the subsequent stage of circuit. Therefore, arbitrary correction values can be stored in the storage circuit to sufficiently reduce the error of the digital output value due to the gain error.

The storage circuit may store a plurality of groups of correction values each group of correction values set for each values of the digital signal outputted from the analog-to-digital converter in the subsequent stage of circuit, and the selection circuit may select a corresponding correction value among the plurality of groups of correction values stored in the storage circuit based on a predetermined control signal and the digital signal outputted from the analog-to-digital converter in the subsequent stage of circuit for output.

In this case, the corresponding correction value is selected by the selection circuit among the plurality of groups of correction values stored in the storage circuit that stores the plurality of groups of correction values based on the digital signal outputted from the analog-to-digital converter in the subsequent stage of circuit. Accordingly, an optimum correction value can be selected among the plurality of groups of correction values.

The analog-to-digital conversion circuit may further include an error detector that detects an error of the digital output value due to the gain error of the differential amplifier circuit in the one stage of circuit, and a control signal generator that generates the control signal based on the error detected by the error detector.

In this case, the error of the digital output value due to the gain error of the differential amplifier circuit in the one stage of circuit is detected, and the control signal is generated by the control signal generator based on the error detected by the error detector. Consequently, the error of the digital output value can be reduced with high accuracy even when the error of the digital output value varies.

The analog-to-digital conversion circuit may further include a control signal holder that holds the control signal preset based on an error of the digital output value due to the gain error of the differential amplifier circuit in the one stage of circuit.

In this case, the preset control signal is held by the control signal holder, thereby eliminating a need to output a control signal at every analog-to-digital conversion. Accordingly, the error of the digital output value can be reduced without increasing the circuit scale.

In the analog-to-digital conversion circuit, the one stage of circuit may be an initial stage of circuit.

In this case, since the gain error of the differential amplifier circuit in the initial stage of circuit influences the digital output value the most, the error of the digital output value can be reduced most effectively by correcting the error of the digital output value due to the gain error of the differential amplifier circuit in the initial stage of circuit.

An analog-to-digital conversion circuit according to still another aspect of the present invention is an analog-to-digital conversion circuit having a multi-stage pipeline structure composed of a plurality of stages of circuits for converting an analog signal to a digital output value, wherein at least one stage of circuit of the plurality of stages of circuits comprises a comparator that compares an inputted analog signal with a reference voltage; an operational amplifier that operates in response to an output signal from the comparator; and a first switch that selectively inputs a reference voltage equivalent to the reference voltage and an analog signal, the analog-to-digital conversion circuit correcting the interstage gain error using the digital output value obtained when the equivalent reference voltage is inputted.

In the analog-to-digital conversion circuit, the analog signal inputted in the at least one stage of circuit of the plurality of stages of circuits is compared with the reference voltage by the comparator, and the operational amplifier operates in response to the output signal from the comparator. When the analog signal is inputted to the comparator by the first switch, the digital output value corresponding to the analog signal is obtained.

Accordingly, the interstage gain error in the input/output characteristics due to a gain error of the operational amplifier circuit can be readily detected by using the digital output value obtained when a reference voltage equivalent to the reference voltage is inputted to the comparator by the first switch.

An analog-to-digital conversion circuit according to still another aspect of the present invention is an analog-to-digital conversion circuit having a multi-stage pipeline structure composed of a plurality of stages of circuits for converting an analog signal to a digital output value, wherein at least one stage of circuit of the plurality of stages of circuits comprises a comparator that compares an inputted analog signal with a reference voltage; an operational amplifier that operates in response to an output signal from the comparator; a first switch that selectively inputs the reference voltage and an analog signal equivalent to the reference voltage; and a signal generation circuit that generates a first signal having a first logic value and a second signal having a second logic value, the operational amplifier that operates in response to the first signal and the second signal generated by the signal generation circuit when the equivalent reference voltage is inputted to the comparator by the first switch.

In the analog-to-digital conversion circuit, the analog signal inputted into the at least one stage of circuit of the plurality of stages of circuits is compared with the reference voltage by the comparator, and the operational amplifier operates in response to the output signal from the comparator. When the analog signal is inputted to the comparator by the first switch, a digital output value corresponding to the analog signal is obtained. When the reference voltage equivalent to the reference voltage is inputted to the comparator by the first switch, the operational amplifier operates in response to the first signal and the second signal generated by the signal generation circuit. In this case, the difference between the digital output value obtained during the response to the first signal and that obtained during the response to the second signal corresponds to the size of an interstage gain error in the input/output characteristics due to the gain error of the operational amplifier. Accordingly, the interstage gain error in the input/output characteristics can be readily detected.

An analog-to-digital conversion circuit according to still another aspect of the present invention is an analog-to-digital conversion circuit having a multi-stage pipeline structure composed of a plurality of stages of circuits for converting an analog signal into a digital signal, wherein each of the stages of circuits except the final stage comprises: an analog-to-digital converter that converts an inputted analog signal into a digital signal; a digital-to-analog converter that converts the digital signal outputted from the analog-to-digital converter into an analog signal; and a differential amplifier that amplifies the difference between the inputted analog signal and the analog signal outputted from the digital-to-analog converter, the analog-to-digital converter including: a plurality of comparators that compare the inputted analog signal with a plurality of reference voltages respectively; and an encoder that encodes output signals from the plurality of comparators to generate a digital signal; at least one stage of circuit of the plurality of stages of circuits including: a first switch that selectively inputs an analog signal supplied from an external source or preceding stage of circuit and a reference voltage equivalent to the reference voltage supplied to at least one comparator of the plurality of comparators; a signal generation circuit that generates a first signal having a first logic value and a second signal having a second logic value; and a second switch that supplies output signals from the digital-to-analog converter corresponding to the first signal and second signal generated by the signal generation circuit to the differential amplifier when the equivalent reference voltage is inputted by the first switch.

In the analog-to-digital conversion circuit, the analog signal inputted into each of the stages of circuits except the final stage is converted into the digital signal by the analog-to-digital converter, the digital signal outputted from the analog-to-digital converter is converted into the analog signal by the digital-to-analog converter, and the difference between the inputted analog signal and the analog signal outputted from the digital-to-analog converter is amplified by the differential amplifier. In this case, in the analog-to-digital converter in each of the stages of circuits, the inputted analog signal is compared with the plurality of reference voltages by the plurality of comparators, and the output signals from the plurality of comparators are encoded by the encoder. Consequently, the digital signals are generated. The digital output value is constituted by the digital signals outputted from the analog-to-digital converters in the plurality of stages of circuits.

In the at least one stage of circuit of the plurality of stages of circuits, output signals from the digital-analog converter corresponding to the first signal and the second signal generated by the signal generation circuit are supplied to the differential amplifier by the second switch when the equivalent reference voltage is inputted by the first switch.

In this case, the difference between the digital output value obtained when the first signal is supplied and that obtained when the second signal is supplied corresponds to the size of an interstage gain error due to the gain error of the differential amplifier. Accordingly, the interstage gain error in the input/output characteristics can be readily detected.

The voltage range in the stage of circuit subsequently to the at least one stage of circuit may include a normal range and a redundant range, and the equivalent voltage may be an arbitrary voltage within an area where the normal range including the reference voltage supplied to the at least one comparator and the redundant range overlap with each other.

The arbitrary voltage within the area where the normal range including the reference voltage supplied to the at least one comparator and the redundant range overlap with each other can be employed as an equivalent voltage. Accordingly, the interstage gaan error in the input/output characteristics can be readily detected.

The analog-to-digital conversion circuit may further comprise a subtracter that calculates the difference between the digital output value obtained when the first signal is supplied to the encoder and the digital output value obtained when the second signal is supplied to the encoder.

In this case, the difference between the digital output value obtained when the first signal is supplied to the encoder and the digital output value obtained when the second signal is supplied to the encoder is calculated by the subtracter, so that the interstage gain error in the input/output characteristics is readily detected.

The analog-to-digital conversion circuit may further comprise a correction circuit that corrects the digital output value based on an output signal from the subtracter.

In this case, the digital output value is corrected by the correction circuit based on the size of the detected interstage gain error. Accordingly, input/output characteristics having no interstage gain error are obtained.

The first switch may selectively input an analog signal supplied from an external source or preceding stage of circuit and a plurality of the reference voltages equivalent to the plurality of reference voltages supplied respectively to a plurality of comparators among the plurality of comparators to the comparator, and the second switch may sequentially supply the first signal and the second signal generated by the signal generation circuit to the encoder in place of the output signal from the corresponding comparator when any of the plurality of the equivalent reference voltages is inputted by the first switch.

In this case, the size of the interstage gain error can be readily detected also in a case where the interstage gain error in the input/output characteristics has steps differing from one another.

The at least one stage of circuit may include a plurality of stages of circuits, and each of the plurality of stages of circuits may include: a first switch that selectively inputs an analog signal supplied from an eternal source or preceding stage of circuit and a reference voltage equivalent to the reference voltage supplied to the at least one comparator of the plurality of comparators; a signal generation circuit that generates a first signal having a first logic value and a second signal having a second logic value; and a second switch that sequentially supplies the first signal and the second signal generated by the signal generation circuit to the encoder in place of the output signal from the at least one comparator when the equivalent reference voltage is inputted by the first switch.

In this case, the size of the interstage gain error can be readily detected also in a case where the interstage gain error occurs in the input/output characteristics due to the gain errors of the differential amplifiers in the plurality of stages of circuits.

An analog-to-digital conversion circuit according to still another aspect of the present invention comprises: a first circuit having a first and second nodes; a selector that selectively supplies one of an inputted analog signal and an analog signal at the second node to a first node; and a control device that controls the selector, the first circuit including an analog-to-digital converter that converts an analog signal from the first node into a digital signal; a digital-to-analog converter that converts the digital signal outputted from the analog-to-digital converter into an analog signal; and a differential amplifier that amplifies the difference between the analog signal from the first node and the analog signal outputted from the digital-to-analog converter and outputs the amplified difference to the second node, the control device controlling the selector such that conversion operation of the analog-to-digital converter, conversion operation of the digital-to-analog converter, and amplifying operation of the differential amplifier are carried out a predetermined number of cycles after the inputted analog signal is supplied to the first node, the analog-to-digital converter including: a plurality of comparators that compare the inputted analog signal with a plurality of reference voltages respectively; and an encoder that encodes output signals from the plurality of comparators to generate a digital signal, the first circuit including: a first switch that selectively inputs an analog signal supplied from an external source or preceding stage of circuit and a reference voltage equivalent to the reference voltage supplied to at least one comparator of the plurality of comparators; a signal generation circuit that generates a first signal having a first logic value and a second signal having a second logic value; and a second switch that supplies output signals from the digital-to-analog converter corresponding to the first signal and second signal generated by the signal generator circuit to the differential amplifier when the equivalent reference voltage is inputted by the first switch.

In the analog-to-digital conversion circuit, after the inputted analog signal is supplied to the first node, in the first circuit, the conversion operation of the analog-to-digital converter, the conversion operation of the digital-to-analog converter, and the amplifying operation of the differential amplifier are carried out the predetermined number of cycles. Consequently, a digital signal is sequentially outputted at each cycle from the analog-to-digital converter in a first circuit.

In this manner, a processing similar to that carried out in a multi-stage pipeline structure is realized through the repetitive use of the first circuit.

In the first circuit, output signals from the digital-analog converter corresponding to the first signal and the second signal generated by the signal generation circuit are supplied to the differential amplifier by the first switch when the equivalent reference voltage is inputted.

In this case, the difference between the digital output value obtained when the first signal is supplied and the digital output value obtained when the second signal is supplied corresponds to the size of an interstage gain error. Accordingly, the interstage gain error in the input/output characteristics can be readily detected.

The voltage range in the first circuit may include a normal range and a redundant range, and the equivalent reference voltage may be an arbitrary voltage within an area where the normal range including the reference voltage supplied to the at least one comparator and the redundant range overlap with each other.

The arbitrary voltage within the area where the normal range including the reference voltage supplied to the at least one comparator and the redundant range overlap with each other can be employed as the equivalent voltage. Accordingly, the interstage gain error in the input/output characteristics can be readily detected.

The analog-to-digital conversion circuit may further comprise a subtracter that calculates the difference between the digital output value obtained when the first signal is supplied to the encoder and the digital output value obtained when the second signal is supplied to the encoder.

In this case, the difference between the digital output value obtained when the first signal is supplied to the encoder and the digital output value obtained when the second signal is supplied to the encoder is calculated by the subtracter, so that the interstage gain error in the input/output characteristics can be readily detected.

The analog-to-digital conversion circuit may further comprise a correction circuit that corrects the digital output value based on an output signal from the subtracter.

In this case, the digital output value is corrected by the correction circuit based on the size of a detected interstage gain error. Accordingly, input/output characteristics having no interstage gain error are obtained.

An analog-to-digital conversion circuit according to still another aspect of the present invention is an analog-to-digital conversion circuit having a multi-stage pipeline structure composed of a plurality of stages of circuits for correcting an analog signal to a digital signal output value, wherein at least one stage of circuit of the plurality of stages of circuits includes: an analog-to-digital converter that converts an inputted analog signal into a digital signal; a digital-to-analog converter that converts the digital signal outputted from the analog-to-digital converter into an analog signal; an operational amplifier that amplifies the inputted analog signal; a differential amplifier that amplifies the difference between the analog signal outputted from the operational amplifier and the analog signal outputted from the digital-to-analog converter; a comparator that compares the inputted analog signal with a reference voltage; an adjustment circuit that adjusts a voltage range of the analog signal inputted to the operational amplifier and a voltage range in the digital-to-analog converter based on an output signal from the comparator; a first switch that selectively inputs an inputted analog signal and a reference voltage equivalent to the reference voltage supplied to the comparator; a signal generation circuit that generates a first signal having a first logic value and a second signal having a second logic value; and a second switch that sequentially supplies the first signal and the second signal generated by the signal generation circuit to the adjustment circuit in place of the output signal from the comparator when the equivalent voltage is inputted by the first switch.

In the analog-to-digital conversion circuit, the analog signal inputted into the at least one stage of circuit of the plurality of stages of circuits is converted into the digital signal by the analog-to-digital converter, and the digital signal outputted from the analog-to-digital converter is converted into the analog signal by the digital-to-analog converter. The inputted analog signal is amplified by the operational amplifier, and the difference between the analog signal outputted from the operational amplifier and the analog signal outputted from the digital-to-analog converter is amplified by the differential amplifier. The digital output value is constituted by the digital signals outputted from the analog-to-digital converters in the plurality of stages of circuits.

In this case, the inputted analog signal is compared with the reference voltage by the comparator, and the voltage range of the analog signal inputted to the operational amplifier and the voltage range in the digital-to-analog converter are adjusted by the adjustment circuit based on the output signal from the comparator.

The first signal and the second signal generated by the signal generation circuit are sequentially supplied to the adjustment circuit by the second switch in place of the output signal from the comparator when the equivalent reference voltage is inputted by the first switch.

In this case, the difference between the digital output value obtained when the first signal is supplied and the digital output value obtained when the second signal is supplied corresponds to the size of an interstage gain error due to a gain error of a differential amplifier. Accordingly, the interstage gain error in the input/output characteristics can be readily detected.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing the structure of an analog-to-digital conversion circuit having a multi-stage pipeline structure according to a first embodiment of the present invention;

FIG. 15 is a circuit diagram showing the interior structure of a sub-A/D converter;

FIG. 27 is a diagram showing the input/output characteristics of the analog-to-digital conversion circuit shown in FIG. 25;

FIG. 30 is a circuit diagram showing one example of the structure of the operational amplifier circuit 11a shown in FIG. 29;

FIG. 32(a) is a diagram showing the output voltage in an operational amplifier in the first-stage circuit in a case where the operational amplifier has an input offset, whereas FIG. 32(b) is a diagram showing the input/output characteristics of the analog-to-digital conversion circuit in a case where the operational amplifier in the first-stage circuit has an input offset;

FIG. 33(a) is a diagram showing the output voltage in the operational amplifier in the first-stage circuit in a case where the operational amplifier has a gain error, whereas FIG. 33(b) is a diagram showing the input/output characteristics of the analog-to-digital conversion circuit in a case where the operational amplifier in the first-stage circuit has a gain error;

DESCRIPTION OF THE PREFERRED EMBODIMENTS

First Embodiment

Figure 2:
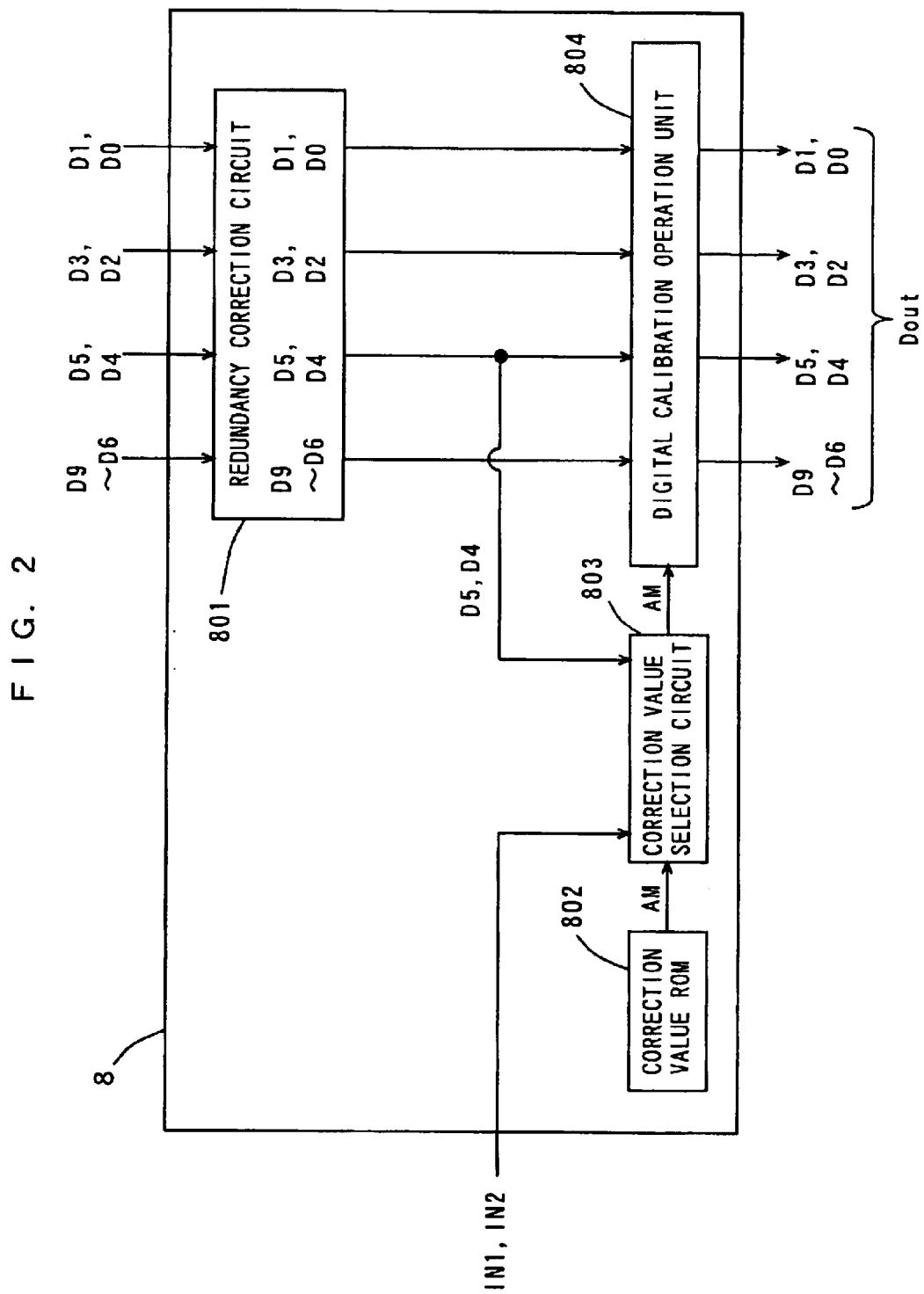
FIG. 2 is a block diagram showing one example of the structure of the output circuit shown in FIG. 1.

Hereinafter, description will be made of an embodiment of the present invention with references to the drawings. FIG. 1 is a block diagram showing the structure of an analog-to-digital conversion circuit having a multi-stage pipeline structure according to one embodiment of the present invention.

The analog-to-digital conversion circuit shown in FIG. 1 has a 10-bit four-stage pipeline structure.

In FIG. 1, the analog-to-digital conversion circuit 1 comprises a first-stage circuit 3, a second-stage circuit 4, a third-stage circuit 5, a fourth-stage circuit 6, a plurality of latch circuits 7, and an output circuit 8.

The first (initial)-stage circuit 3 comprises a sub-A/D (analog-to-digital) converter 9, a sub-D/A (digital-to-analog) converter 10, an operational amplifier 11, and a subtraction circuit 12.

Similarly, each of the second and third-stage circuits 4 and 5 comprises a sub-A/D converter 9, a sub-D/A converter 10, an operational amplifier 11, and a subtraction circuit 12. In the following description, the subtraction circuit 12 and the operational amplifier 11 constitute a differential amplifier circuit 14.

The gain of each of the operational amplifier 11 in the first-stage circuit 3, the second-stage circuit 4, and the third-stage circuit 5 is four. The fourth (final)-stage circuit 6 only comprises a sub-A/D converter 9.

The first-stage circuit 3 has a 4-bit configuration, and each of the second- to fourth-stage circuits 4 to 6 has a 2-bit configuration. In each of the sub-A/D converters except that of the first-stage, a redundant bit of approximately one is prepared, although the description is not given herein.

The operations of the analog-to-digital conversion circuit 1 shown in FIG. 1 will then be described.

First, an analog input signal Vin is transferred to the first-stage circuit 3. In the first-stage circuit 3, the sub-A/D converter a subjects the analog-to-digital input signal Vin to A/D (analog-to-digital) conversion. A high order 4-bit digital output D9, D8, D7, D6, which is a result of the A/D conversion by the sub-A/D conversion 9, is transferred to the sub-D/A converter 10, and is also transferred to the output circuit 8 through the four latch circuits 7. The sub-D/A converter 10 converts the high order 4-bit digital output, which is a result of the A/D conversion by the sub-A/D converter 9, to an analog signal.

The subtraction circuit 12, on the other hand, subtracts the result of the D/A conversion by the sub-D/A converter 10 from the analog input signal Vin. The operational amplifier 11 amplifies an output from the subtraction circuit 12. An output from the operational amplifier 11 is transferred to the second-stage circuit 4.

In the second-stage circuit 4, the sub-A/D converter 9 subjects the output from the operational amplifier 11 in the first-stage circuit 3 to A/D conversion. The result of the A/D conversion by the sub-A/D converter 9 is transferred to the sub-A/D converter 10, and is also transferred to the output circuit 8 through the three latch circuits 7. Consequently, an intermediate high order 2-bit digital signal D5, D4 is obtained from the second-stage circuit 4.

The subtraction circuit 12 in the second-stage circuit 4, on the other hand, subtracts the result of the D/A (digital-to-analog) conversion by the sub-D/A converter 10 from the output from the operational amplifier 11 in the first-stage circuit 3. The operational amplifier 11 in the second-stage circuit 4 amplifies an output from the subtraction circuit 12. An output from the operational amplifier 11 is transferred to the third-stage circuit 5.

The third-stage circuit 5 carries out the same operations as those of the second-stage circuit 4. Consequently, an intermediate low order 2-bit digital signal D3, D2 is obtained from the third-stage circuit 5.

In the fourth-stage circuit 6, the sub-A/D converter 9 subjects an output from the operational amplifier 11 in the third-stage circuit 5 to A/D conversion, such that a low order 2-bit digital signal D1, D0 is obtained.

The digital signals D9 to D0 from the first- to fourth-stage circuits 3 to 6 simultaneously reach the output circuit 8 through the respective latch circuits 7. In other words, the respective latch circuits 7 are provided to synchronize the outputs of the digital signals D9 to D0 from the respective circuits 3 to 6 with each other.

The output circuit 8 corrects an interstage gain error of the digital signals D9 to D0 as described below, and then outputs a 10-bit digital output value Dout corresponding to the analog input signal Vin.

FIG. 2 is a block diagram showing one example of the structure of the output circuit 8 shown in FIG. 1.

As shown in FIG. 2, the output circuit 8 comprises a redundancy correction circuit 801, a correction value ROM (Read Only Memory) 802, a correction value selection circuit 803, and a digital calibration operation unit 804. The digital calibration operation unit 804 is composed of a 10-bit adder. The correction value selection circuit 803 is made up of a decoder.

To the redundancy correction circuit 801 in the output circuit 8, the digital signals D9 to D0 outputted from the first-to fourth-stage circuits 3 to 6 are inputted. The redundancy correction circuit 801 carries out redundancy correction to the digital signals D9 to D0, and outputs the corrected digital signals D9 to D0. The description of redundant bits is not given herein to make the explanation easier.

As mentioned in the foregoing, a largest interstage gain error is due to the gain error of the differential amplifier circuit 14 in the first stage, and the interstage gain error due to the gain error of the differential amplifier circuit 14 in each of the second- and third-stage is small. Thus, in the present embodiment, an interstage gain error is corrected using the digital signal D5, D4, which is impacted by the gain error of the differential amplifier circuit 14 in the first-stage.

The digital signals D9 to D0 outputted from the redundancy correction circuit 801 are supplied to the digital calibration operation unit 804. Of the digital signals D9 to D0, the digital signal D5, D4 outputted from the second-stage circuit 4 is supplied to the correction value selection circuit 803.

Furthermore, a digital calibration control signal (hereinafter referred to as a DC control signal) IN1, IN2 described below is also supplied to the correction value selection circuit 803. The DC control signal IN1, IN2 is determined according to the gain error of the differential amplifier circuit 14 in the first-stage, and is externally supplied to the correction value selection circuit 803.

In the correction value ROM 802, a plurality of correction values corresponding to the digital signal D5, D4 are preliminarily stored in the form of a correction value table. The correction value selection circuit 803 reads out one correction value AM from the correction value table in the correction value ROM 802 based on the DC control signal IN1, IN2 and the digital signal D5, D4, and supplies the correction value AM to the digital calibration operation unit 804. The digital calibration operation circuit 804 adds the correction value AM to the digital signals D9 to D0, and outputs a resulting value as a digital output value Dout.

Figures 3, 4:
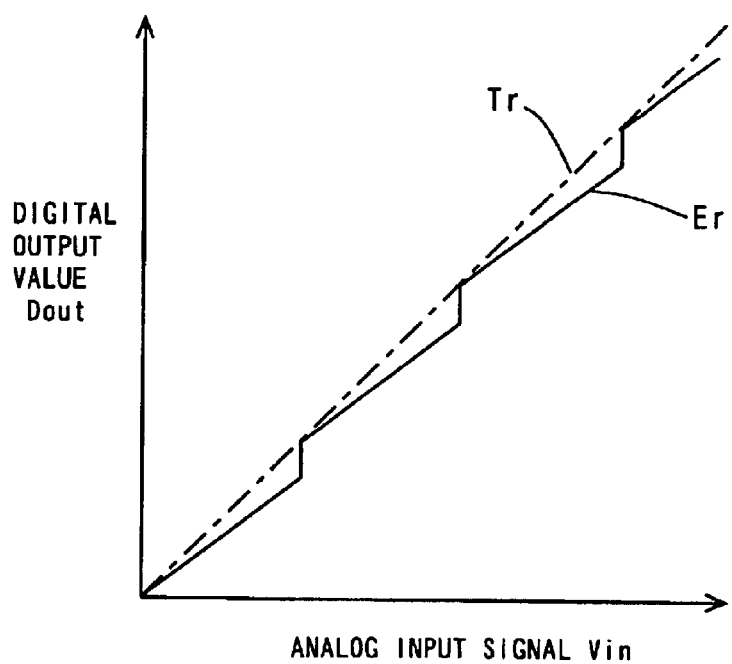
FIG. 3 is a diagram showing one example of a correction value table stored in the correction value ROM shown in FIG. 2.
FIG. 4 is a diagram showing the input/output characteristics of the analog-to-digital conversion circuit shown in FIG. 1.

FIG. 3 is a diagram showing one example of the correction value table stored in the correction value ROM 802 shown in FIG. 2.

As shown in FIG. 3, a plurality of combinations of correction values, each of which corresponds to the digital signal D5, D4 and the DC control signal IN1, IN2, are stored in the correction value table TBL. In other words, there are four combinations of correction values stored, each of which including four of the correction values, each corresponding to the respective values of the digital signal D5, D4 and the value of the DC control signal, IN1, IN2.

In the example shown in FIG. 3, to the value "0, 0" of the DC control signal IN1, IN2, a combination of the correction values "00" (=0), "00" (=0), "00" (=0), and "00" (=0), corresponding to the respective values "0, 0", "0, 1", "1, 0", and "1, 1" of the digital signal D5, D4 is allotted.

To the value "0, 1" of the DC control signal IN1, IN2, a combination of the correction values "00" (=0), "00" (=0), "01" (=1), and "01" (=1), corresponding to the respective values "0, 0", "0, 1", "1, 0", and "1, 1" of the digital signal D5, D4 is allotted.

To the value "1, 0" of the DC control signal IN1, IN2, a combination of the correction values "00" (=0), "01" (=1), "01" (=1), and "10" (=2), corresponding to the respective values "0, 0", "0, 1", "1, 0", and "1, 1" of the digital signal D5, D4 is allotted.

To the value "1, 1" of the DC control signal IN1, IN2, a combination of the correction values "00" (=0), "01" (=1), "10" (=2), and "11" (=3), corresponding to the respective values "0, 0", "0, 1", "1, 0", and "1, 1" of the digital signal D5, D4 is allotted.

For example, in a case where the DC control signal IN1, IN2 is "1, 0" and the digital signal D5, D4 is "0, 0", the correction value selection circuit 803 shown in FIG. 2 selects the correction value "00" (=0) from the correction value table in the correction ROM 802, and supplies it to the digital calibration operation unit 804.

In a case where the DC control signal IN1, IN2 is "1, 0" and the digital signal D5, D4 is "0, 1", the correction value selection circuit 803 selects the correction value "01" (=1) from the correction value table in the correction ROM 802, and supplies it to the digital calibration operation unit 804.

In a case where the DC control signal IN1, IN2 is "1, 0" and the digital signal D5, D4 is "1, 0", the correction value selection circuit 803 selects the correction value "01" (=1) from the correction value table in the correction ROM 802, and supplies it to the digital calibration operation unit 804.

In a case where the DC control signal IN1, IN2 is "1, 0" and the digital signal D5, D4 is "1, 1", the correction value selection circuit 803 selects the correction value "10" (=2) from the correction value table in the correction ROM 802, and supplies it to the digital calibration operation unit 804.

As described in the foregoing, in the analog-to-digital conversion circuit 1 according to the present embodiment, it is possible to set an arbitrary combination of the correction values.

FIG. 4 is a diagram showing the input/output characteristics of the analog-to-digital conversion circuit 1 shown in FIG. 1. In FIG. 4, the abscissa shows the analog input signal Vin, and the ordinate shows the digital output value Dout.

In FIG. 4, the chain line Tr shows the ideal input/output characteristics of the analog-to-digital conversion circuit 1, and the solid line Er shows the input/output characteristics of the analog-to-digital conversion circuit 1 in a case where the differential amplifier circuits 14 have gain errors.

Ideally, it is desired that the digital output value Dout has a constant proportional relationship with the analog input signal Vin, as shown by the chain line Tr. In a case where the differential amplifier circuits 14 have gain errors, however, an interstage gain error occurs in the input/output characteristics of the analog-to-digital conversion circuit 1, as shown by the solid line Er.

Figure 5:
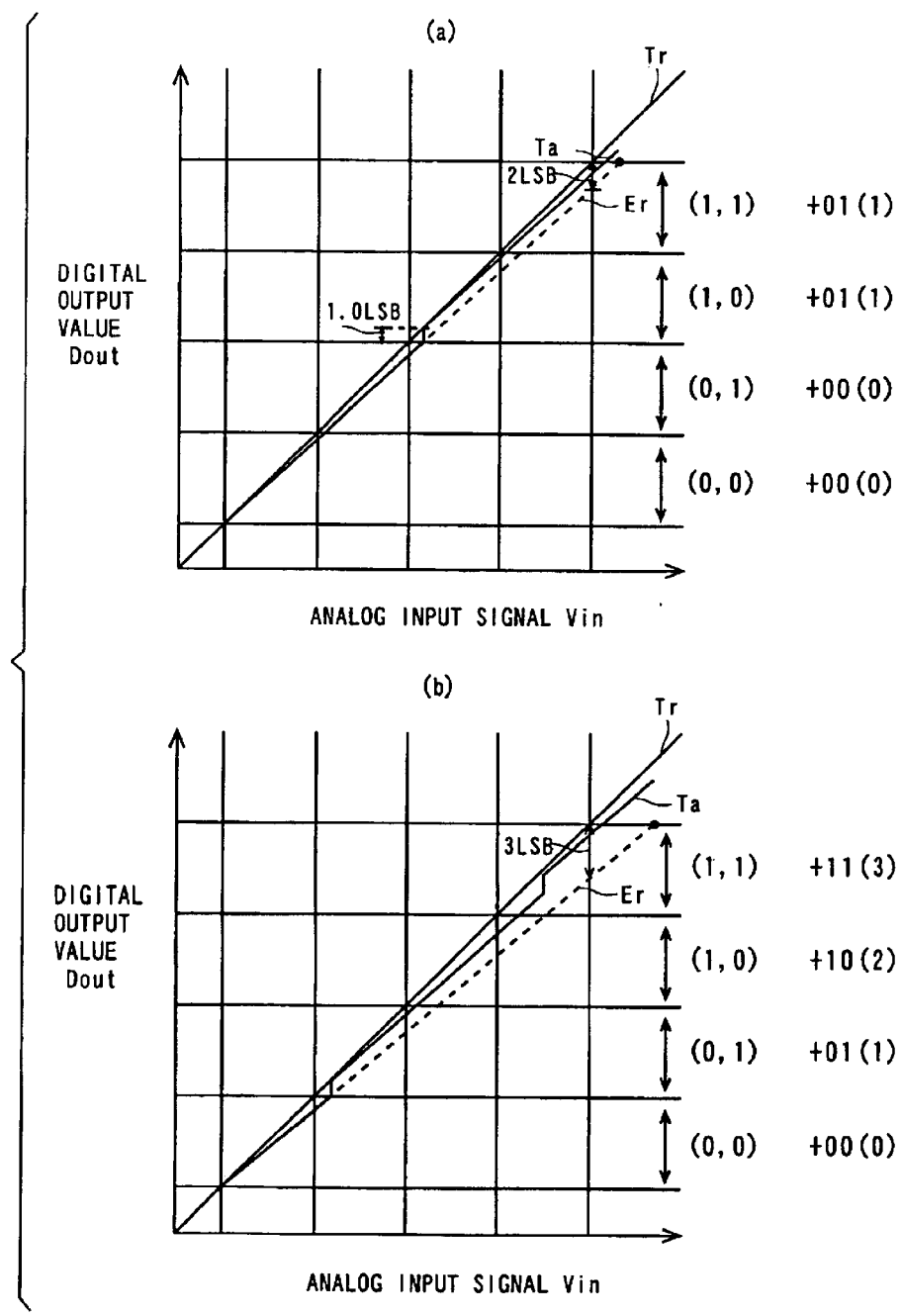
FIG. 5 is a diagram showing one example of interstage gain error correction in the output circuit shown in FIG. 1.

FIG. 5 is a diagram showing one example of interstage gain error correction in the output circuit 8 shown in FIG. 1. FIG. 5 is an enlarged view of part of the input/output characteristics shown in FIG. 4. In FIG. 5, the solid line Tr shows the ideal input/output characteristics of the analog-to-digital circuit 1, the broken line Er shows the input/output characteristics in a case where the differential amplifier circuits 14 have gain errors, and the solid line Ta shows the input/output characteristics after correction.

In the example of FIG. 5, the maximum value of the interstage gain error in the input/output characteristics is 2 LSB. In the case of FIG. 5(*a*), the DC control signal IN1, IN2 is set to "0, 1". Accordingly, in a case where the digital signal D5, D4 is "0, 0", the correction value is set to "00" (=0), in a case where "0, 1", the correction value is set to "00" (=0), in a case where "1, 0", the correction value is set to "01" (=1), and in a case where "1, 1", the correction value is set to "01" (=1). By adding the correction value to the value of 10-bit digital signals D9 to D0, the maximum value of the error in the input/output characteristics after correction to the ideal input/output characteristics is reduced to approximately 1.0 LSB.

The interstage gain error in the input/output characteristics of the analog-to-digital conversion circuit 1 due to the gain errors of the differential amplifier circuits 14 can be thus sufficiently reduced.

In the case of FIG. 5(*b*), the DC control signal IN1, IN2 is set to "1, 0". Accordingly, in a case where the digital signal D5, D4 is "0, 0", the correction value is set to "00" (=0), in a case where the correction value is set to "0, 1", the correction value is set to "01" (=1), in a case where "1, 0", the correction value is set to "01" (=1), and in a case where "1, 1", the correction value is set to "10" (=2). By adding this correction value to the values of 10-bit digital signals D9 to D0, the maximum value of the error in the input/output characteristics after correction to the ideal input/output characteristics is reduced to approximately not more than 1.0 LSB.

The interstage gain error in the input/output characteristics of the analog-to-digital conversion circuit 1 due to the gain errors of the differential amplifier circuits 14 can be thus sufficiently reduced.

Figures 6, 7:
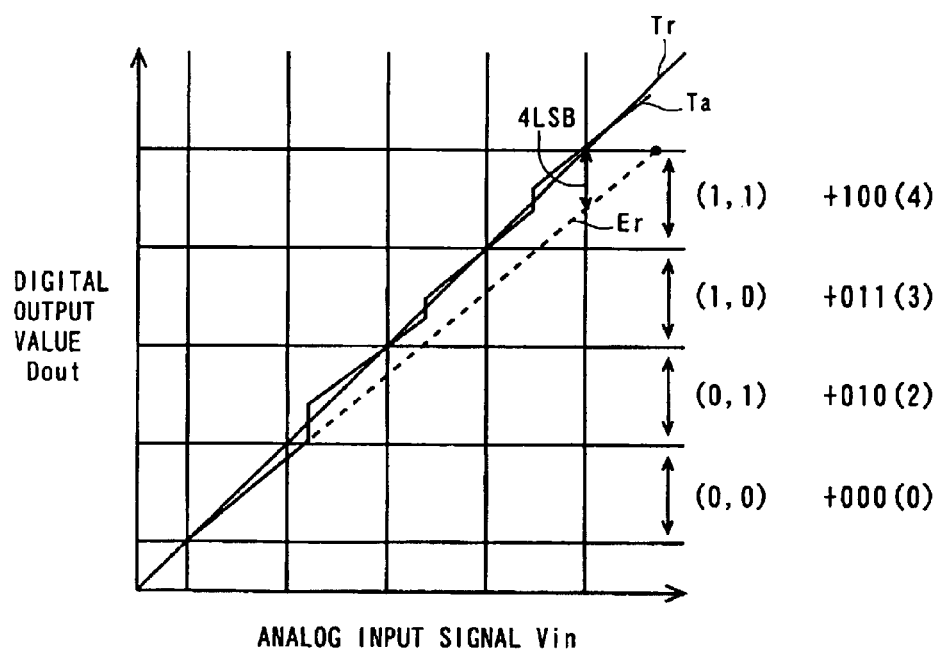
FIG. 6 is a diagram showing another example of the correction value table stored in the correction value ROM shown in FIG. 2.
FIG. 7 is a diagram showing another example of the interstage gain error correction in the output circuit shown in FIG. 1.

FIG. 6 is a diagram showing another example of the correction value table stored in the correction value ROM 802 shown in FIG. 2.

In the example of FIG. 6, to the value "1, 1" of the DC control signal IN1, IN2, a combination of the correction values "000" (=0), "010" (=2), "011" (=3), and "100" (=4), corresponding to the respective values "0, 0", "0, 1", "1, 0", and "1, 1" of the digital signal D5, D4 is allotted.

FIG. 7 is a diagram showing another example of the interstage gain error correction in the output circuit 8 shown in FIG. 1. FIG. 7 is an enlarged view of part of the input/output characteristics shown in FIG. 4. In FIG. 7, the solid line Tr shows the ideal input/output characteristics of the analog-to-digital circuit 1, the broken line Er shows the input/output characteristics of the analog-to-digital circuit 1 in a case where the differential amplifier circuits 14 have gain errors, and the solid line Ta shows the input/output characteristics after correction. In the correction of this example, the correction table TBL shown in FIG. 6 is used.

In the example of FIG. 7, the maximum value of the interstage gain error in the input/output characteristics is 4LSB. In this case, the DC control signal IN1, IN2 is set to "1, 0". Accordingly, in a case where the digital signal D5, D4 is "0, 0", the correction value is set to "000" (=0), in a case where "0, 1", the correction value is set to "010" (=2), in a case where "1, 0", the correction value is set to "011" (=3), and in a case where "1, 1", the correction value is set to "100" (=4). By adding this correction value to the values of 10-bit digital signals D9 to D0, the maximum value of the error in the input/output characteristics after correction to the ideal input/output characteristics is reduced to approximately not more than 1.0 LSB.

The interstage gain error in the input/output characteristics of the analog-to-digital conversion circuit 1 due to the gain errors of the differential amplifier circuits 14 can be thus sufficiently reduced.

In the output circuit 8 in the analog-to-digital conversion circuit 1 of the present embodiment, the interstage gain error due to the gain errors of the differential amplifier circuits 14 can be sufficiently reduced without the use of multiplier. Consequently, an increase in the circuit scale is avoided.

Furthermore, it is possible to set combinations of correction values that have not been realized by the conventional way of correction using multiplier. Thus, the interstage gain error due to the gain errors of the differential amplifier circuits 14 can be sufficiently reduced.

While in this embodiment, description has been made of the case in which the interstage gain error due to the gain error of the differential amplifier circuit 14 in the first-stage circuit 3 is corrected, this invention is not limited to the method above, and the interstage gain error due to the gain error of the differential amplifier circuit 14 in any other circuit may be corrected alternatively.

Furthermore, while in this embodiment, the plurality of combinations of the correction values are preliminarily stored in the form of the correction value table in the correction value ROM 802 such that one correction value AM is read out from the correction value table in the correction value ROM 802 based on the DC control signal IN1, IN2 and the digital signal D5, D4, this invention is not limited to the method above, and a correction value, which is preliminarily allotted to a combination of values of the DC control signal IN1, IN2 and the digital signal D5, D4, in an arbitrary manner, based on the DC control signal IN1, IN2 and the digital signal D5, D4, may be logically generated by a logical circuit.

Figure 8:
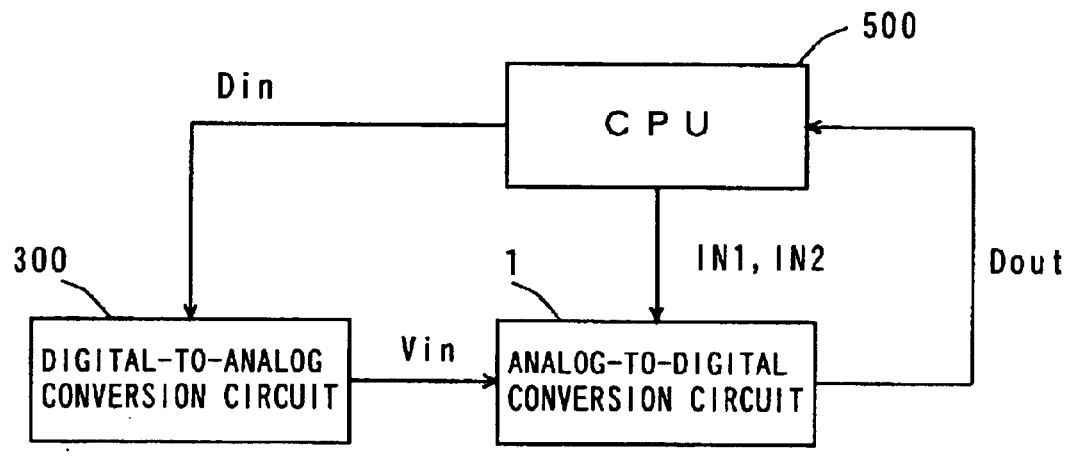
FIG. 8 is a block diagram showing one example of the structure of a system including the analog-to-digital conversion circuit shown in FIG. 1.

FIG. 8 is a block diagram showing one example of the structure of a system comprising the analog-to-digital conversion circuit 1 shown in FIG. 1.

The system shown in FIG. 8 comprises the analog-to-digital conversion circuit 1 shown in FIG. 1, a digital-to-analog conversion circuit 300, and a CPU 500. The CPU 500 supplies a digital signal Din to the digital-to-analog signal 300. The digital-to-analog conversion circuit 300 subjects the digital signal Din to analog-to-digital conversion, and supplies an analog input signal Vin to the analog-to-digital conversion circuit 1. The analog-to-digital conversion circuit 1 converts the analog input signal Vin into a digital output value Dout, and supplies the digital output value Dout to the CPU 500.

The CPU 500 compares the digital signal Din outputted and the digital output value Dout inputted, and generates a DC control signal IN1, IN2 based on the result of comparison. The CPU 500 then supplies the DC control signal IN1, IN2 to the correction value selection circuit 803 in the output circuit 8 in the analog-to-digital conversion circuit 1. Consequently, an interstage gain error can be accurately corrected by selecting the optimum combination of correction values in real time even when the input/output characteristics of the analog-to-digital conversion circuit 1 vary.

Figure 9:
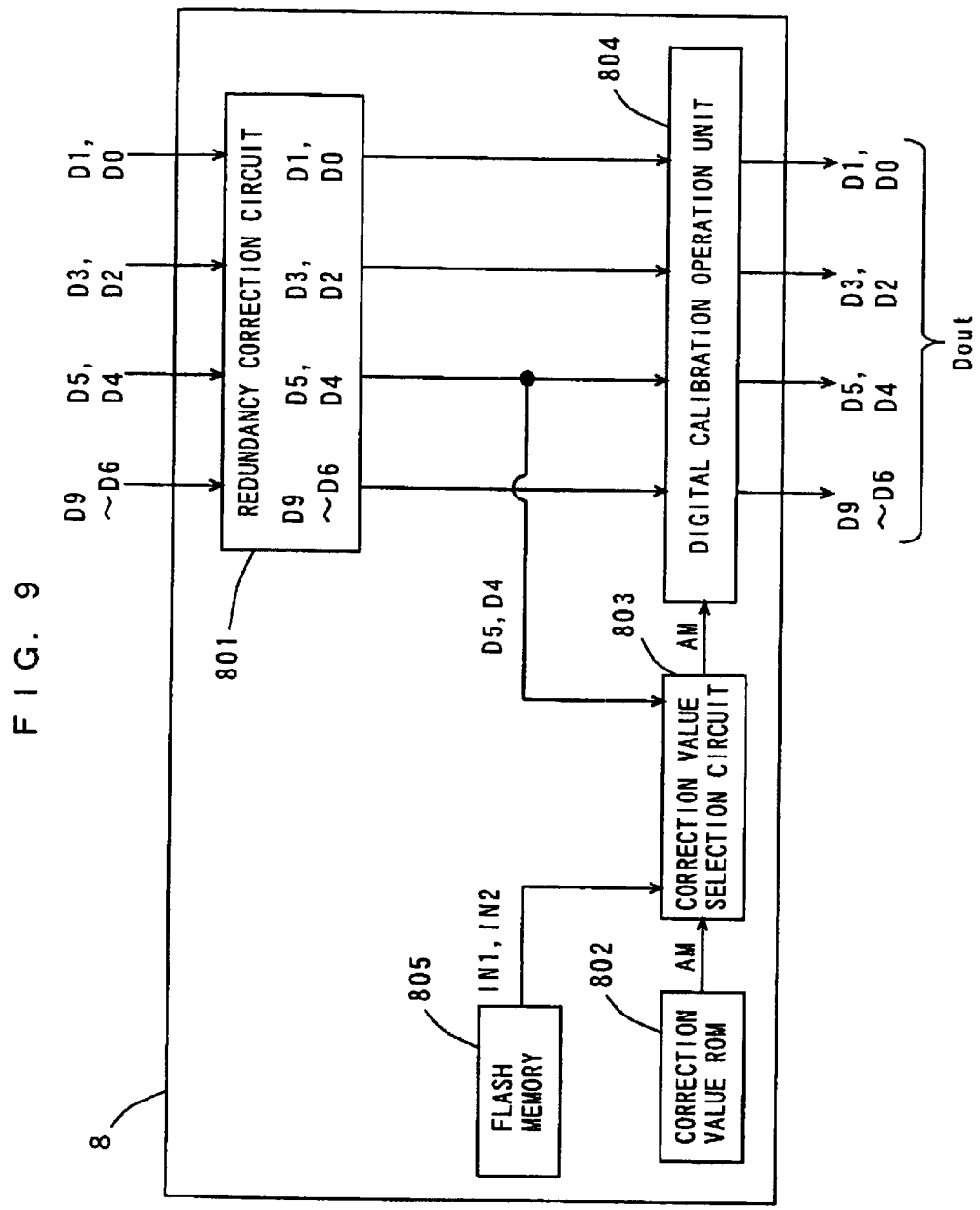
FIG. 9 is a block diagram showing another example of the structure of the output circuit shown in FIG. 1.

FIG. 9 is a block diagram showing another example of the structure of the output circuit 8 shown in FIG. 1.

The output circuit 8 shown in FIG. 9 further comprises a flash memory 805. The flash memory 805 preliminarily stores a DC control signal IN1, IN2. The DC control signal IN1, IN2 read out from the flash memory 805 is supplied to the correction value selection circuit 803. The other parts of the structure of the output circuit 8 shown in FIG. 9 are the same as those of the output circuit 8 shown in FIG. 2.

Figure 10:
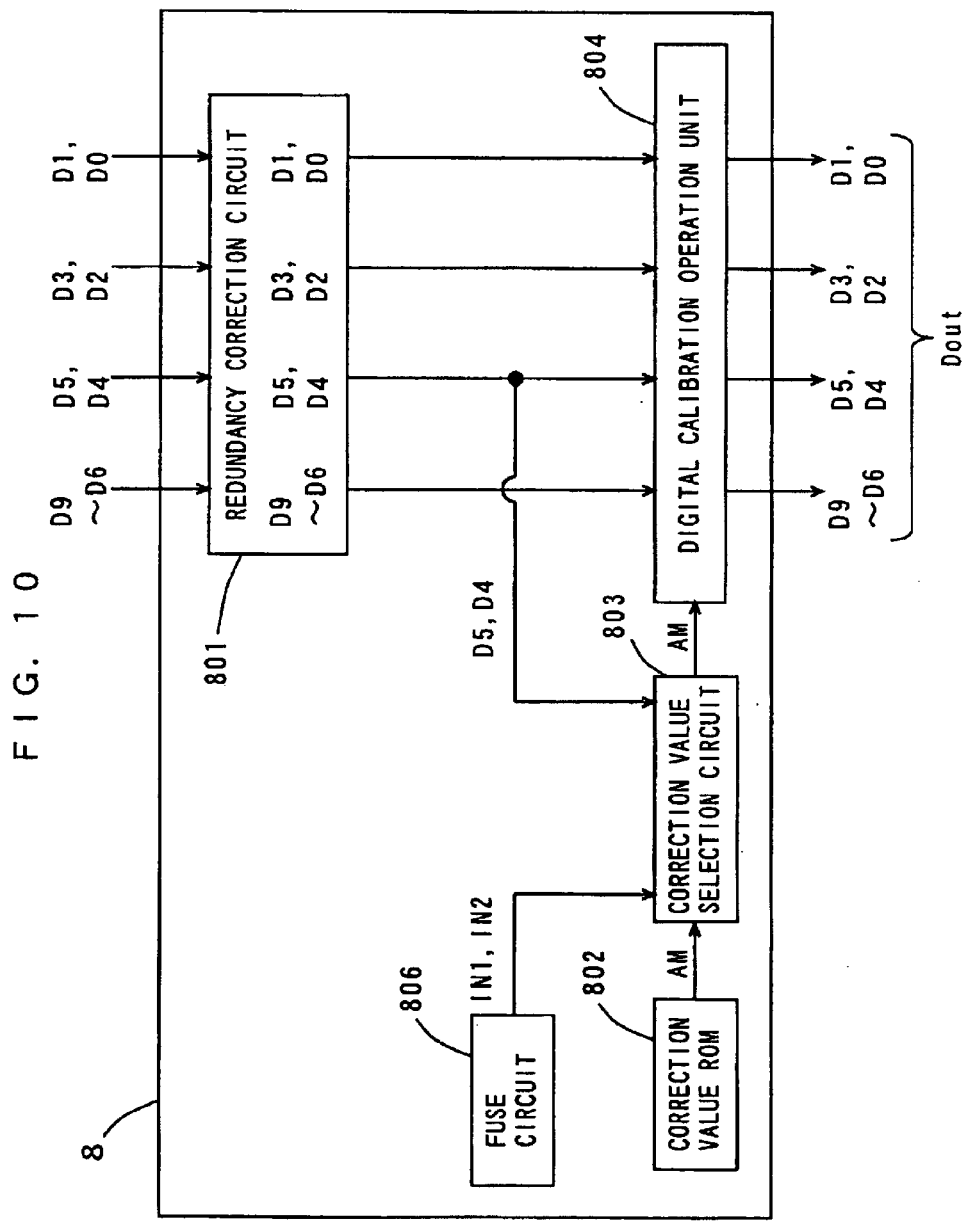
FIG. 10 is a block diagram showing still another example of the structure of the output circuit shown in FIG. 1.

FIG. 10 is a block diagram showing still another example of the structure of the output circuit 8 shown in FIG. 1.

The output circuit 8 shown in FIG. 10 further comprises a fuse circuit 806 composed of a plurality of fuses made of multi-crystalline silicon and the like. In the fuse circuit 806, a DC control signal IN1, IN2 is preliminarily set. The DC control signal IN1, IN2 outputted from the fuse circuit 806 is supplied to the correction value selection circuit 803. The other parts of the structure of the output circuit 8 shown in FIG. 10 are the same as those of the output circuit 8 shown in FIG. 2.

Figure 11:
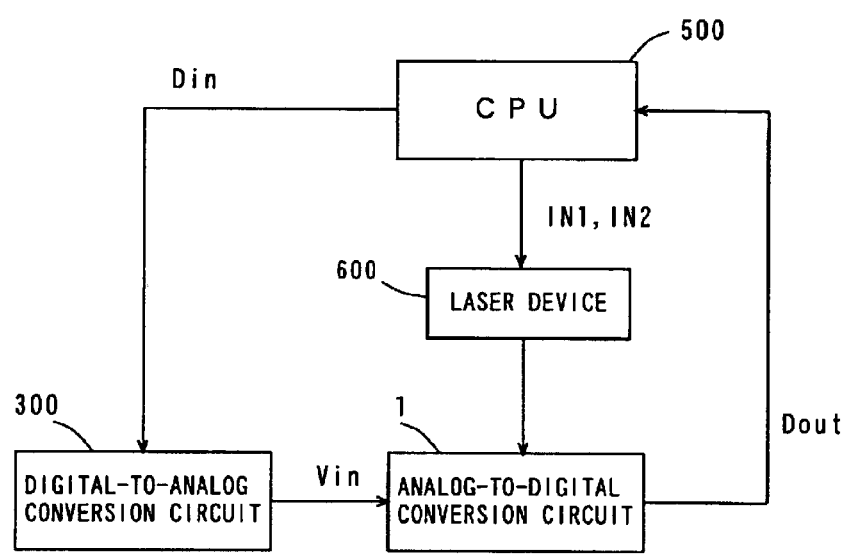
FIG. 11 is a block diagram showing one example of a system including the analog-to-digital conversion circuit having the output circuit 8 shown in FIG. 9 or FIG. 10.

FIG. 11 is a block diagram showing one example of the structure of a system comprising the analog-to-digital conversion circuit 1 having the output circuit 8 shown in FIG. 9 or FIG. 10. The system shown in FIG. 11 is employed at the time of adjustments in the factory.

The system shown in FIG. 11 comprises the analog-to-digital conversion circuit 1 having the output circuit shown in FIG. 9 or FIG. 10, a digital-to-analog conversion circuit 300, a CPU 500, and a laser device 600.

The CPU 500 supplies a digital signal Din to the digital-to-analog conversion circuit 300. The digital-to-analog conversion circuit 300 subjects the digital signal Din to analog-to-digital conversion, and supplies an analog input signal Vin to the analog-to-digital conversion circuit 1. The analog-to-digital conversion circuit 1 converts the analog input signal Vin into a digital output value Dout, and supplies the digital output value Dout to the CPU 500.

The CPU 500 compares the digital signal Din outputted and the digital output value Dout inputted, and controls the laser device 600 based on the result of comparison, and either makes the flash memory 805 in the output circuit 8 shown in FIG. 9 in the analog-to-digital circuit 1 store the DC control signal IN1, IN2, or blows the fuses in the fuse circuit 806 shown in FIG. 10, thereby setting the DC control signal IN1, IN2.

At the time of shipment, the digital-to-analog conversion circuit 300, the CPU 500, and the laser device 600 are separated from the analog-to-digital conversion circuit 1.

Consequently, at the time of adjustments in the factory, an interstage gain error can be accurately corrected by selecting the optimum combination of correction values.

While in this embodiment, description has been made of the case in which the present invention is applied to the analog-to-digital conversion circuit having the multi-stage pipeline structure, the present invention is also applicable to a two-step flash system or other types of analog-to-digital conversion circuits without being limited to the one described herein.

In the first embodiment, the sub-A/D converter 9 corresponds to an analog-to-digital converter, the sub-D/A converter 10 corresponds to a digital-to-analog converter, the correction value ROM 802 and the correction value selection circuit 803 correspond to a correction value output circuit, the correction value ROM 802 corresponds to a storage circuit, the correction value selection circuit 803 corresponds to a selection circuit, the digital calibration operation unit 804 corresponds to a correction circuit, the CPU 500 corresponds to a control signal generation circuit and an error detection circuit, and the flash memory 805 and the fuse circuit 806 correspond to a control signal hold circuit.

Second Embodiment

Figure 12:
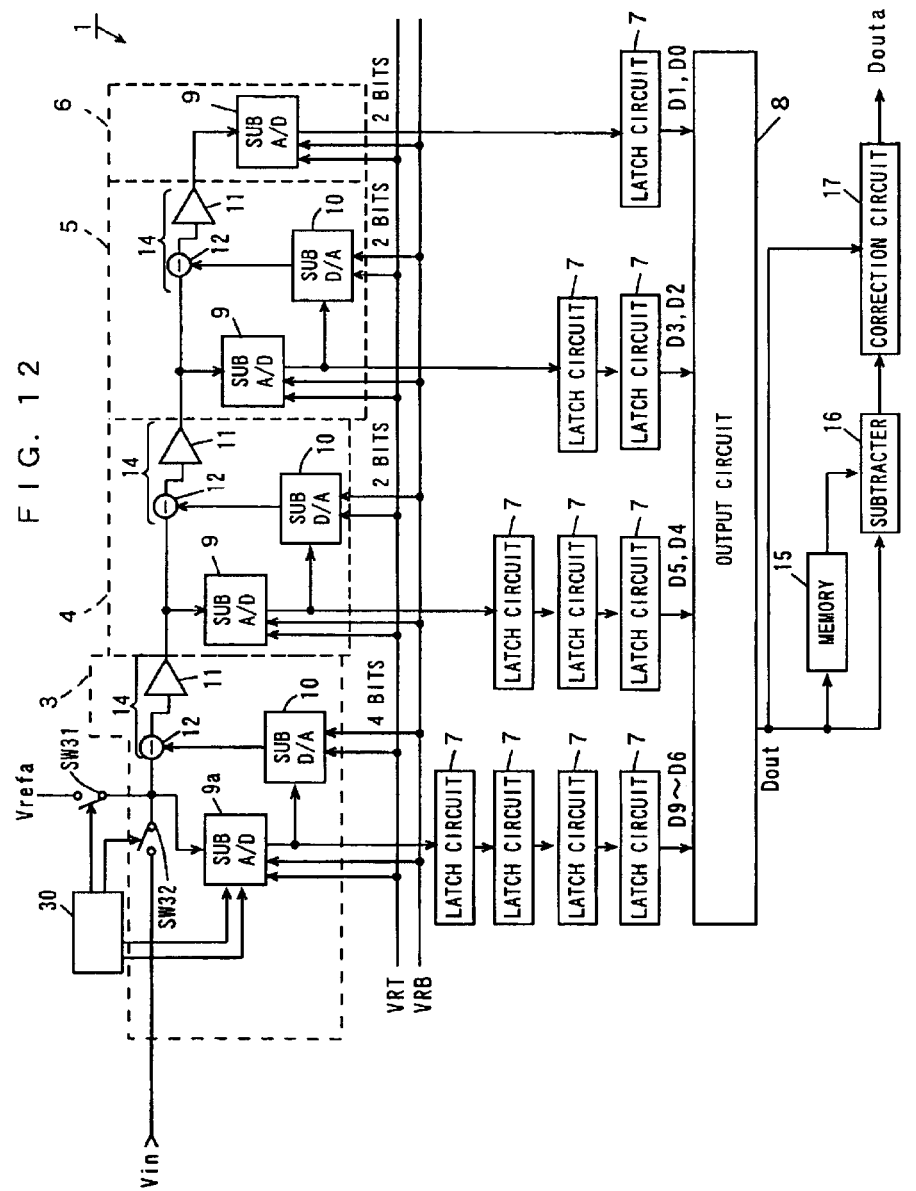
FIG. 12 is a block diagram showing the structure of an analog-to-digital conversion circuit having a multi-stage pipeline structure according to a second embodiment of the present invention.

FIG. 12 is a block diagram showing the structure of an analog-to-digital conversion circuit having a multi-pipeline structure according to a second embodiment. The analog-to-digital conversion circuit 1 shown in FIG. 12 has a 10-bit four-stage pipeline structure.

In FIG. 12, the analog-to-digital conversion circuit 1 is principally composed of a first-stage circuit 3, a second-stage circuit 4, a third-stage circuit 5, a fourth-stage circuit 6, a plurality of latch circuits 7, an output circuit 8, an interstage gain error detection control circuit 30, a memory 15, a subtracter 16, and a correction circuit 17.

The first (initial)-stage circuit 3 comprises a sub-A/D (analog-to-digital) converter 9a, a sub-D/A (digital-to-analog) converter 10, an operational amplifier 11, and a subtraction circuit 12. Furthermore, the first-stage circuit 3 is provided with switches SW31 and SW32, which are turned on and off by the interstage gain error detection control circuit 30. To one end of the switch SW31 a reference voltage Vrefa is applied.

Each of the second- and third-stage circuits 4 and 5 comprises a sub-A/D converter 9, a sub-D/A converter 10, an operational amplifier 11, and a subtraction circuit 12. In the following description, the subtraction circuit 12 and the operational amplifier 11 constitute a differential amplifier circuit 14.

The gain of the operational amplifier 11 in each of the first-stage circuit 3, the second-stage circuit 4, and the third-stage circuit 5 is four. The fourth (final)-stage circuit 6 comprises only a sub-A/D converter 9. Note that the sub-A/D converter 9a further includes an interstage gain error detection circuit described below, adding to the structure of the sub-A/D converter 9. Furthermore, the sub-A/D converter 9 or 9a and the sub-D/A converter 10 in each of the stages refer to a first reference voltage VRT and a second reference voltage VRB.

The first-stage circuit 3 has a 4-bit configuration, and each of the second- to fourth-stage circuits 4 to 6 has a 2-bit configuration. In each of the first- to third-stage circuits 3 to 5, the respective numbers of bits (bit configurations) of the sub-A/D converter 9 or 9a and the sub-D/A converter 10 are set to the same value. Note that in each of the sub-A/D converters except that of the first-stage, a redundancy bit of approximately one is prepared. This redundancy bit will be described later in detail.

Description is now made of the operations of the analog-to-digital conversion circuit 1 shown in FIG. 12.

During the normal A/D conversion operation, the interstage gain error detection control circuit 30 turns off the switch SW31 and turns on the switch SW32. Consequently, an analog input signal Vin is transferred to the differential amplifier circuit 14 in the first-stage circuit 3 and the sub-A/D converter 9a.

Then, in the first-stage circuit 3, the sub-A/D converter 9a subjects the analog input signal Vin to A/D conversion. A high order 4-bit digital signal, which is a result of the A/D conversion by the sub-A/D converter 9a, is transferred to the sub-D/A converter 10, and is also transferred to the output circuit 8 through the four latch circuits 7. The sub-D/A converter 10 converts the high order 4-bit digital signal D9, D8, D7, D6, the result of the A/D conversion by the sub-A/D converter 9a, to an analog signal.

The subtraction circuit 12 subtracts the result of D/A conversion by the D/A converter 10 from the analog input signal Vin. The operational amplifier 11 amplifies an output from the subtraction circuit 12. An output from the operational amplifier 11 is transferred to the second-stage circuit 4.

In the second-stage circuit 4, the sub-A/D converter 9 subjects an output from the operational amplifier 11 in the first-stage circuit 3 to A/D conversion. The result of the A/D conversion by the sub-A/D converter is transferred to the sub-D/A converter 10, and is also transferred to the output circuit 8 through the three latch circuits 7. Consequently, an intermediate high order 2-bit digital signal D5, D4 is obtained from the second-stage circuit 4.

The subtraction circuit 12 in the second-stage circuit 4 subtracts the result of D/A conversion by the sub-D/A converter 10 from the output from the operational amplifier 11 in the first-stage circuit 3. The operational amplifier 11 in the second-stage circuit 4 amplifies an output from the subtraction circuit 12. An output from the operational amplifier 11 is transferred to the third-stage circuit 5.

The third-stage circuit 5 carries out the same operations as those of the second-stage circuit 4. Consequently, an intermediate low order 2-bit digital signal D3, D2 is obtained from the third-stage circuit 5.

In the fourth-stage circuit 6, the sub-A/D converter 9 subjects an output from the operational amplifier 11 in the third-stage circuit 5 to A/D conversion, such that a low order 2-bit digital output D1, D0 is obtained.

The digital signals D9 to D0 from the first- to fourth-stage circuits 3 to 6 simultaneously reach the output circuit 8 through the respective latch circuits 7. In other words, the latch circuits 7 are provided to synchronize the respective outputs of the digital signals D9 to D0 from the circuits 3 to 6 with each other.

The output circuit 8 outputs a 10-bit digital output value Dout corresponding to the analog input signal Vin in response to a correction signal supplied by a correction circuit 17 described below.

Figure 13:
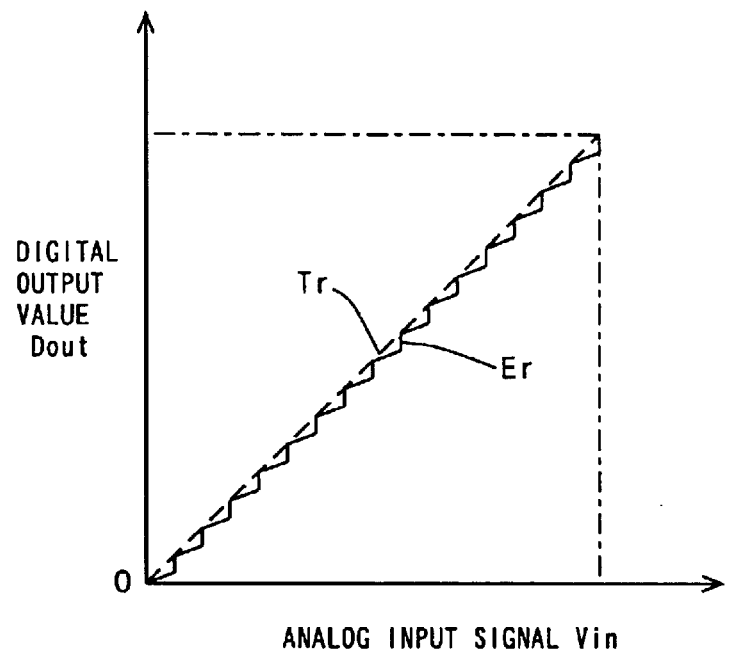
FIG. 13 is a diagram showing the input/output characteristics of the analog-to-digital conversion circuit shown in FIG. 12.

FIG. 13 is a diagram showing the input/output characteristics of the analog-to-digital conversion circuit 1 shown in FIG. 12. In FIG. 13, the abscissa shows the analog input signal Vin, and the ordinate shows the digital output value Dout.

In FIG. 13, the broken line Tr shows the ideal input/output characteristics of the analog-to-digital conversion circuit 1, and the solid line Er shows the input/output characteristics in a case where the operational amplifier in the differential amplifier circuits 14 of the analog-to-digital conversion circuit 1 have gain errors.

Ideally, it is desired that the digital output value Dout has a constant proportional relationship with the analog input signal Vin, as shown by the broken line Tr. In a case where the operational amplifier 11 have gain errors, however, a non-linearity error, or an interstage gain error occurs in the input/output characteristics of the analog-to-digital conversion circuit 1, as shown by the solid line Er.

Specifically, in the analog-to-digital conversion circuit 1 shown in FIG. 12, in the first-stage circuit 3, the high order 4-bits are subjected to A/D conversion, causing an interstage gain error having 16 steps as shown in FIG. 13. In the second-stage circuit 4, a small interstage gain error is caused in each of the 16 steps. In the third-stage circuit 5, a smaller interstage gain error is caused in each of the small steps. Accordingly, in the analog-to-digital conversion circuit 1 in the present embodiment, since the first-stage circuit 3 outputs the high order 4-bit digital signal D9 to D6, the gain error of the differential amplifier circuit 14 in the first-stage circuit 3 impacts the input/output characteristics the most.

Figure 14:
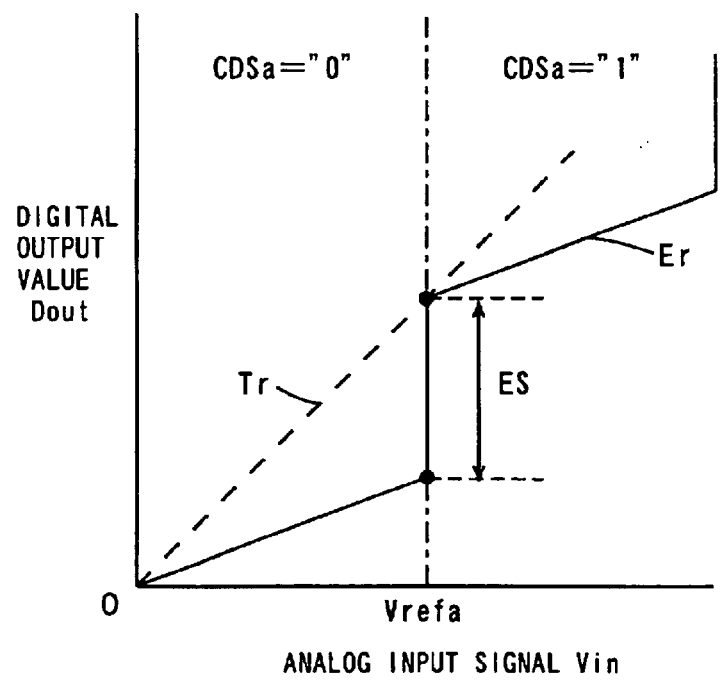
FIG. 14 is an enlarged diagram of part of the input/output characteristics shown in FIG. 13.

FIG. 14 is an enlarged diagram of part of the input/output characteristics shown in FIG. 2. In the present embodiment, the operational amplifier 11 in the first-stage circuit 3 has a gain error.

In FIG. 14, as with FIG. 13, the broken line Tr shows the ideal input/output characteristics of the analog-to-digital conversion circuit 1, and the solid line Er shows the input/output characteristics in a case where the amplifier circuit 11 in the differential amplifier circuit 14 of the analog-to-digital conversion circuit 1 has a gain error.

As shown in FIG. 14, in the ideal input/output characteristics shown by the broken line Tr, the digital output value Dout continuously varies in an area where the analog input signal Vin is lower than a reference voltage Vrefa described below (area where an external input signal CDSa described below is "0"), and in an area where the analog input signal Vin is not lower than the reference voltage signal Vrefa (area where the external input signal CDSa is "1"). In a case where the operational amplifier 11 in the first-stage circuit 3 has a gain error, on the other hand, as shown by the solid line Tr, the digital output value Dout varies discontinuously in an area where the analog input signal Vin is lower than the reference voltage Vrefa described below (area where the external input signal CDSa is "0") and in an area where the analog input signal Vin is not lower than the reference voltage Vref a (area where the external input signal CDSa is "1").

As for interstage gain error, when the analog input signal Vin is at the reference voltage Vrefa, the difference between the digital output values Dout is referred to as a size ES of the interstage gain error.

Upon detecting the interstage gain error, the interstage gain error detection control circuit 30 turns on the switch SW31, and turns off the switch SW32. Consequently, the reference voltage Vrefa is supplied to the sub-A/D converter 9a and the differential amplifier circuit 14 in the first-stage circuit 3. Furthermore, the interstage gain error detection control circuit 30 supplies an external input signal (CDSa) and a static test mode signal (MD1) to an interstage gain error detection circuit in the sub-A/D converter 9a described below. The external input signal (CDSa) and the static test mode signal (MD1) will be described later.

The structure of the sub-A/D converter 9a will be then explained. FIG. 15 is a circuit diagram showing the interior structure of the sub-A/D converter 9a.

The sub-A/D converter 9a shown in FIG. 15 is a total parallel comparison (flash) system sub-A/D converter. The sub-A/D converter 9a is composed of a plurality of reference resistances R0 to R15, a plurality of comparators 900 to 915, an encoder 920, and an mode switching circuit 91.

The plurality of the reference resistances R0 to R15 have the same resistance values, respectively, and connected in series between a node receiving a first reference voltage VRT and a node receiving a second reference voltage VRB.

The electric potential difference between the first reference voltage VRT and the second reference voltage VRB is divided by the plurality of the reference resistances R0 to R15 to generate a plurality of reference voltages. The reference voltage Vrefa is generated at a node between the reference resistance R0 and the reference resistance R1.

Each of the comparators 900 to 915 compares a corresponding reference voltage with the analog input signal Vin. As described above, in the present embodiment, the reference voltage Vrefa is supplied to the switch SW31 shown in FIG. 12.

The mode switching circuit 91 is composed of a CMOS (Complementary Metal-Oxide Semiconductor) switch SW51, a CMOS switch SW61, and an inverter 71.

The CMOS switch SW51 is composed of a P channel MOS field effect transistor (hereinafter referred to as PMOSFET) 52 and N channel MOS field effect transistor (hereinafter referred to as NMOSFET) 53, and the CMOS switch SW61 is composed of a P channel MOS field effect transistor (hereinafter referred to as PMOSFET) 62 and a N channel MOS field effect transistor (hereinafter referred to as NMOSFET) 63.

The interstage gain error detection control circuit 30 has a terminal IT1 for outputting a static test mode signal MD1 and a terminal IT2 for outputting an external input signal CDSa.

The CMOS switch SW51 is connected between the output terminal IT2 in the interstage gain error detection control circuit 30 and a node N1. The CMOS switch SW61 is connected between an output terminal in the comparator 901 and the node N1.

The static test mode signal MD1 at the terminal IT1 in the interstage gain error detection control circuit 30 is supplied to a gate of the PMOSFET 52 and a gate of the NMOSFET 63, whereas an inverted signal of the static test mode signal MD1 is supplied to a gate of the PMOSFET 62 and a gate of the NMOSFET 53 through an inverter 71.

During the normal A/D conversion operation, the static test mode signal MD1 at the terminal IT1 in the interstage gain error detection control circuit 30 is "1". This turns off the CMOS switch SW51, and turns on the CMOS switch SW 61. As a result, an output signal of the comparator 90 is outputted from the node N1 as an output signal CDS1.

Upon detecting the interstage gain error, the static test mode signal MD1 at the terminal IT1 in the interstage gain error detection control circuit 30 is "0". This turns on the CMOS switch SW 51, and turns off the CMOS switch SW 61. As a result, the external input signal CDSa at the terminal IT2 in the interstage gain error detection control circuit 30 is outputted from the node N1 as an output signal CDS1.

The encoder 920 generates a high order 4-bit digital signal D9, D8, D7, D6 based on output signals CDS0, CDS2 to CSD15 from the respective comparators 900, 902 to 915 and the output signal CDS1 from the mode switching circuit 91.

Description is now made of the operations of the analog-to-digital conversion circuit 1 during the detection of an interstage gain error. Interstage gain error detection is carried out, for example, before the A/D conversion operation of the analog-to-digital conversion circuit 1. In this case, as mentioned in the foregoing, the static test mode signal MD1 is set to "0". The interstage gain error detection control circuit 30 first sets the external input signal CDSa to "0". The digital output value Dout at this time is stored in the memory 15 shown in FIG. 12. The interstage gain error detection control circuit 30 then sets the external input signal CDSa to "1". The digital output value Dout at this time is supplied to the subtracter 16. The subtracter 16 calculates a differential value between the digital output value Dout when the external input signal CDSa is "1" and the digital output value Dout stored in the memory 15. The differential value calculated by the subtracter 16 corresponds to the size ES of the interstage gain error shown in FIG. 14. The differential value calculated by the subtracter 16 is supplied to the correction circuit 17.

The correction circuit 17 contains memory. In this case, the correction circuit 17 stores the size ES of the interstage gain error in the memory, and also calculates an equation or coefficients for correcting the interstage gain error based on the size ES of the interstage gain error, and stores it (them) in the memory.

During the A/D conversion operation of the analog-to-digital conversion circuit 1, the correction circuit 17 corrects the digital output value Dout outputted from the output circuit 8 based on the equation or the coefficients stored in the memory, and outputs a corrected digital output value Douta.

As described in the foregoing, in the analog-to-digital conversion circuit 1 according to the present embodiment, an interstage gain error can be detected, and the detected interstage gain error is corrected by the correction circuit 17. As a result, it becomes possible to output a digital output value Douta having no interstage gain error.

Furthermore, in the analog-to-digital conversion circuit 1 according to the present embodiment, it is not required to make adjustments, such as a tuning design, in order to correct the interstage gain error. Thus, the development cost thereof can be reduced.

Furthermore, in the analog-to-digital conversion circuit 1 according to the present embodiment, the interstage gain error can be readily detected or corrected also in a case where the power supply voltage supplied to the differential amplifier circuit 14 varies, thereby making it possible to readily prevent degraded input/output characteristics.

In the second embodiment, the first-stage circuit 3, second-stage circuit 4, third-stage circuit 5, and fourth-stage circuit 6 correspond to a plurality of stages of circuits, the analog-to-digital conversion circuit 1 corresponds to an analog-to-digital conversion circuit, the sub-A/D converter 9a and 9 correspond to analog-to-digital converters, respectively, the sub-D/A converter 10 corresponds to a digital-to-analog converter, the comparators 900 to 915 correspond to comparators, respectively, the operational amplifier 11 corresponds to the operational amplifier, the reference voltage Vrefa corresponds to a reference voltage, the analog input signal Vin corresponds to an analog signal, the switches SW 31 and SW32 correspond to first switches, respectively, the "0" corresponds to a first logic value, the "1" corresponds to a second logic value, the external input signal CDSa "0" corresponds to a first signal having the first logic value, the external input signal CDSa "1" corresponds to a second signal having the second logic value, the interstage gain error detection control circuit 30 corresponds to a signal generation circuit, the normal range OR corresponds to a normal range, the redundant ranges eR1 and eR2 corresponds to redundant ranges, respectively, the subtracter 16 corresponds to a subtracter, and the correction circuit 17 corresponds to a correction circuit.

Third Embodiment

Figure 16:
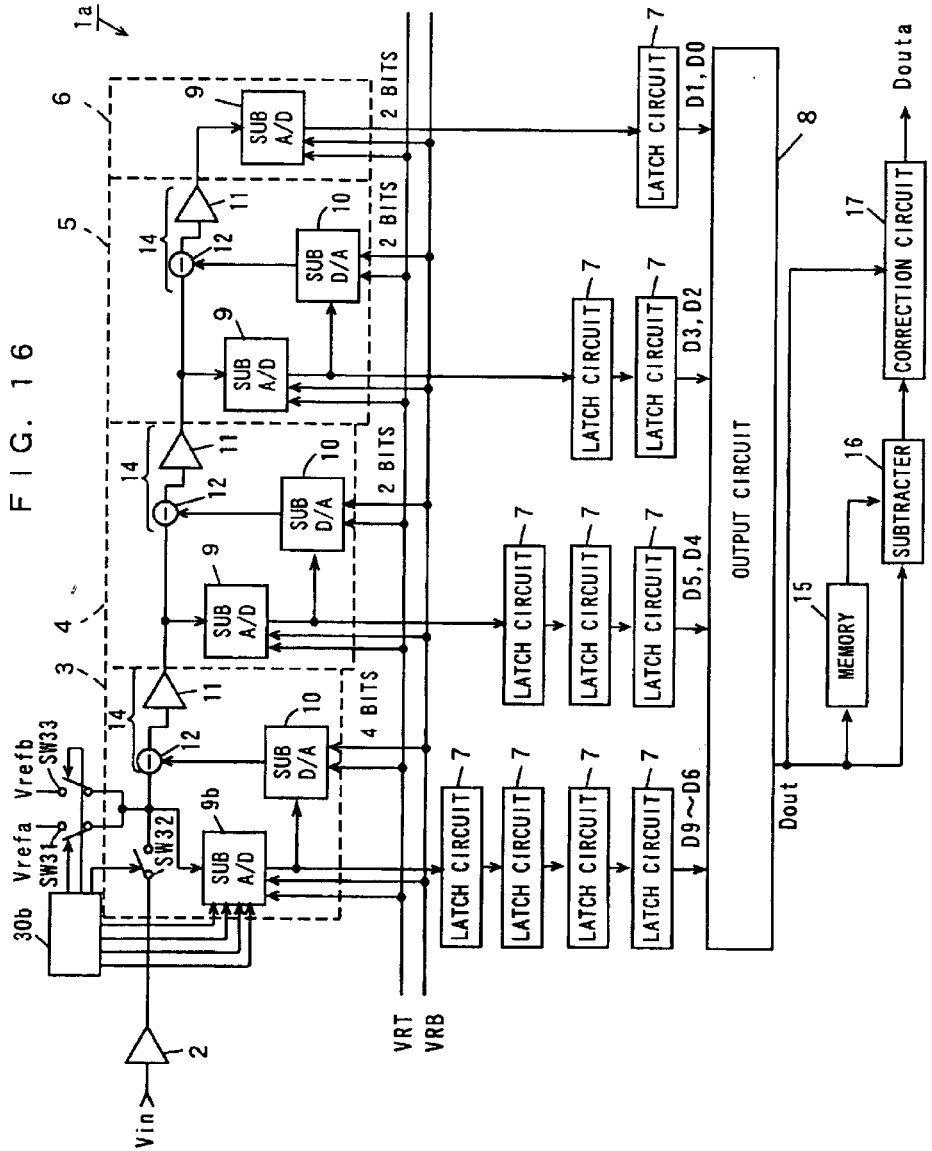
FIG. 16 is a block diagram showing the structure of an analog-to-digital conversion circuit having a multi-stage pipeline structure according to a third embodiment of the present invention.

FIG. 16 is a block diagram showing the structure of an analog-to-digital conversion circuit having a multi-stage pipeline structure according to a third embodiment of the present invention. The structure of the analog-to-digital conversion circuit 1a shown in FIG. 16 differs from the analog-to-digital conversion circuit 1 shown in FIG. 12 in the following points.

In FIG. 16, in a first-stage circuit 3, an interstage gain error detection control circuit 30b is provided in place of the interstage gain error detection control circuit 30, and a switch SW31, a switch SW32, and a switch SW33, which are turned on and off by the interstage gain error detection control circuit 30b are provided. To one end of the switch SW31 a reference voltage Vrefa described below is applied, and to one end of the switch SW33 a reference voltage Vrefb described below is applied. Also, a sub-A/D converter 9b is provided in place of the sub-A/D converter 9a in the first-stage circuit 3 shown in FIG. 12.

During the normal A/D conversion operation, the interstage gain error detection control circuit 30b turns off the switches SW31 and SW33, and turns on the switch SW32. Accordingly, an analog input signal Vin is transferred to the sub-A/D converter 9b and the differential amplifier circuit 14 in the first-stage circuit 3.

Figure 17:
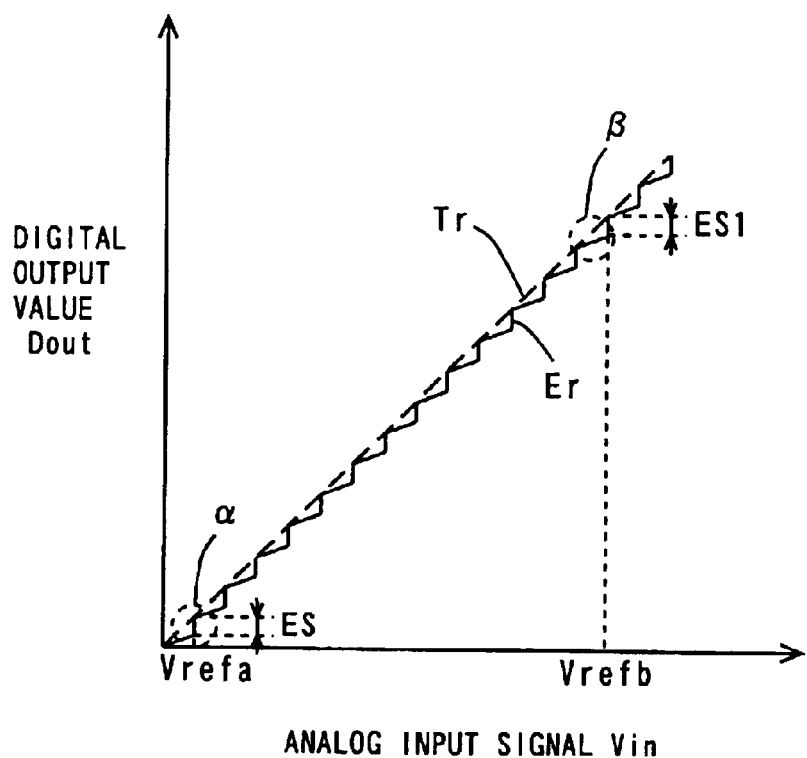
FIG. 17 is a diagram showing the input/output characteristics of the analog-to-digital conversion circuit shown in FIG. 16.

FIG. 17 is a diagram showing the input/output characteristics of the analog-to-digital conversion circuit 1a shown in FIG. 16. In FIG. 17, the abscissa shows the analog input signal Vin, and the ordinate shows a digital output value Dout.

In FIG. 17, the broken line Tr shows the ideal input/output characteristics of the analog-to-digital conversion circuit 1a, and the solid line Er shows the input/output characteristics in a case where operational amplifiers 11 in the analog-to-digital conversion circuit 1a has gain errors.

Ideally, it is desired that the digital output value Dout has a constant proportional relationship with the analog input signal Vin, as shown by the broken line Tr. However, in a case where each of the operational amplifiers 11 has a different gain error due to its input voltage, steps each differing in size as shown by the solid line Er occur in the input/output characteristics of the analog-to-digital conversion circuit 1. In the present embodiment, a size ES of an interstage gain error of α part where the analog input signal Vin is at a reference voltage Vrefa, and a size ES1 of an interstage gain error of β part where the analog input signal Vin is at a reference voltage Vrefb differ from each other.

Upon detecting an interstage gain error, the interstage gain error detection control circuit 30b turns on the switch SW31, and turns off the switches SW32 and SW33. Consequently, the reference voltage Vrefa is supplied to the differential amplifier circuit 14 and the sub-A/D converter 9b in the first-stage circuit 3. Furthermore, the interstage gain error detection control circuit 30b supplies an external input signal (CDSa) and a static test mode signal (MD1) to a sub-A/D converter 9a described below.

Then, the interstage gain error detection control circuit 30b turns on the switch SW33, and turns off the switches SW31 and SW32. Accordingly, the reference voltage Vrefb is supplied to the differential amplifier circuit 14 and the sub-A/D converter 9b in the first-stage circuit 3. Furthermore, the interstage gain error detection control circuit 30b supplies an external input signal (CDSb) and a static test mode signal (MD2) to the mode switching circuit in the sub-A/D converter 9b described below.

Figure 18:
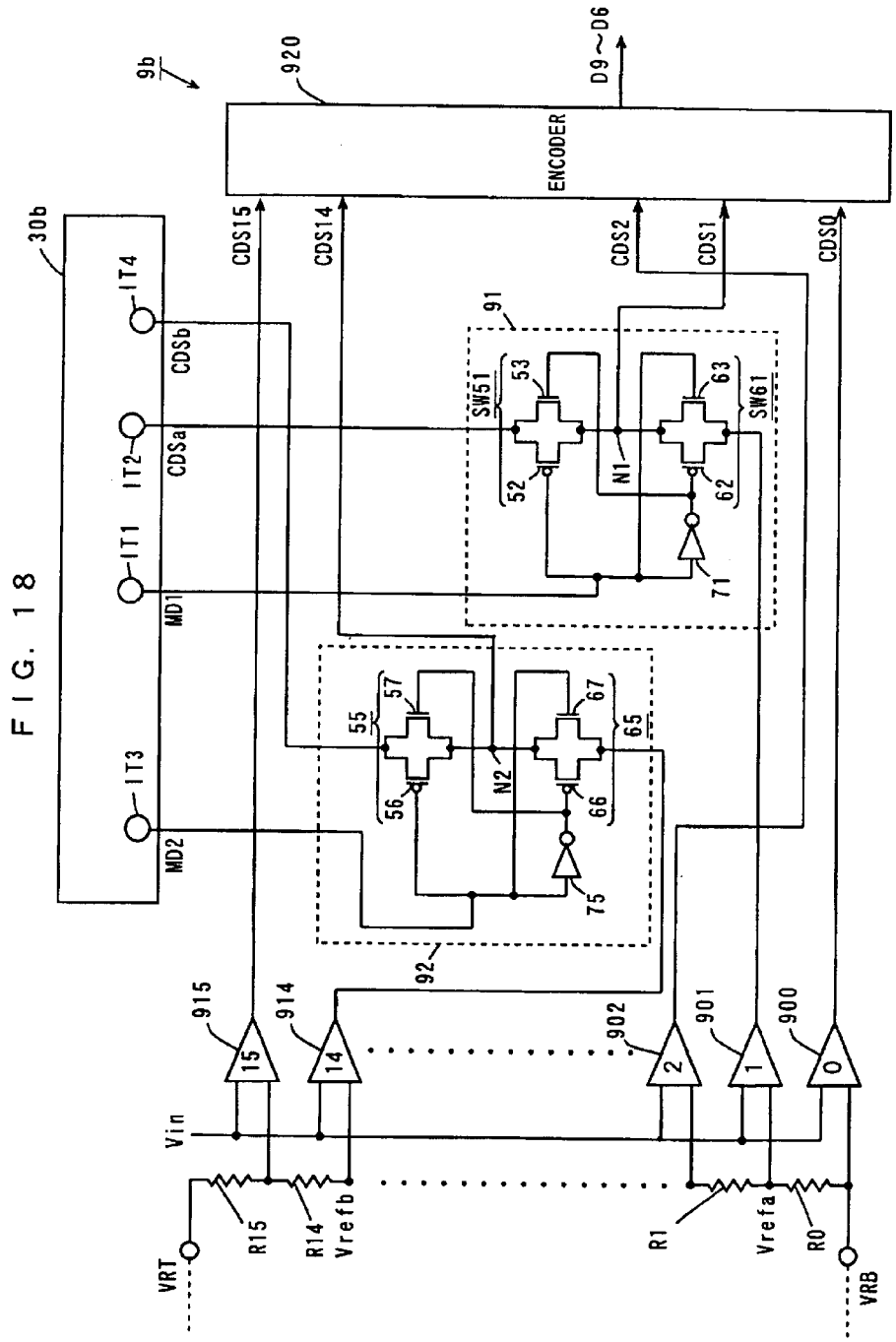
FIG. 18 is a circuit diagram showing the interior structure of a sub-A/D converter.

The structure of the sub-A/D converter 9b will be then described. FIG. 18 is a circuit diagram showing the interior structure of the sub-A/D converter 9b.

The sub-A/D converter 9b shown in FIG. 18 differs from the sub-A/D converter 9a shown in FIG. 15 in the following points. The sub-A/D converter 9b shown in FIG. 18 further includes an mode switching circuit 92, adding to the structure of the sub-A/D converter 9a shown in FIG. 15.

In the present embodiment, the reference voltage Vrefb supplied to a comparator 914 is supplied to the switch SW33 shown in FIG. 16.

The mode switching circuit 91 shown in FIG. 18 has the same structure as that of the mode switching circuit 91 in FIG. 15. The mode switching circuit 92 shown in FIG. 18, on the other hand, is composed of a CMOS switch SW 55, a CMOS switch SW 65, and an inverter 75.

The CMOS switch SW 55 is composed of a PMOSFET 56 and a NMOSFET 57, and the CMOS switch SW 65 is composed of a PMOSFET 66 and a NMOSFET 67.

The interstage gain error detection control circuit 30b has a terminal IT1 for outputting the static test mode signal MD1, a terminal IT2 for outputting the static test mode signal MD2, a terminal IT3 for outputting the external input signal CDSa, and a terminal IT4 for outputting the external input signal CDSb.

The CMOS switch SW 55 is connected between the output terminal IT4 in the interstage gain error detection control circuit 30b and a node N2. The CMOS switch SW 65 is connected between an output terminal in the comparator 914 and the node N2.

To the gates of the PMOSFET 56 and the NMOSFET 67, the static test mode signal MD2 at the terminal IT3 in the interstage gain error detection control circuit 30b is supplied, and to the gates of the PMOSFET 66 and the NMOSFET 57, an inverted signal of the static test mode signal MD2 is supplied through the inverter 75.

During the normal A/D conversion operation, the static test mode signal MD1 at the terminal IT1 and the static test mode signal MD2 at the terminal IT3 in the interstage gain error detection control circuit 30b are "1". This turns off the CMOS switches SW51 and SW55, and turns on the CMOS switches SW 61 and SW65. As a result, an output signal of the comparator 901 is outputted from the node N1 as an output signal CDS1 and output signal of the comparator 914 is outputted from the node N2 as an output signal CDS14.

During the detection of an interstage gain error, first, the static test mode signal MD1 at the terminal IT1 in the interstage gain error detection control circuit 30b is "0", and the static test mode signal MD2 at the terminal IT3 in the interstage gain error detection control circuit 30b is "1". This turns on the CMOS switches SW51 and SW65, and tunrs off the CMOS switches SW55 and SW61. As a result, the external input signal CDSa at the terminal IT2 in the interstage gain error detection control circuit 30b is outputted from the node N1 as an output signal CDS1.

The encoder 920 generates a high order 4-bit digital signal D9, D8, D7, D6 based on output signals CDS0, CDS2 to CDS15 from the respective comparators 900, 902 to 915 and the output signal CDS1 from the mode switching circuit 91.

Then, the static test mode signal MD1 at the terminal IT1 in the interstage gain error detection control circuit 30b is "1", and the static test mode signal MD2 at the terminal IT3 in the interstage gain error detection control circuit 30b is "0". This turns on the CMOS switches SW55 and SW61, and turns off the CMOS switches SW51 and SW65. As a result, the external input signal CDSb at the terminal IT4 in the interstage gain error detection control circuit 30b is outputted from the node N2 as an output signal CDS14.

The encoder 920 generates a high order 4-bit digital signal D9, D8, D7, D6 based on the output signals CDS0 to CDS13, CSD15 from the respective comparators 900 to 913, 915 and the output signal CDS14 from the mode switching circuit 92.

Description is now made of the operations of the analog-to-digital conversion circuit 1a during the detection of an interstage gain error. The interstage gain error detection is carried out, for example before the A/D conversion operation of the analog-to-digital conversion circuit 1a.

In this case, as described in the foregoing, first, the static test mode signal MD1 is set to "0", and the static test mode signal MD2 is set to "1".

The interstage gain error detection control circuit 30b sets the external input signal CDSa to "0". The digital output value Dout at this time is stored in the memory 15 shown in FIG. 16. The interstage gain error detection control circuit 30b then sets the external input signal CDSa to "1". The digital output value Dout at this time is supplied to the subtracter 16. The subtracter 16 calculates the differential value between the digital output value Dout obtained when the external input signal CDSa is "1" and the digital output value Dout stored in the memory 15. The differential value calculated by the subtracter 16 corresponds to the size ES of the interstage gain error shown in FIG. 17. The differential value calculated by the subtracter 16 is supplied to the correction circuit 17.

Then, the static test mode signal MD1 is set to "1", and the static test mode signal MD2 is set to "0".

The interstage gain error detection control circuit 30b first sets the external input signal CDSb to "0". The digital output value Dout at this time is stored in the memory 15 shown in FIG. 16. The interstage gain error detection control circuit 30 then sets the external input signal CDSb to "1". The digital output value Dout is supplied to the subtracter 16. The subtracter 16 calculates the differential value between the digital output value Dout obtained when the external input signal CDSb is "1" and the digital output value Dout stored in the memory 15. The differential value calculated by the subtracter 16 corresponds to the size ES1 of the interstage gain error shown in FIG. 17. The differential value calculated by the subtracter 16 is supplied to the correction value 17.

The correction circuit 17 stores the sizes ES and ES1 of the interstage gain errors, and also calculates an equation or coefficients for correcting the interstage gain errors based on the sizes ES and ES1 of the interstage gain errors, and stores it (them) in the memory.

During the A/D conversion operation of the analog-to-digital conversion circuit 1a, the correction circuit 17 corrects the digital output value Dout outputted from the output circuit 8 based on the equation or coefficients stored in the memory, and outputs a corrected digital output value Douta.

As described in the foregoing, in the analog-to-digital conversion circuit 1a according to the present embodiment, an interstage gain error having steps differing in size can be detected, and the detected interstage gain error is corrected by the correction circuit 17. As a result, it becomes possible to output a digital output value Douta having no interstage gain error.

In the analog-to-digital conversion circuit 1a according to the present embodiment, it is not required to make adjustments, such as a tuning design, in order to correct the interstage gain error. Thus, the development cost thereof can be reduced.

Moreover, in the analog-to-digital conversion circuit 1 according to the present embodiment, the interstage gain error can be readily detected or corrected also in a case where the power supply voltages supplied to the differential amplifier circuits 14 vary, thereby making it possible to readily prevent degraded input/output characteristics.

In the third embodiment, the first-stage circuit 2, second-stage circuit 4, third-stage circuit 5, and fourth-stage circuit 6 correspond to a plurality of circuits, the analog-to-digital conversion circuit 1 corresponds to an analog-to-digital conversion circuit, the sub-A/D converter 9a and 9c correspond to analog-to-digital converters, respectively, the sub-D/A converter 10 corresponds to a digital-to-analog converter, the comparators 900 to 915 correspond to comparators, respectively, the operational amplifier 11 corresponds to an operational amplifier, the reference voltages Vrefa, Vrefc, and Vrefd correspond to reference voltages, respectively, the analog input signals Vin, Vin1, and Vin2 correspond to analog input signals, respectively, the switches SW31, SW32, SW41, SW42, SW51, and SW52 correspond to first switches, respectively, the interstage gain error detection control circuit 30c corresponds to a signal generator circuit, the normal range OR corresponds to a normal range, the redundant ranges eR1 and eR2 correspond to redundant ranges, respectively, the subtracter 16 corresponds to a subtracter, and the correction circuit 17 corresponds to a correction circuit.

Fourth Embodiment

Figure 19:
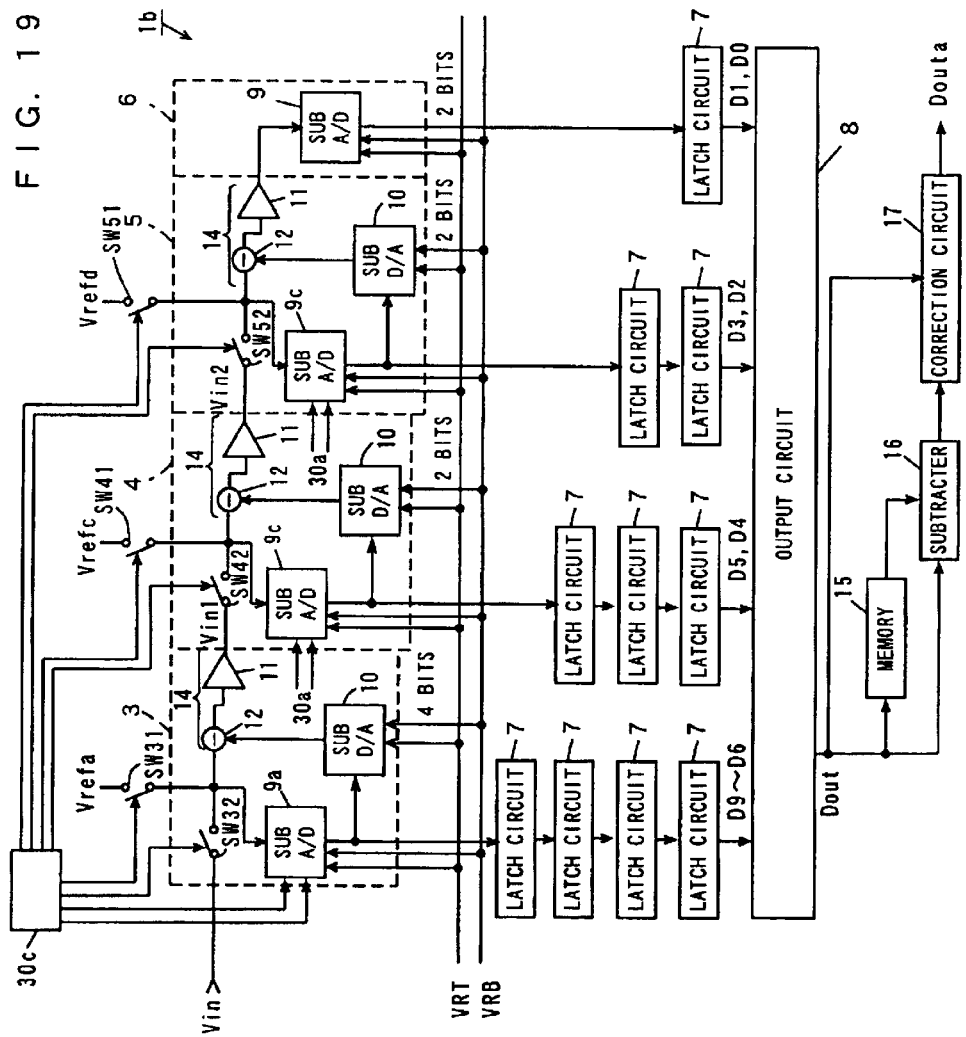
FIG. 19 is a block diagram showing the structure of an analog-to-digital conversion circuit having a multi-stage pipeline structure according to a fourth embodiment of the present invention.

FIG. 19 is a block diagram showing the structure of an analog-to-digital conversion circuit having a multi-stage pipeline structure according to a fourth embodiment in the present invention. The structure of the analog-to-digital conversion circuit 1b shown in FIG. 19 differs from the structure of the analog-to-digital conversion circuit 1 shown in FIG. 12 in the following points.

In FIG. 19, an interstage gain error detection control circuit 30c is provided in place of the interstage gain error detection control circuit 30. In the first-stage circuit 3, switches SW31 and SW32, which are turned on and off by the interstage gain error detection control circuit 30c are provided. In the second-stage circuit 4, switches SW41 and SW42, which are turned on and off by the interstage gain error detection control circuit 30c are provided, and in the third-stage circuit 5, switches SW51 and SW52, which are turned on and off by the interstage gain error detection control circuit 30c are provided.

To one end of the switch SW31 a reference voltage Vref a is supplied, to one end of the switch SW41 a reference voltage Vrefc is supplied, and to one end of the switch SW51 a reference voltage Vrefd is applied.

Furthermore, a sub-A/D converter 9c is provided in place of the sub-A/D converter 9 in each of the second-stage circuit 4 and the third-stage circuit 5 shown in FIG. 12.

During the normal A/D conversion operation, the interstage gain error detection control circuit 30c turns off the switches SW31, SW41, and SW51, and turns on the switches SW32, SW42, and SW52. Consequently, an analog input signal Vin is transferred to a differential amplifier circuit 14 and the sub-A/D converter 9a in the first-stage circuit 3. An analog input signal Vin1 outputted from the first-stage circuit 3 is transferred to a differential amplifier circuit 14 and to the sub-A/D converter 9c in the second-stage circuit 4, and an analog input signal Vin2 outputted from the second-stage circuit 4 is transferred to a differential amplifier circuit 14 and to the sub-A/D converter 9c in the third-stage circuit 5.

Figure 20:
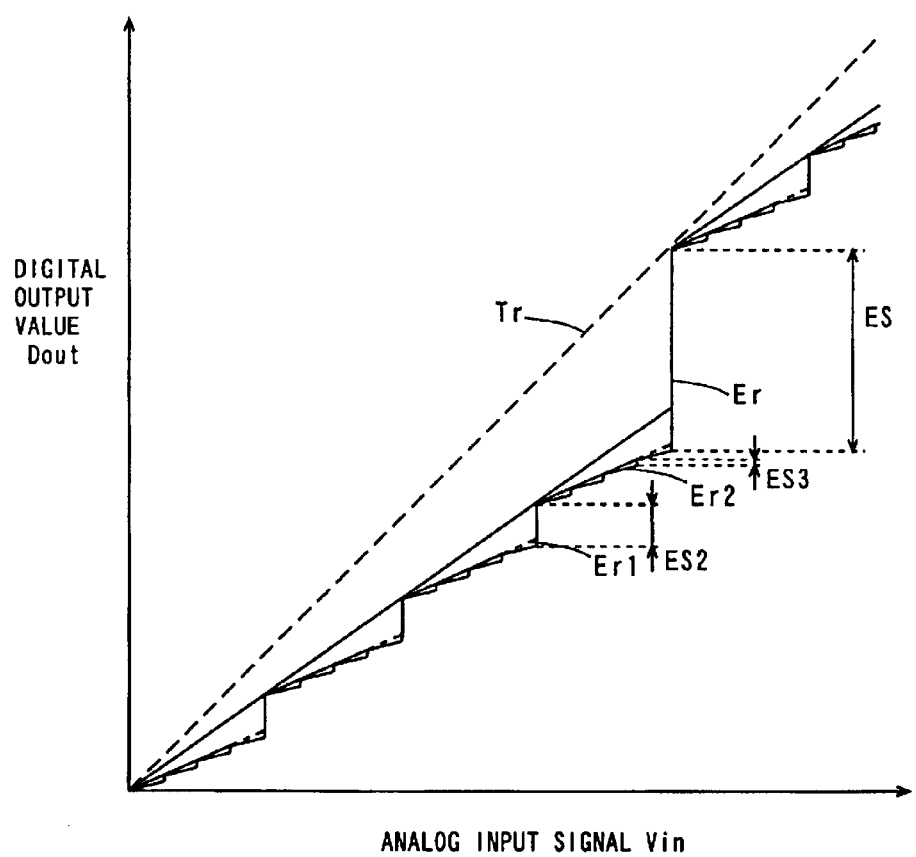
FIG. 20 is a diagram showing the input/output characteristics of the analog-to-digital conversion circuit shown in FIG. 19.

FIG. 20 is a diagram showing the input/output characteristics of the analog-to-digital conversion circuit 1b shown in FIG. 19. In FIG. 20, the abscissa shows an analog input signal Vin, and the ordinate shows a digital output value Dout.

In FIG. 20, the broken line Tr shows the ideal input/output characteristics of the analog-to-digital conversion circuit 1b, the solid line Er shows the input/output characteristics in a case where the operational amplifier 11 in the first-stage circuit 3 in the analog-to-digital conversion circuit 1b has a gain error, the solid line Er1 shows the input/output characteristics in a case where each of the operational amplifiers 11 in the first-stage circuit 3, the second-stage circuit 4 and the third-stage circuit 5 in the analog-to-digital conversion circuit 1b has a gain error, and the solid line Er2 shows the input/output characteristics in a case where each of the operational amplifiers 11 in the first-stage circuit 3 and the second-stage circuit 4 in the analog-to-digital conversion circuit 1b has a gain error.

In the fourth embodiment, a size ES of an interstage gain error due to the operational amplifier 11 in the first-stage circuit 3, a size ES2 of an interstage gain error due to each of the operational amplifiers 11 in the first-stage circuit 3 and the second-stage circuit 4, and a size ES3 of an interstage gain error due to each of the operational amplifiers 11 in the first-stage circuit 3, second-stage circuit 4, and the third-stage circuit 5 are detected, respectively.

Upon detecting the interstage gain error, the interstage gain error detection control circuit 30c turns on the switches SW31, SW42, and SW52, and turns off the switches SW32, SW41, and SW51. Consequently, the reference voltage Vrefa is supplied to the differential amplifier circuit 14 and the sub-A/D converter 9a in the first-stage circuit 3. Furthermore, the interstage gain error detection control circuit 30c supplies an external input signal CDSa and a static test mode signal MD1 to the mode switching circuit 91 in the sub-A/D converter 9a in the first-stage circuit 3 shown in FIG. 15.

The interstage gain error detection control circuit 30c then turns on the switch SW41 and turns off the switch SW42. Consequently, the reference voltage Vrefc is supplied to the differential amplifier circuit 14 and the sub-A/D converter 9c in the second-stage circuit 4. Furthermore, the interstage gain error detection control circuit 30c supplies the external input signal CDSa and the static test mode signal MD1 to an mode switching circuit in the sub-A/D converter 9c in the second-stage circuit 4 described below.

Then, the interstage gain error detection control circuit 30c turns on the switch SW51 and turns off the switch SW52. Consequently, the reference voltage Vrefd is supplied to the differential amplifier circuit 14 and to the sub-A/D converter 9c in the third-stage circuit 5. Furthermore, the interstage gain error detection control circuit 30c supplies the external input signal CDSa and the static test mode signal MD1 to an mode switching circuit in the sub-A/D converter 9c in the third-stage circuit 5 described below.

The structure of the sub-A/D converter 9a shown in FIG. 19 is the same as that of the sub-A/D converter 9a shown in FIG. 15.

Figure 21:
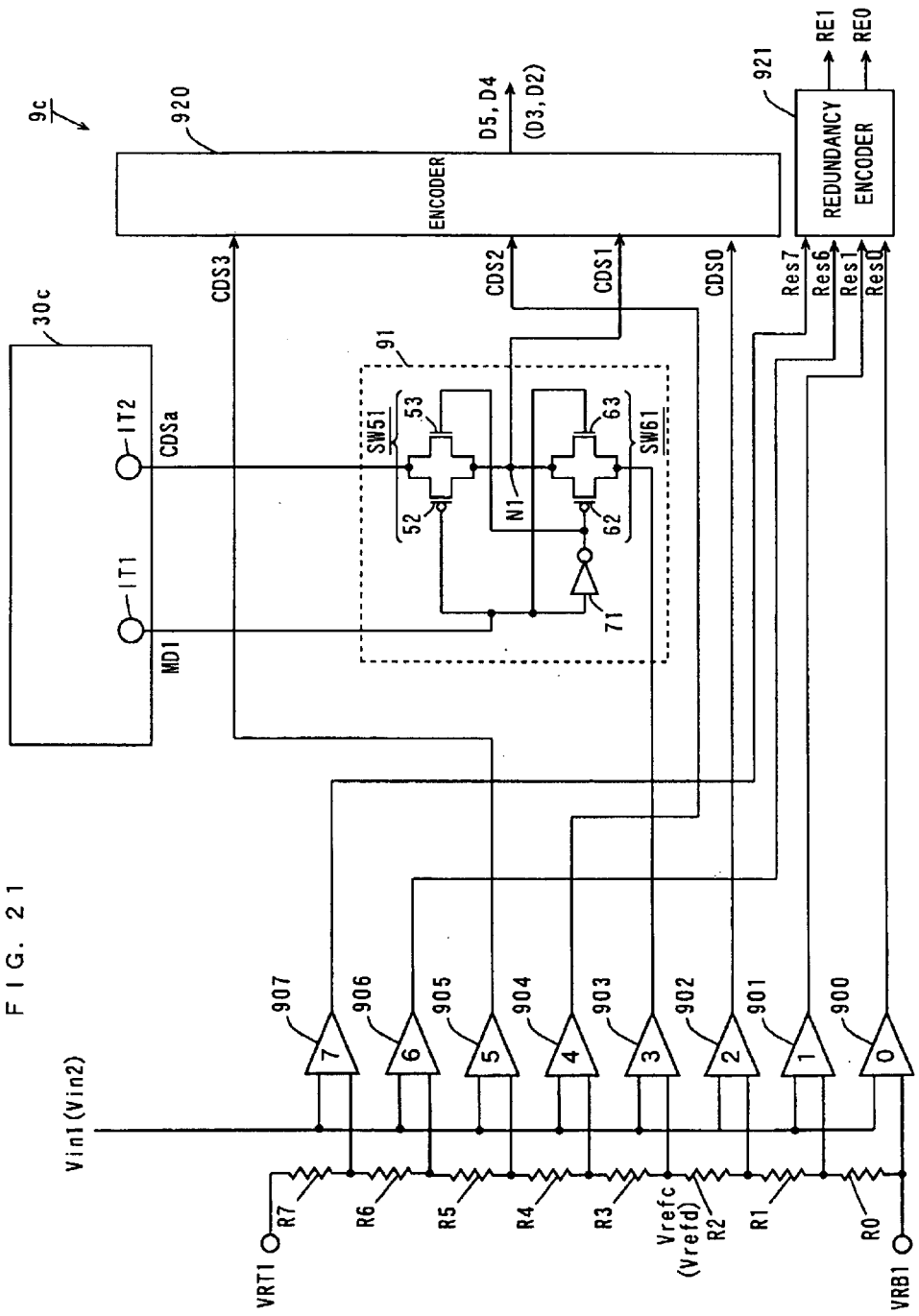
FIG. 21 is a circuit diagram showing the interior structure of a sub-A/D converter.

The structure of the sub-A/D converter 9c in the second-stage circuit 4 will be then described. FIG. 21 is a circuit diagram showing the interior structure of the sub-A/D converter 9c. The sub-A/D converter 9c in the second-stage circuit 4 shown in FIG. 21 differs from the sub-A/D converter 9a shown in FIG. 15 in the following points.

The sub-A/D converter 9c shown in FIG. 21 includes reference resistances R0 to R7 in place of the reference resistances R0 to R15 shown in FIG. 15, and comparators 900 to 907 in place of the comparators 900 to 915 shown in FIG. 15.

Electric potential difference between a reference voltage VRT1 and a reference voltage VRB1 is divided by the plurality of the reference resistances R0 to R7 in the sub-A/D converter 9c to generate a plurality of reference voltages. The reference voltage Vrefc is generated at a node between the reference resistance R2 and the reference resistance R3.

In the sub-A/D converter 9c, redundant ranges are respectively provided over and under its normal range, and output signals Res 0, Res 1, Res 6, Res 7 of the respective comparators 900, 901, 906, 907 are supplied to a redundancy encoder 920.

The redundancy encoder 920 generates redundant-range determination signals RE0, RE1 based on the output signals Res 0, Res 1, Res 6, Res 7.

Each of the comparators 902 to 905 compares a corresponding reference voltage with the analog input signal Vin1 outputted from the first-stage circuit 3. As described in the foregoing, in the present embodiment, the reference voltage Vrefc supplied to the comparator 903 is supplied to the switch SW41 shown in FIG. 19.

The mode switching circuit 91 shown in FIG. 21 has the same structure as that of the mode switching circuit 91 shown in FIG. 15.

The interstage gain error detection control circuit 30c has a terminal IT1 for outputting the static test mode signal MD1 and a terminal IT2 for outputting the external input signal CDSa.

During the normal A/D conversion operation, the static test mode signal MD1 at the terminal IT1 in the interstage gain error detection control circuit 30c is "1". This turns off a CMOS switch SW51, and turns on a CMOS switch SW 61.

As a result, an output signal from the comparator 903 is outputted from a node N1 as an output signal CDS1.

During the detection of the interstage gain error, the static test mode signal MD1 at the terminal IT1 in the interstage gin error detection control circuit 30c is "0". This turns on the CMOS switch SW51 and turns off the CMOS switch SW61. As a result, the external input signal CDSa at the terminal IT2 in the interstage gain error detection control circuit 30c is outputted from the node N1 as an output signal CDS1.

An encoder 920 generates an intermediate high order 2-bit digital signal D5, D4 based on output signals CDS0, CDS2, CDS3 from the respective comparators 902, 904, 905 and the output signal CDS1 from the mode switching circuit 91.

The interstage gain error detection control circuit 30c first sets the external input signal CDSa to "0". The digital output value Dout at this time is stored in the memory 15 shown in FIG. 19.

The interstage gain error detection control circuit 30c then sets the external input signal CDSa to "1". The digital output value Dout at this time is supplied to the subtracter 16. The subtracter 16 calculates the differential value between the digital output value Dout obtained when the external input signal CDSa is "1" and the digital output value Dout stored in the memory 15. The differential value calculated by the subtracter 16 corresponds to the size ES2 of the interstage gain error shown in FIG. 20. The differential value calculated by the subtracter 16 is supplied to the correction circuit 17.

The structure and operations of the sub-A/D converter 9c in the third-stage circuit 5 are the same as those of the sub-A/D converter 9c in the second-stage circuit 4 shown in FIG. 21.

In the sub-A/D converter 9c in the third-stage circuit 5, the reference voltage Vrefd is generated at a node between the reference resistance R2 and the reference resistance R3.

Each of the comparators 902 to 905 compares a corresponding reference voltage with the analog input signal Vin2 outputted from the second-stage circuit 4. As described in the foregoing, in the present embodiment, the reference voltage Vrefd supplied to the comparator 903 is supplied to the switch SW51 shown in FIG. 19.

The encoder 920 in the sub-A/D converter 9c in the third-stage circuit 5 generates an intermediate low order 2-bit digital signal D3, D2 based on the output signals CDS0, CDS2, CDS3 from the respective comparators 902, 904, 905 and the output signal CDS1 from the interstage gain error circuit 91.

The interstage gain error detection control circuit 30c first sets the external input signal CDSa supplied to the sub-A/D converter 9c in the third-stage circuit 5 to "1". The digital output value Dout at this time is stored in the memory 15 shown in FIG. 19.

The interstage gain error detection control circuit 30c then sets the external input signal CDSa supplied to the sub-A/D converter 9c in the third-stage circuit 5 to "0". The digital output value Dout obtained at this time is supplied to the subtracter 16. The subtracter 16 calculates the differential value between the digital output value Dout when the external input signal CDSa is "1" and the digital output value Dout stored in the memory 15. The differential value calculated by the subtracter 16 corresponds to the size ES3 of the interstage gain error. The differential value calculated by the subtracter 16 is supplied to the correction circuit 17.

The correction circuit 17 stores the sizes ES, ES2, and ES3 of the respective interstage gain errors, and also calculates an equation or coefficients for correcting the interstage gain errors based on the sizes ES, ES2, and ES3 of the interstage gain errors, which is (are) stored in the memory.

During the A/D conversion operation of the analog-to-digital conversion circuit 1b, the correction circuit 17 corrects the digital output value Dout outputted from the output circuit 8 based on the equation or coefficients stored in the memory, and outputs a corrected digital output value Douta.

As described in the foregoing, in the analog-to-digital conversion circuit 1b according to the fourth embodiment, the interstage gain error due to each of the operational amplifiers 14 in the second-stage circuit 3 and the third-stage circuit 4 can be detected, and the detected interstage gain error is corrected by the correction circuit 17. As a result, it becomes possible to output a digital output value Douta having no interstage gain error.

Furthermore, in the analog-to-digital conversion circuit 1b according to the present embodiment, it is not required to make adjustments, such as a tuning design, in order to correct the interstage gain error. Thus, the development cost thereof can be reduced.

Furthermore, in the analog-to-digital conversion circuit 1b according to the present embodiment, the interstage gain error can be readily detected or corrected also in a case where the power supply voltages supplied to the differential amplifier circuits 14 vary, thereby making it possible to readily prevent degraded input/output characteristics.

In the fourth embodiment, the first-stage circuit 3, second-stage circuit 4, third-stage circuit 5, and fourth-stage circuit 6 correspond to a plurality of circuits, the analog-to-digital conversion circuit corresponds to an analog-to-digital conversion circuit, the sub-A/D converters 9a and 9c correspond to analog-to-digital converters, respectively, the sub-D/A converter 10 corresponds to a digital-to-analog converter, the comparators 900 to 907 correspond to comparators, respectively, the operational amplifier 11 corresponds to an operational amplifier, the reference voltages Vrefa, Vrefc, and Vrefd correspond to reference voltages, respectively, the analog input signals Vin, Vin1, and Vin2 correspond to analog signals, respectively, the switches SW31, SW32, SW41, SW42, SW51, and SW52 correspond to first switches, respectively, the interstage gain error detection control circuit 30c corresponds to a signal generation circuit, the normal range OR corresponds to a normal range, the redundant ranges eR1 and eR2 correspond to redundant ranges, respectively, the subtracter 16 corresponds to a subtracter, and the correction circuit 17 corresponds to a correction circuit.

Fifth Embodiment

Figure 22:
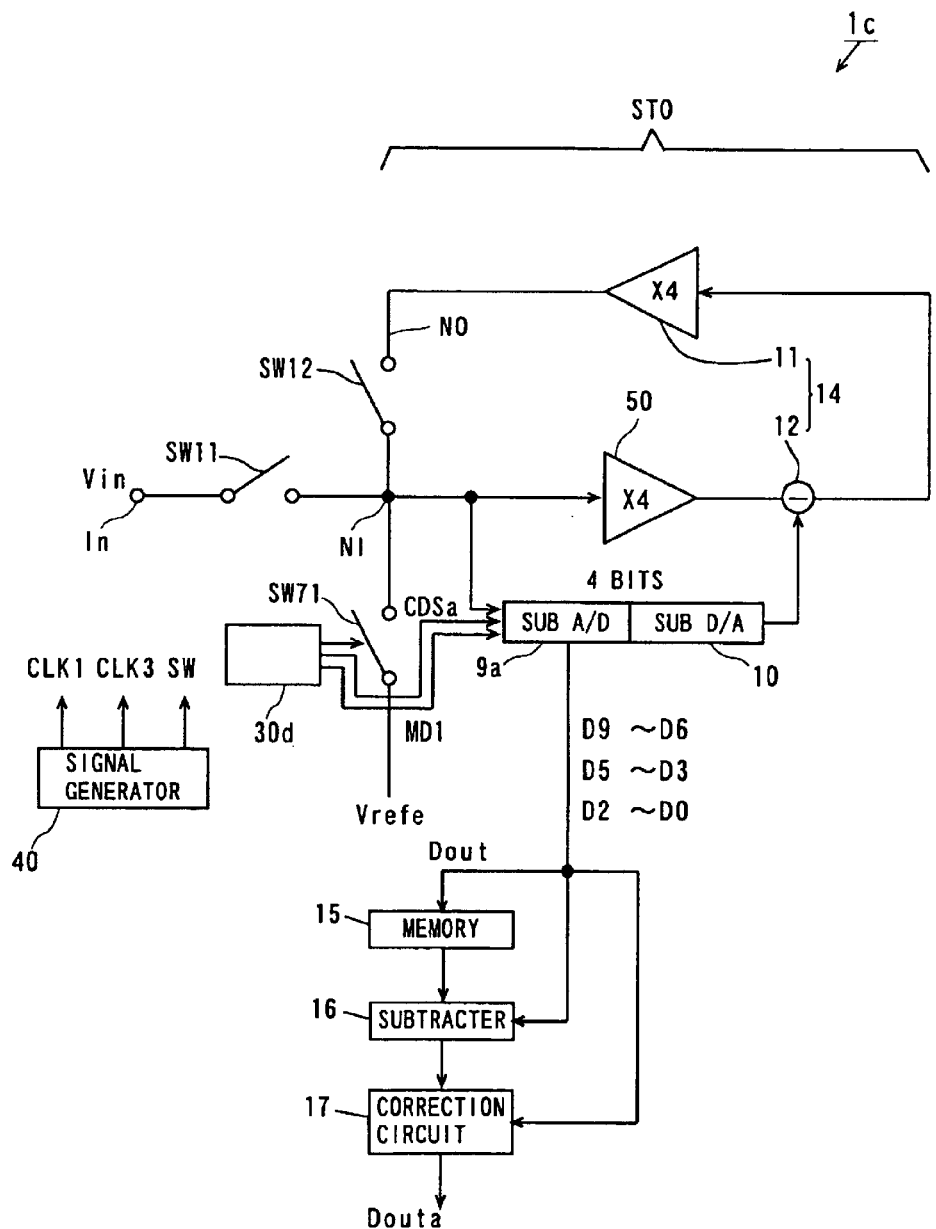
FIG. 22 is a block diagram showing the structure of an analog-to-digital conversion circuit having a multi-stage pipeline structure according to a fifth embodiment of the present invention.

FIG. 22 is a block diagram showing the structure of an analog-to-digital conversion circuit having a multi-stage pipeline structure according to a fifth embodiment of the present invention. The analog-to-digital conversion circuit 1c shown in FIG. 22 includes a circuit ST0, switches SW11, SW12, and SW71, an interstage gain error detection control circuit 30d, and a signal generator 40.

In FIG. 22, the circuit ST0 includes an operational amplifier 50, a sub-A/D converter 9a, a sub-D/A converter 10, a subtraction circuit 12, and an operational amplifier 11. The subtraction circuit 12 and the operational amplifier 11 constitute a differential amplifier 14.

The gain of the operational amplifiers 11 in the circuit ST0 is two, and the gain of the operational amplifier 50 in the circuit ST0 is four. The sub-A/D converter 9a in the circuit ST0 has a 4-bit configuration.

The signal generator 40 generates a clock signals CLK1 and CLK2 and a control signal SW. The clock signal CLK1 has a frequency Fs, and the clock signal CLK3 has a frequency 3 Fs, which is three times as high as the frequency Fs of the clock signal CLK1. The control signal SW has a frequency equal to the frequency Fs of the clock signal CLK1.

The operational amplifier 50, the sub-A/D converter 9a, the sub-D/A converter 10, and the operational amplifier 11 in the circuit ST0 each operate in response to the clock signal CLK3. The switches SW1l and SW12 turn on and off in a complementary manner in response to the control signal SW. The switch SW71 is turned on and off by the interstage gain error detection control circuit 30d. A reference voltage Vrefe described below is supplied to one end of the switch SW71.

The operations of the analog-to-digital conversion circuit 1c will be then described.

During the normal A/D conversion operation, the interstage gain error detection control circuit 30d turns off the switch SW71. Consequently, an analog input signal Vin is transferred to the operational amplifier 50 and the sub-A/D converter 9a in the circuit ST0 when the switch SW1l is in an on state.

The sub-A/D converter 9a subjects the analog input signal Vin to A/D conversion, and outputs a high order 4-bit digital signal D9 to D6, which is a result of the A/D conversion, and supplies the digital signal to the sub-A/D converter 10. The sub-D/A converter 10 subjects the 4-bit digital signal supplied from the sub-A/D converter 9a to D/A conversion, and outputs a resulting analog signal.

The operational amplifier 50, on the other hand, samples and amplifies the analog input signal Vin at an input node N1 for output. The subtraction circuit 12 subtracts between the analog input signal Vin outputted from the operational amplifier 50 and the analog input signal outputted from the sub-D/A converter 10. The operational amplifier 11 amplifies an output signal from the subtraction circuit 12, and outputs a resulting analog signal. The analog signal outputted from the operational amplifier 11 is supplied to the input node N1 when the switch SW12 is in an on state. After repeating the operations above, an intermediate order 3-bit D5 to D3 and a low order 3-bit D2 to D0 are obtained from the sub-A/D converter 9a. The sub-A/D converter 9a accordingly outputs a 10-bit digital output value Dout corresponding to the analog input signal Vin.

Figure 23:
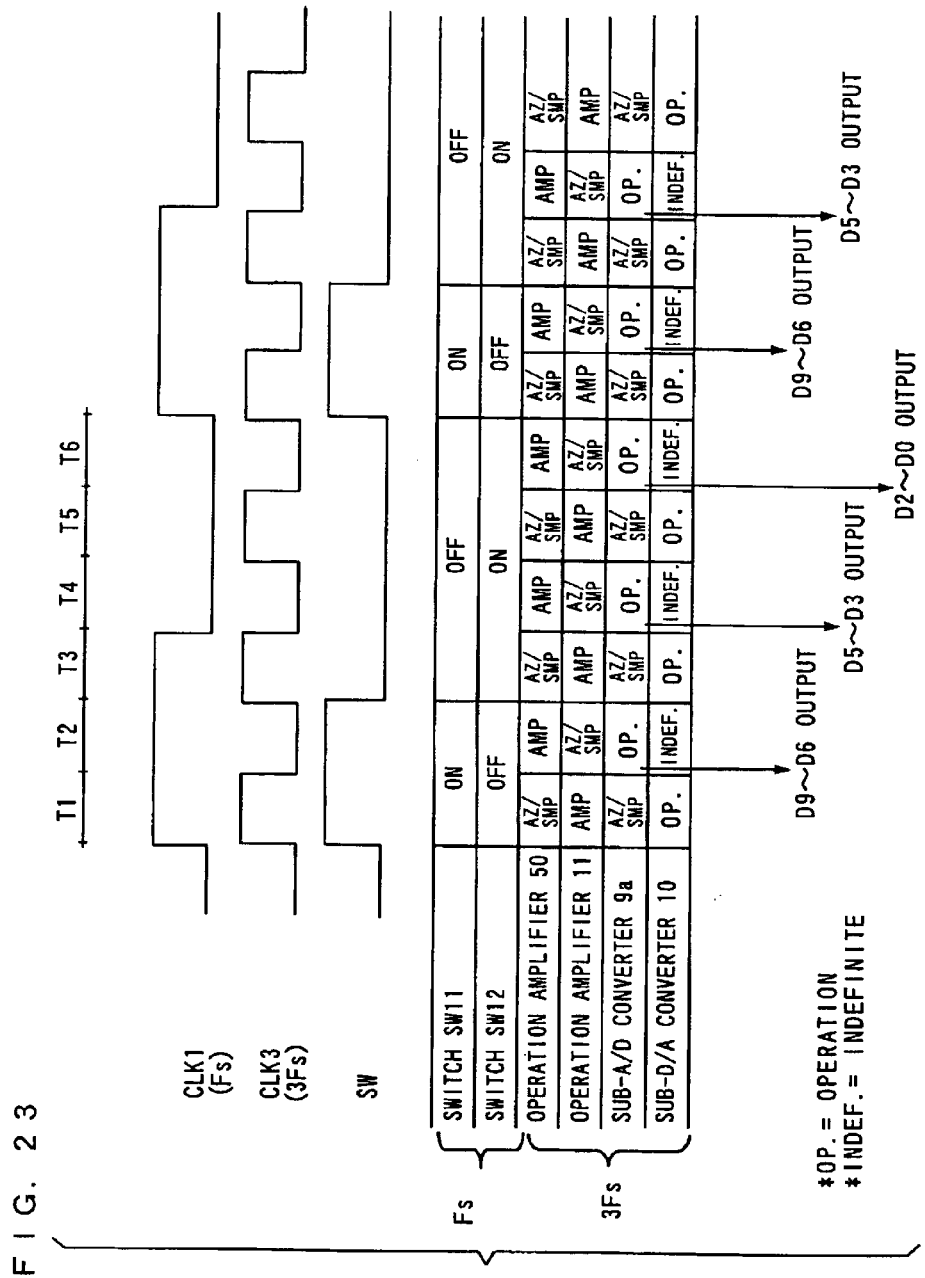
FIG. 23 is a timing chart for explaining how the analog-to-digital conversion circuit shown in FIG. 22 operates during the normal A/D conversion operation.

Description is now made of how the analog-to-digital conversion circuit 1c shown in FIG. 22 operates during the normal A/D conversion operation. FIG. 23 is a timing chart for explaining how the analog-to-digital conversion circuit 1c shown in FIG. 22 operates during the normal A/D conversion operation.

In FIG. 23, AMP shows amplifying operation, AZ shows auto zero operation, and SMP shows sampling operation.

In periods T1 to T2, the control signal SW attains a high level. This turns on the switch SW11 and turns off the switch SW12. The analog input signal Vin supplied to an input terminal. It is accordingly transferred to the input node N1 through the switch SW11.

First, in the period 1, the clock signal CLK3 attains a high level. Accordingly, the operational amplifier 50 in the circuit ST0 carries out auto zero operation and sampling operation, and the sub-A/D converter 9a carries out auto zero operation and sampling operation. At the time, the operational amplifier 11 carries out amplifying operation, and the output of the sub-D/A converter 10 is indefinite.

Then, in the period T2, the clock signal CLK3 attains a low level. Accordingly, the operational amplifier 50 in the circuit ST0 carries out amplifying operation, and the sub-A/D converter 9a carries out A/D conversion operation. In this case, the high order 4-bit digital signal D9 to D6 is outputted from the sub-A/D converter 9a.

In the periods T3 to T6, the control signal SW attains a low level. Accordingly, the analog signal outputted from the operational amplifier 11 to an output node NO is supplied to the input node NI through the switch SW12.

First, in the period T3, the clock signal CLK3 attains a high level. Accordingly, the operational amplifier 50 in the circuit ST0 carries out auto zero operation and sampling operation, and the sub-A/D converter 9a carries out auto zero operation and sampling operation. At the time, the operational amplifier 11 carries out amplifying operation, and the sub-A/D converter 10 carries out D/A conversion operation. As a result, the analog signal outputted from the operational amplifier 11 to the output node NO is supplied to the input node NI through the switch SW12.

Then, in the period T4, the clock signal CLK3 attains a low level. Accordingly, the operational amplifier 50 in the circuit ST0 carries out amplifying operation, and the sub-A/D converter 9a carries out A/D conversion operation. In this case, an intermediate 3-bit digital signal D5 to D3 and one redundant bit are outputted from the sub-A/D converter 9a. At the time, the operational amplifier 11 carries out auto zero operation and sampling operation, and the output of the sub-A/D converter 10 is indefinite.

In the period T5, the clock signal CLK3 attains a high level. Accordingly, the operational amplifier 50 in the circuit ST0 carries out auto zero operation and sampling operation, and the sub-A/D converter 9a carries out auto zero operation and sampling operation. At the time, the operation amplifier 11 carries out amplifying operation, and the sub-D/A converter 10 carries out D/A operation. As a result, the analog signal outputted from the operational amplifier 11 to the output node NO is supplied to the input node NI through the switch SW12.

Then, in the period T6, the clock signal CLK3 attains a low level. Accordingly, the operational amplifier 50 in the circuit ST0 carries out amplifying operation, and the sub-A/D converter 9a carries out A/D conversion operation. In this case, the low order 3-bit digital signal D2 to D0 and one redundant bit are outputted from the sub-A/D converter 9a. At the time, the operational amplifier 11 carries out auto zero operation and sampling operation, and the output from the sub-D/A converter 10 is indefinite.

Figure 24:
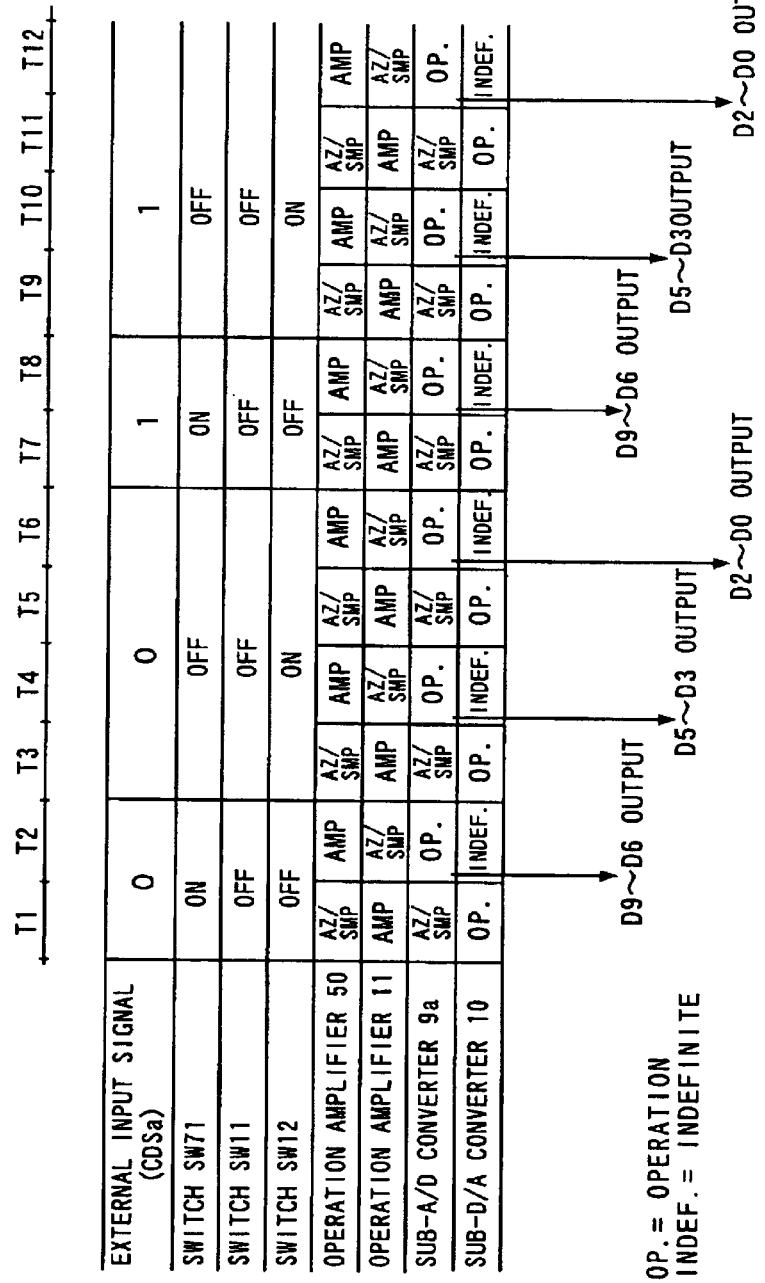
FIG. 24 is a timing chart for explaining how the analog-to-digital conversion circuit shown in FIG. 22 operates during the detection of an interstage gain error.

FIG. 24 is a timing chart for explaining the operations of the analog-to-digital conversion circuit 1c shown in FIG. 22 during the detection of an interstage gain error.

In FIG. 24, AMP shows amplifying operation, AZ shows auto zero operation, and SMP shows sampling operation. Upon detecting an interstage gain error, the interstage gain error detection control circuit 30d sets a static test mode signal MD1 to "0".

In the periods T1 to T2, the interstage gain error detection control circuit 30d turns on the switch SW71. The switches SW11 and SW12 are turned off. The reference voltage Vrefe is accordingly supplied to the input node NI through the switch SW71.

In this case, the interstage gain error detection control circuit 30d sets an external input signal CDSa to "0". Then, as shown in FIG. 15, the external input signal CDSa is outputted from the node N1 as an output signal CDS1. Accordingly, the high order 4-bit digital signal D9 to D6 is outputted from the sub-A/D converter 9a.

In the periods T3 to T6, the switches SW11 and SW71 are turned off, and the switch SW12 is turned on. Accordingly, the analog signal outputted from the operational amplifier 12 to the output node NO is supplied to the input node NI through the switch SW12.

Consequently, the intermediate 3-bit digital signal D5 to D3 and one redundant bit are outputted from the sub-A/D converter 9a. The low order 3-bit digital signal D2 to D0 and one redundant bit are then outputted from the sub-A/D converter 9a. The digital output value Dout at this time is stored in the memory shown in FIG. 15.

In the periods T7 to T8, the interstage gain error detection control circuit 30d turns on the switch SW71. The switches SW1l and SW12 are turned off. Consequently, the reference voltage Vrefe is supplied to the input node N1 through the switch SW71.

In this case, the interstage gain error detection control circuit 30d sets the external input signal CDSa to "1". Then, as shown in FIG. 15, the external input signal CDSa is outputted from the node N1 as an output signal CDS1. Consequently, the high order 4-bit digital signal D9 to D6 is outputted from the sub-A/D converter 9a.

In the periods T9 to T12, the switches SW11 and SW71 are turned off, and the switch SW12 is turned on. Accordingly, the analog signal outputted from the operational amplifier 12 to the output node NO is supplied to the input node NI through the switch SW12.

Consequently, the intermediate 3-bit digital signal D5 to D3 and one redundant bit are outputted from the sub-A/D converter 9a. Then, the low order 3-bit digital signal D2 to D0 and one redundant bit are outputted from the sub-A/D converter 9a.

The digital output value Dout at this time is supplied to the subtracter 16. The subtracter 16 subtracts the differential value between the digital output value Dout obtained when the external input signal CDSa is "1" and the digital output value Dout stored in the memory 15. The differential value calculated by the subtracter 16 corresponds to the size ES of the interstage gain error. The differential value calculated by the subtracter 16 is supplied to the correction circuit 17.

The correction circuit 17 stores the size ES of the interstage gain error, and also calculates an equation or coefficients for correcting the interstage gain error based on the size ES of the interstage gain error, and stores it (them) in the memory.

During the A/D conversion operation of the analog-to-digital conversion circuit 1c, the correction circuit 17 corrects the digital output value Dout outputted from the sub-A/D converter 9a based on the equation or coefficients stored in the memory, and outputs a corrected digital output value Douta.

As described in the foregoing, in the analog-to-digital conversion circuit 1c according to the fifth embodiment, an interstage gain error can be detected, and the detected interstage gain error is corrected by the correction circuit 17. As a result, it becomes possible to output a digital output value Douta having no interstage gain error.

Furthermore, in the analog-to-digital conversion circuit 1c according to the present embodiment, it is not required to make adjustments, such as a tuning design, in order to correct the interstage gain error. Thus, the development cost thereof can be reduced.

In the analog-to-digital conversion circuit 1c according to the fifth embodiment, the interstage gain error can be readily detected or corrected also in a case where the power supply voltages supplied to the differential amplifier circuits 14 vary, thereby making it possible to readily prevent degraded input/output characteristics.

Furthermore, in the analog-to-digital conversion circuit 1c according to the fifth embodiment, the high order 4-bit digital signal D9 to D6, the intermediate order 3-bit digital signal D5 to D3, and the low order 3-bit digital signal D2 to D0 are sequentially outputted from the single-stage circuit ST0. In this manner, a 10 bit three-stage pipeline structure is composed of the single-stage circuit ST0. Thus, the necessary area for the circuit is decreased.

While in the embodiment described above, the pair of operational amplifiers 11 and 50 is provided in the circuit ST0, one or more than two operational amplifiers may be provided in a circuit as an alternative design.

In the fifth embodiment, the input node NI and the output node NO correspond to a first node and second node, respectively, the analog-to-digital conversion circuit 1c corresponds to a first circuit, the sub-A/D converter 9a corresponds to an analog-to-digital converter, the sub-D/A converter 10 corresponds to a digital-to-analog converter, the switches SW11 and SW12 correspond to switching devices, respectively, comparators 900 to 915 correspond to comparators, respectively, the operational amplifier 11 corresponds to an operational amplifier, the reference voltage Vrefe corresponds to a reference voltage, the analog input signal Vin corresponds to an analog signal, the switch SW71 corresponds to a first switch, the interstage gain error detection control circuit 30d corresponds to a signal generation circuit, the mode switching circuit 91 corresponds to a second switch, the normal range OR corresponds to a normal range, the redundant ranges eR1 and eR2 correspond to redundant ranges, respectively, the subtracter 16 corresponds to a subtracter, and the correction circuit 17 corresponds to a correction circuit.

Sixth Embodiment

Figure 25:
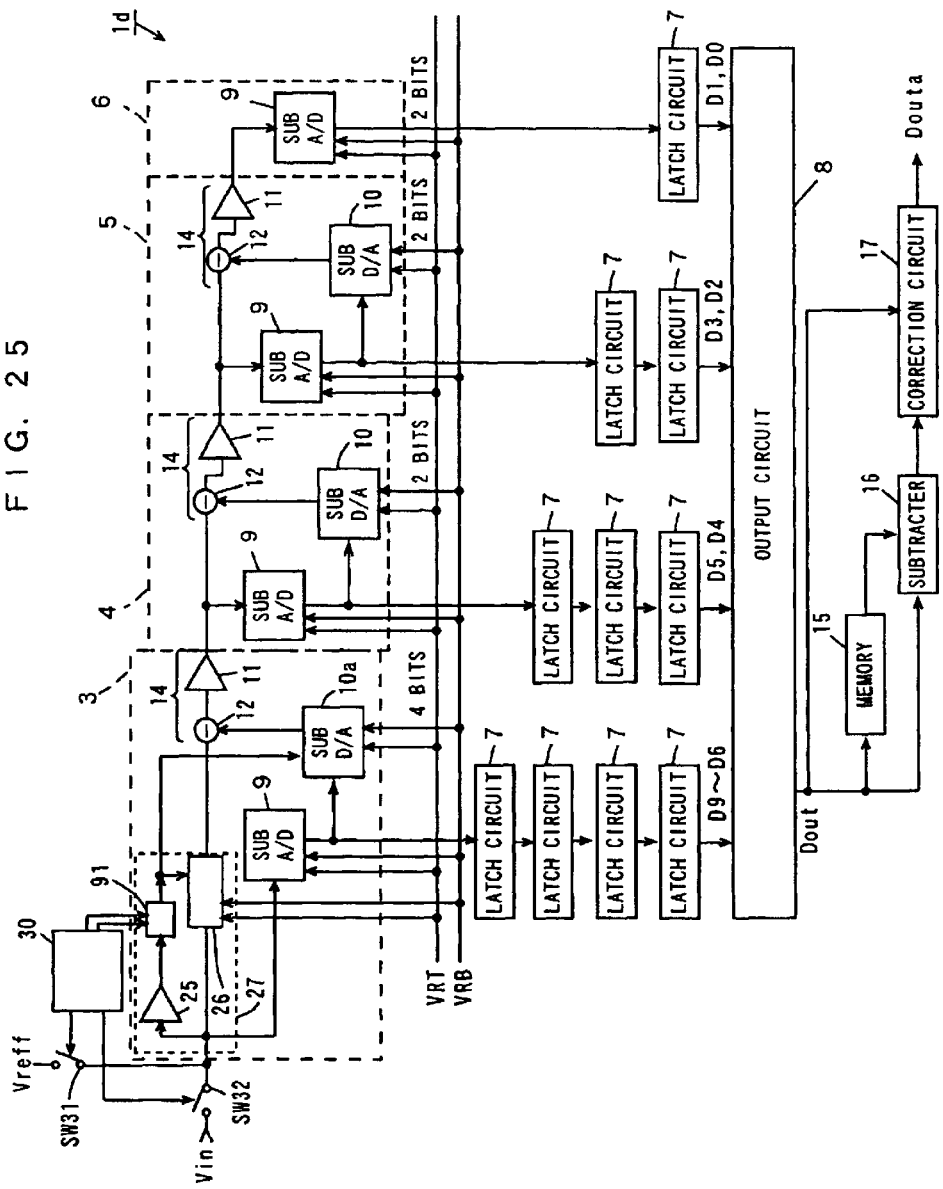
FIG. 25 is a block diagram showing the structure of an analog-to-digital conversion circuit having a multi-stage pipeline structure according to a sixth embodiment of the present invention.

FIG. 25 is a block diagram showing the structure of an analog-to-digital conversion circuit having a multi-stage pipeline structure according to a sixth embodiment of the present invention. The structure of the analog-to-digital conversion circuit 1d shown in FIG. 25 differs from the structure of the analog-to-digital conversion circuit 1 shown in FIG. 12 in the following points.

In FIG. 25, in a first-stage circuit 3, an adjustment unit 27 is further provided, and a sub-D/A converter 10a is provided in place of the sub-D/A converter 10. The adjustment unit 27 includes a comparator 25, a sample and hold circuit 26, and an mode switching circuit 91. To one end of a switch SW31, a reference voltage Vreff is applied. The mode switching circuit 91 has the same structure as that of the mode switching circuit 91 in the sub-A/D converter 9a shown in FIG. 15.

The sample and hold circuit 27 in the adjustment unit 27 includes an operational amplifier having an amplification rate two times high and an adjustment circuit for adjusting the reference voltage supplied to the operational amplifier. The sub-D/A converter 10a further includes an adjustment circuit for adjusting its output voltage based on the adjustment of the reference voltage in the sample and hold circuit 26, in addition to the structure of the sub-D/A converter 10 shown in FIG. 12.

Figure 26:
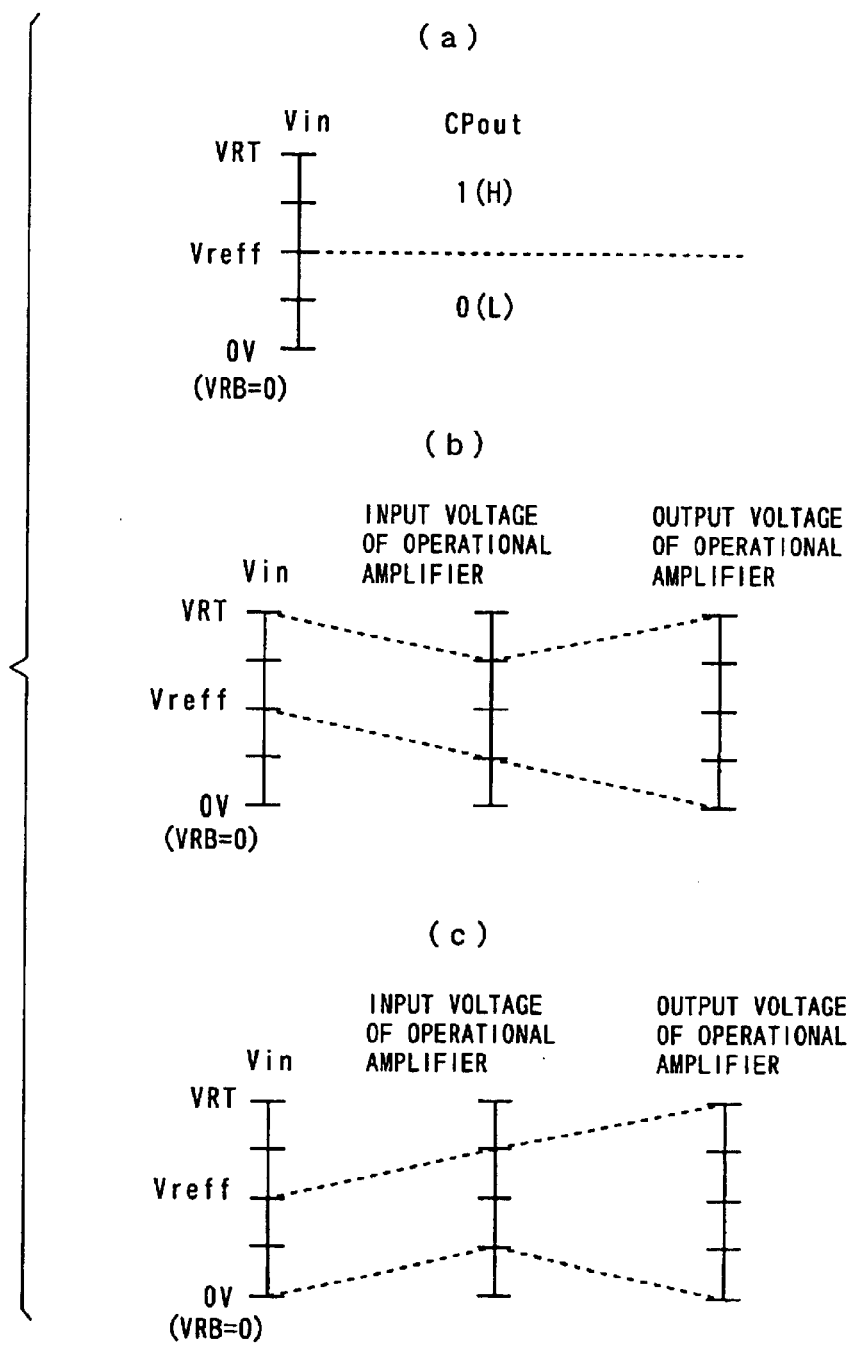
FIG. 26 is a schematic diagram for explaining the operations of an adjustment unit.

FIG. 26 is a schematic diagram for explaining the operations of the adjustment unit 27. In FIG. 26(a), the left axis shows a voltage range of an analog input signal Vin, and the right axis shows the result of comparison by a comparator 25. In FIGS. 26(b) and (c), respectively, the left axis shows a voltage range of the analog input signal Vin allowed for input to the analog-to-digital conversion circuit 1d, the center axis shows an input voltage of the operational amplifier in the sample and hold circuit 26, and the right axis shows an output voltage of the operational amplifier in the sample and hold circuit 26. In FIG. 26, VRT is a first reference voltage, and VRB is a second reference voltage. To the comparator 25, a reference voltage Vreff is applied.

In the present embodiment, the second reference voltage VRB is explained as 0V as an example.

As shown in FIG. 26(a), the comparator 25 compares the analog input signal Vin with the reference voltage Vreff, and outputs a determination signal CPout showing the result of the comparison.

Where the analog input signal Vin is not lower than the reference voltage Vreff, the determination signal CPout from the comparator 25 is "1 (H)". In this case, the adjustment circuit 26 in the sample and hold circuit 26 adjusts the reference voltage of the operational amplifier, for example, such that a voltage obtained by subtracting VRT/4 from the analog input signal Vin is inputted to the operational amplifier, as shown in FIG. 26(b). This reduces the input voltage range of the operational amplifier from VRT/4 to 3VRT/4, which is half of the conventional voltage. The operational amplifier amplifies the input voltage by a factor of two for output. The output voltage range of the operational amplifier is accordingly in the range of 0V to VRT.

Where the analog input signal Vin is lower than the reference voltage Vreff, the determination signal CPout from the comparator 25 is "0 (L)". In this case, the adjustment circuit in the sample and hold circuit 26 adjusts the reference voltage of the operational amplifier, for example, such that a voltage obtained by adding VRT/4 to the analog input signal Vin is inputted to the operational amplifier, as shown in FIG. 26(c). This reduces the input voltage range of the operational amplifier from VRT/4 to 3VRT/4, which is half of the conventional voltage. The operational amplifier amplifies the input voltage by a factor of two for output. The output voltage range of the operational amplifier is accordingly in the range of 0V to VRT, which is half of the conventional voltage.

As explained in the foregoing, the input voltage range of the operational amplifier in the sample and hold circuit 26 is set in the range of VRT/4 to 3VRT/4. Therefore, the output voltage range of the operational amplifier can be reduced, compared to the case where the input voltage range of the operational amplifier is in the range of 0V to VRT. Consequently, linearity between the input voltage and the output voltage can be assured both in the cases of the range of the analog input signal Vin being larger than the conventional range. Furthermore, the voltage required in the analog-to-digital conversion circuit 1d can be reduced so as to realize lowered power consumption.

Where the determination signal CPout from the comparator 25 is "1 (H)", the adjustment circuit in the sub-D/A converter 10a adjusts the reference voltage in the sub-D/A converter 10a such that the range of the digital value corresponding to the reference voltage Vreff to the digital value corresponding to VRT is set in the range of an analog voltage of 0V to VRT.

Where the determination signal CPout from the comparator 25 is "0 (L)", the adjustment circuit in the sub-D/A converter 10a adjusts the reference voltage in the sub-D/A converter 10a such that the range of the digital value corresponding to 0V to the digital value corresponding to the reference voltage Vreff is set in the range of the analog voltage of 0V to VRT.

FIG. 27 is a diagram showing the input/output characteristics of the analog-to-digital conversion circuit 1d shown in FIG. 25. In FIG. 27, the abscissa shows the analog input signal Vin, and the ordinate shows a digital output value Dout.

In FIG. 27, the broken line Tr shows the ideal input/output characteristics of the analog-to-digital conversion circuit 1d, the solid line Er3 shows the input/output characteristics in a case where the operational amplifier in the sample and hold circuit 26 has a gain error, and the solid line Er4 shows the input/output characteristics in a case where an operational amplifier 11 in a first-stage circuit 3 of the analog-to-digital conversion circuit 1d has a gain error.

In a case where the operational amplifier in the sample and hold circuit 26 has a gain error, the digital output value Dout varies discontinuously in an area where the analog input signal Vin is lower than the reference voltage Vreff and in an area where the analog input signal Vin is not lower than the reference voltage Vreff.

As for the interstage gain error due to the gain error of the operational amplifier in the sample and hold circuit 26, the difference between the digital output values Dout when the analog input signal is at the reference voltage Vreff is referred to as a size ES4 of the interstage gain error.

Figure 28:
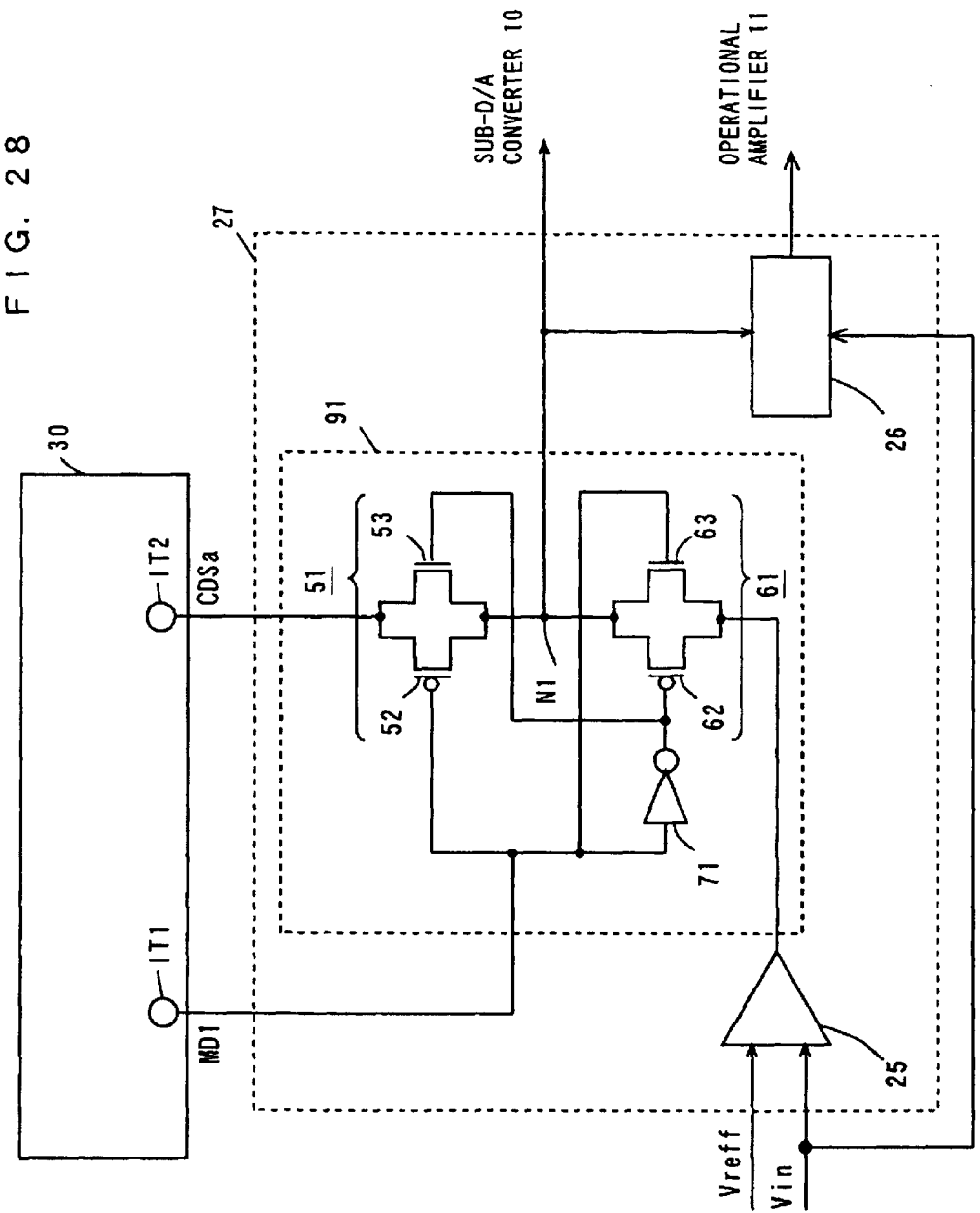
FIG. 28 is a circuit diagram showing the structure of the adjustment unit.

The structure of the adjustment unit 27 will be then described. FIG. 28 is a circuit diagram showing the structure of the adjustment unit 27.

The interstage gain error detection control circuit 30 and the mode switching circuit 91 are connected in the same manner as shown in FIG. 15. The analog input signal Vin is supplied to one input terminal of the comparator 25 and the reference voltage Vreff is supplied to the other input terminal thereof. An output terminal of the comparator 25 is connected to a node N1 through a CMOS switch SW61.

During the normal A/D conversion operation, the interstage gain error detection control circuit 30 turns off a switch SW31 and turns on a switch SW32. Consequently, the analog input signal Vin is inputted to the adjustment unit 27 and the sub-A/D converter 9. A static test mode signal MD1 at a terminal IT1 in the interstage gain error detection control circuit 30 is "1". This turns off the CMOS switch 51 and turns on the CMOS switch SW61. As a result, the output signal at the comparator 25 is outputted from the node N1 to the sample and hold circuit 26 and the sub-D/A converter 10a as a determination signal CPout.

Upon detecting an interstage gain error, the interstage gain error detection control circuit 30 turns on the switch SW31 and turns off the switch SW32. Consequently, the reference voltage Vreff is inputted to the adjustment unit 27 and the sub-A/D converter 9. The static test mode signal MD1 at the terminal IT1 in the interstage gain error detection control circuit 30 is "0". This turns on the CMOS switch SW51, and turns off the CMOS switch SW61. As a result, an external input signal CDSa at a terminal IT2 in the interstage gain error detection control circuit 30 is outputted from the node N1 as a determination output CPout.

The interstage gain error detection control circuit 30 first sets the external input signal CDSa to "0". Consequently, a voltage obtained by adding VRT/4 to the reference voltage Vreff is inputted to the operational amplifier in the sample and hold circuit 26 to be amplified by a factor of two. The digital output value Dout at this time is stored in the memory 15 shown in FIG. 25.

The interstage gain error detection control circuit 30 then sets the external input signal CDSa to "1". Consequently, a voltage obtained by subtracting VRT/4 from the reference voltage Vreff is inputted to the operational amplifier in the sample and hold circuit 26 to be amplified by a factor of two. The digital output value Dout at this time is supplied to a subtracter 16.

The subtracter 16 calculates the differential value between the digital output value Dout obtained when the external input signal CDSa is "1" and the digital output value stored in the memory 15. The differential value calculated by the subtracter 16 corresponds to the size ES4 of the interstage gain error shown in FIG. 27. The differential value calculated by the subtracter 16 is supplied to a correction circuit 17.

The correction circuit 17 stores the size ES4 of the interstage gain error in the memory, and also calculates an equation or coefficients for correcting the interstage gain error based on the size ES4 of the interstage gain error, and stores it (them) in the memory.

During the A/D conversion operation of the analog-to-digital conversion circuit 1d, the correction circuit 17 corrects the digital output value Dout outputted from the output circuit 8 based on the equation or coefficients stored in the memory, and outputs a corrected digital output value Dout.

As described in the foregoing, in the analog-to-digital conversion circuit 1d according to the present embodiment, an interstage gain error due to the gain error of the operational amplifier in the sample and hold circuit 26 can be detected, and the detected interstage gain error is corrected by the correction circuit 17. As a result, it becomes possible to output a digital output value Douta having no interstage gain error.

In the analog-to-digital conversion circuit 1d according to the sixth embodiment, it is not required to make adjustments, such as a tuning design, in order to correct the interstage gain error. Thus, the development cost thereof can be reduced.

Furthermore, in the analog-to-digital conversion circuit 1d according to the sixth embodiment, the interstage gain error can be readily detected or corrected also in a case where the power supply voltage supplied to the differential amplifier in the sample and hold circuit 26 varies, thereby making it possible to readily prevent degraded input/output characteristics.

In the sixth embodiment, the first-stage circuit 3, second-stage circuit 4, third-stage circuit 5, and fourth-stage circuit 5 correspond to a plurality of circuits, the analog-to-digital conversion circuit 1d corresponds to an analog-to-digital conversion circuit, the sub-A/D converter 9 corresponds to an analog-to-digital converter, the sub-D/A converter 10 corresponds to a digital-to-analog converter, the comparators 900 to 915 correspond to comparators, respectively, the operational amplifier 11 corresponds to an operational amplifier, the reference voltage Vreff corresponds to a reference voltage, the analog input signal Vin corresponds to an analog signal, the switches SW31 and SW32 correspond to first switches, respectively, the differential amplifier circuit 14 corresponds to a differential amplifier, the comparator 25 corresponds to a comparator, the sample and hold circuit 26 corresponds to an operational amplifier and adjustment circuit, the interstage gain error detection control circuit 30 corresponds to a signal generation circuit, the mode switching circuit 91 corresponds to a second switch, the normal range OR corresponds to a normal range, the redundant ranges eR1 and eR2 correspond to redundant ranges, respectively, the subtracter 16 corresponds to a subtracter, and the correction circuit 17 corresponds to a correction circuit.

Seventh Embodiment

Figure 29:
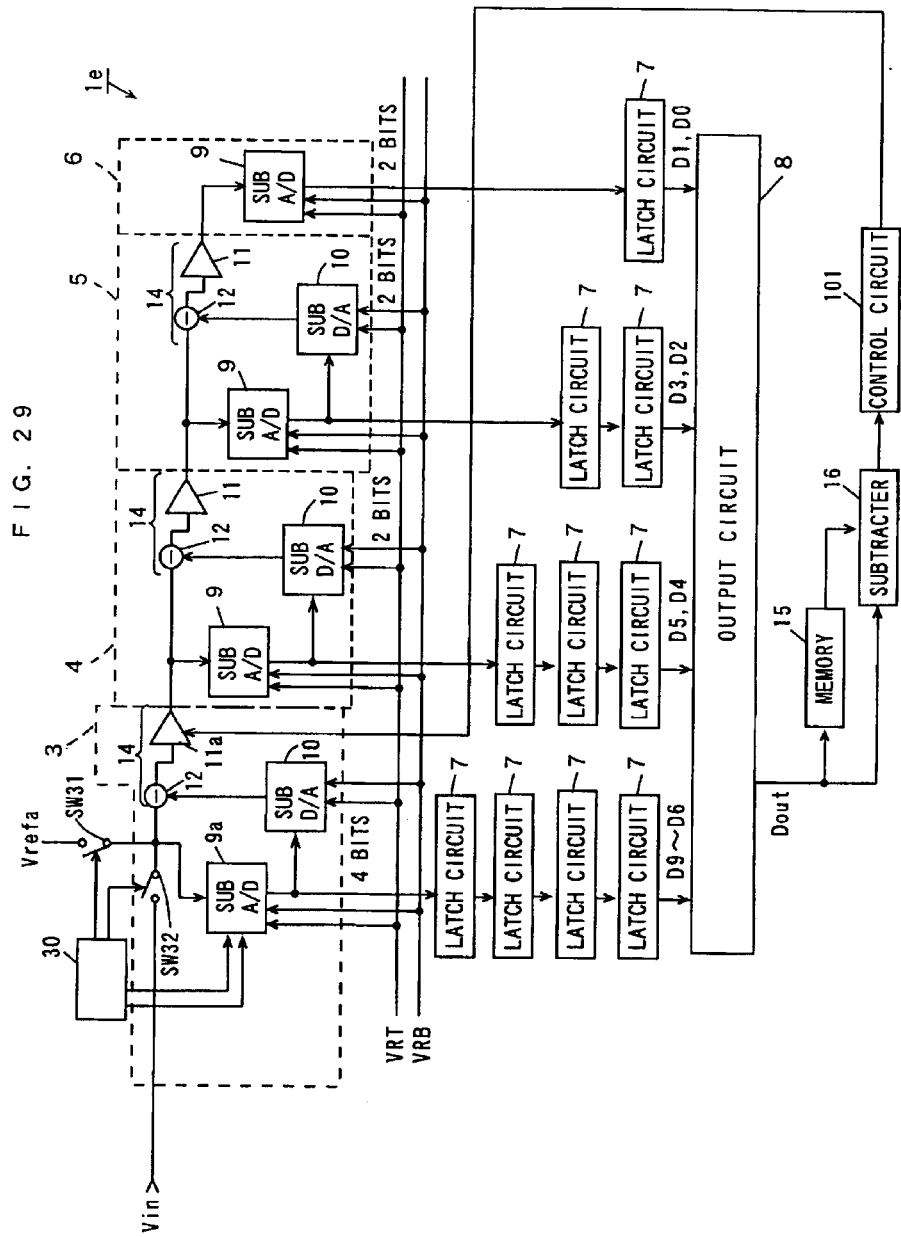
FIG. 29 is a block diagram showing the structure of an analog-to-digital conversion circuit having a multi-stage pipeline structure according to a seventh embodiment of the present invention.

FIG. 29 is a block diagram showing the structure of an analog-to-digital conversion circuit having a multi-stage pipeline structure according to a seventh embodiment of the present invention.

The structure of the analog-to-digital conversion circuit 1e shown in FIG. 29 differs from the analog-to-digital conversion circuit 1 in the following points.

In FIG. 20, a control circuit 101 is provided in place of the correction circuit 17, and an operational amplifier circuit 11a is provided in place of the operational amplifier circuit 11 in the first-stage circuit 3. The control circuit 101 corrects the interstage gain error by changing the amplification rate of the operational amplifier circuit 11a according to the value of an interstage gain error outputted from the subtractor 16.

FIG. 30 is a circuit diagram showing one example of the structure of the operational amplifier circuit 11a shown in FIG. 29.

The operational amplifier circuit 11a shown in FIG. 30 includes an operational amplifier 110, capacitors 200, 201, 202, 203, 204, and switches SW101, SW102, SW103.

The capacitor 200 has a capacitance of 400C, the capacitor 201 has a capacitance of 96C, the capacitor 202 has a capacitance of 1C, the capacitor 203 has a capacitance of 2C, and the capacitor 204 has a capacitance of 4C.

A serial circuit of the capacitor 201, a serial circuit of the capacitor 202 and switch SW101, a serial circuit of the capacitor 203 and switch SW102, and a serial circuit of the capacitor 204 and switch SW103 are connected between an inverted input terminal and output terminal of the operational amplifier 110. To the inverted input terminal at the operational amplifier 110, the capacitor 200 is connected. A non-inverted input signal at the operational amplifier 110 is grounded.

The control circuit 101 selectively turns on or off the switches SW101 to SW103 according to the value of the interstage gain error outputted from the subtractor 16, such that the amplification rate of the operational amplifier circuit 11a can be switched up to eight stages by 1%.

In a case where the control circuit 101 turns off all of the switches SW101 to SW103, for example, the gain of the operational amplifier circuit 11a is 400C/96C= approximately 4.16 (approximately 4%). In a case where the control circuit 101 turns on the switch SW101 and turns off the switches SW102, SW103, the gain of the operational amplifier circuit 11a is 400C/97C=approximately 4.12 (approximately 3%). In a case where the control circuit 101 turns on all of the switches SW101 to SW103, the gain of the operational amplfier circuit 11a is 400C/104C= approximately 3.84 (approximately −4%). As a result, the interstage gain error can be corrected.

Interstage gain error correction operation of the control circuit 101 may be repeatedly carried out, so as to reduce the interstage gain error to its minimum value.

While in the present embodiment, the interstage gain error is corrected by adjusting the amplification rate of the operational amplifier 11 in the operational amplifier circuit 14 using the control circuit 101, this invention is not limited to the method above, and the interstage gain error may be corrected, for example with the control circuit 101 adjusting the reference voltage of the sub-A/D converter 9 in the second-stage circuit 4 according to the interstage gain error.

Redundancy Correction

In the analog-to-digital conversion circuit 1 according to the above-described second embodiment, each of the voltage ranges of the sub-A/D converters 9 in the second- and third-stage circuits 4 and 5 has redundant ranges over and under its normal range in consideration of the case where the output voltages in the respective first- and second-stage circuits 3 and 4 deviate from the normal ranges of the sub-A/D converters 9 in the respective second- and third-stage circuits 4 and 5.

In this case, the sub-A/D converter 9 in each of the second- and third-stage circuits 4 and 5 has one redundant bit corresponding to the redundant ranges, in addition to a 2-bit digital signal D5, D4. In other words, the sub-A/D converter 9 in each of the second- and third-stage circuits 4 and 5 has a 3-bit configuration with the inclusion of the redundant bit.

Figure 31:
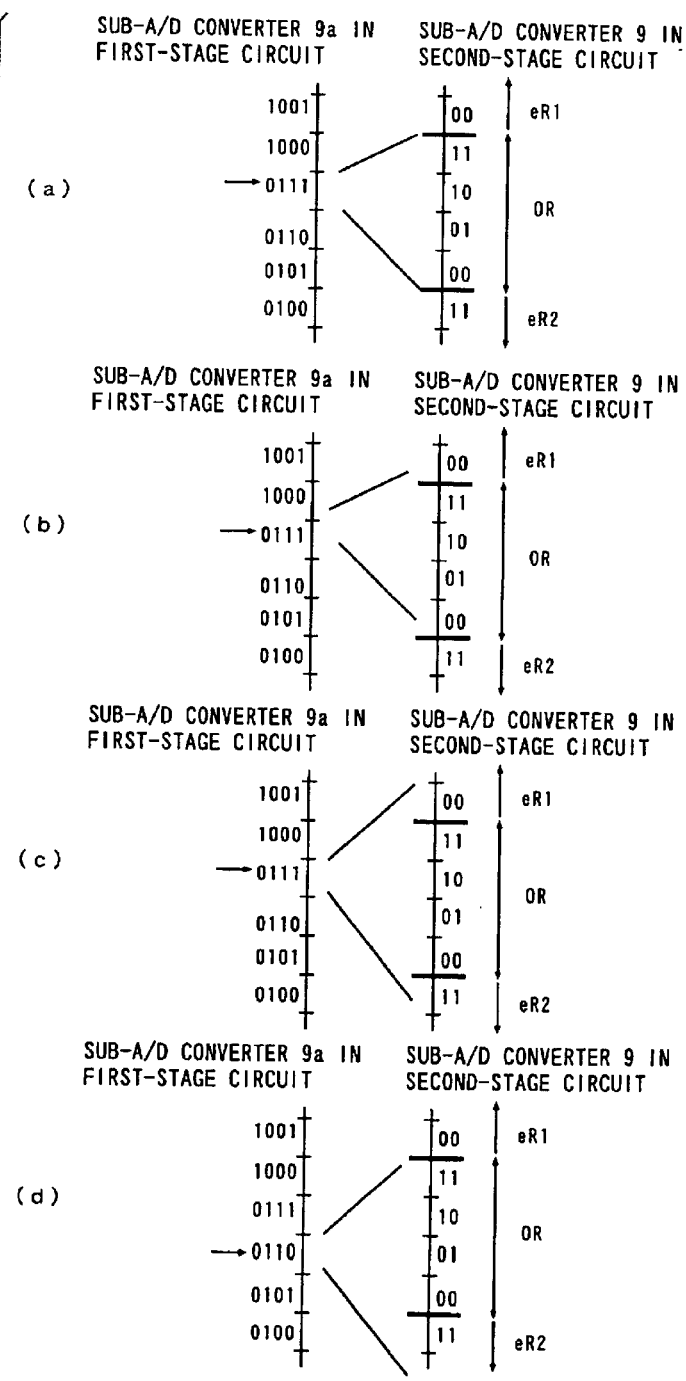
FIG. 31 is a diagram for use in illustration of the respective voltage ranges of the sub-A/D converters in first- and second-stage circuits 3 and 4 in the analog-to-digital conversion circuit.

FIG. 31 is a diagram for use in illustration of the voltage ranges of the sub-A/D converters 9a and 9 in the first- and second-stage circuits 3 and 4, respectively. At the left sides of FIGS. 31(a) to (d), respectively, the relationship between the voltage range of the sub-A/D converter 9a in the first-stage circuit 3 and the values of the digital signal is shown. At the right sides of FIGS. 31(a) to (d), the relationship between part of the voltage range of the sub-A/D converter 9 in the second-stage circuit 4 and the values of the digital signal is shown.

The sub-A/D converter 9 in the second-stage circuit 4 has redundant ranges eR1 and eR2 represented by the redundant bits over and under the normal range (ideal range) OR, respectively. There are eight digital values, each represented by 3 bits in total, i.e., the digital value D5, D4 (normal bits) and the redundant bit. Intermediate four digital values among the eight digital values are allotted to the normal range (ideal range) OR, and two of the digital values are allotted to each of the redundant ranges eR1, eR2 over and under OR.

In the case of normal operations of the first-stage circuit 3, as shown in FIG. 31(a), the output voltage of the operational amplifier 11 in the first-stage circuit lies within the normal range OR of the sub-A/D converter 9 in the second-stage circuit 4.

In the example of FIG. 31(b), with the operational amplifier 11 in the first-stage circuit having an input offset, part of the output voltage in the operational amplifier 11 deviates from the normal range OR of the sub-A/D converter 9 in the second-stage circuit 4, lying within the redundant range eR1.

In the example of FIG. 31(c), with the operational amplifier 11 in the first stage having a gain error, part of the output voltage in the operational amplifier 11 deviates from the normal range OR of the sub-A/D converter 9 in the second-stage circuit 4, lying within the redundant ranges eR1 and eR2.

In the example of FIG. 31(d), with a malfunction of the sub-A/D converter 9a in the first-stage circuit 3, part of the output voltage in the operational amplifier 11 in the first stage deviates from the normal range OR of the sub-A/D converter 9 in the second-stage circuit 4, lying within the redundant range eR2.

Where the output voltage in the operational amplifier 11 in the first stage is within the redundant ranges eR1 and eR2 of the sub-A/D converter 9 in the second-stage circuit 4, the value of the digital signals D9 to D6 outputted from the sub-A/D converter 9a in the first-stage circuit 3 and the value of the digital signal D5 to D4 outputted from the sub-A/D converter 9 in the second stage are corrected.

For example, where the value of the digital signal D9 to D6 outputted from the sub-A/D converter 9a in the first-stage circuit 3 is "0111", and the output voltage of the operational amplifier 11 lies within the redundant range eR2 of the sub-A/D converter 9 in the second-stage circuit 4, the value of the digital signal D9 to D6 is corrected to "0110", and the value of the digital signal D5 and D4 from the sub-A/D converter 9a in the second-stage circuit 3 is corrected to "11".

In this manner, output of an erroneous digital signal D9 to D4 can be avoided in the presence of the redundant ranges eR1 and eR2, even when the output voltage in the operational amplifier 11 in the first-stage circuit 3 deviates from the normal range OR of the sub-A/D converter 9 in the second-stage circuit 4.

Figure 32:
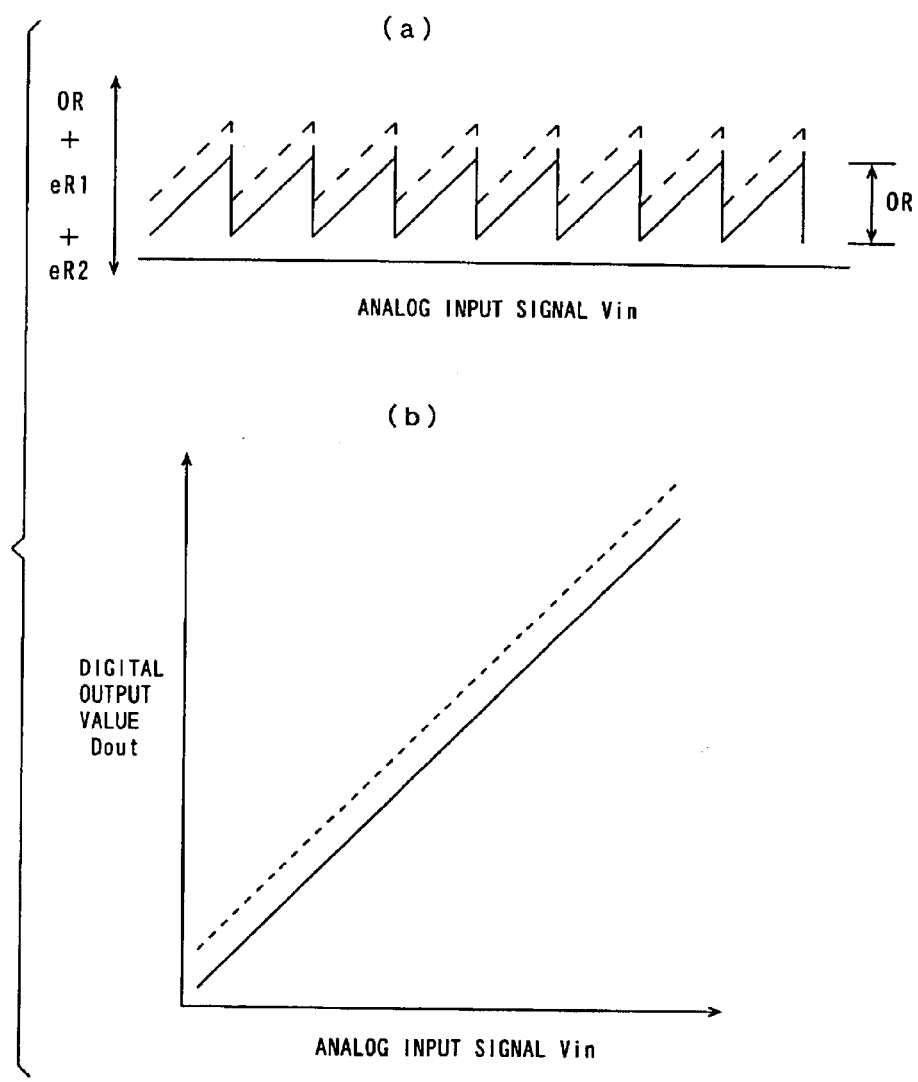

FIG. 32(a) is a diagram showing the output voltage of the operational amplifier 11 in a case where the operational amplifier 11 in the first-stage circuit 3 has an input offset, and FIG. 32(b) is a diagram showing the input/output characteristics of the analog-to-digital conversion circuit 1 in a case where the operational amplifier 11 in the first-stage circuit 3 has an input offset.

In FIG. 32(a), the solid line shows the output voltage in a case where the operational amplifier 11 in the first-stage circuit 3 does not have an input offset, and the broken line shows the output voltage of the operational amplifier 11 in a case where the operational amplifier 11 in the first-stage circuit 3 has an input offset. In FIG. 32(b), the solid line shows the input/output characteristics of the analog-to-digital conversion circuit 1 in a case where the operational amplifier 11 in the first-stage circuit 3 does not have an input offset, and the broken line shows the input/output characteristics of the analog-to-digital conversion circuit 1 in a case where the operational amplifier 11 in the first-stage circuit 3 has an input offset.

As shown in FIG. 32(a), with the operational amplifier 11 in the first-stage circuit 3 having an input offset, the output voltage of the operational amplifier 11 deviates from the normal range OR of the sub-A/D converter 9 in the second-stage circuit 4. In this case, the occurrence of a miscode (i.e., an erroneous digital value) can be avoided by providing the redundant ranges eR1 and eR2. As shown in FIG. 32(b), the input/output characteristics of the analog-to-digital conversion circuit 1 generally have an offset while maintaining linearity.

Figure 33:
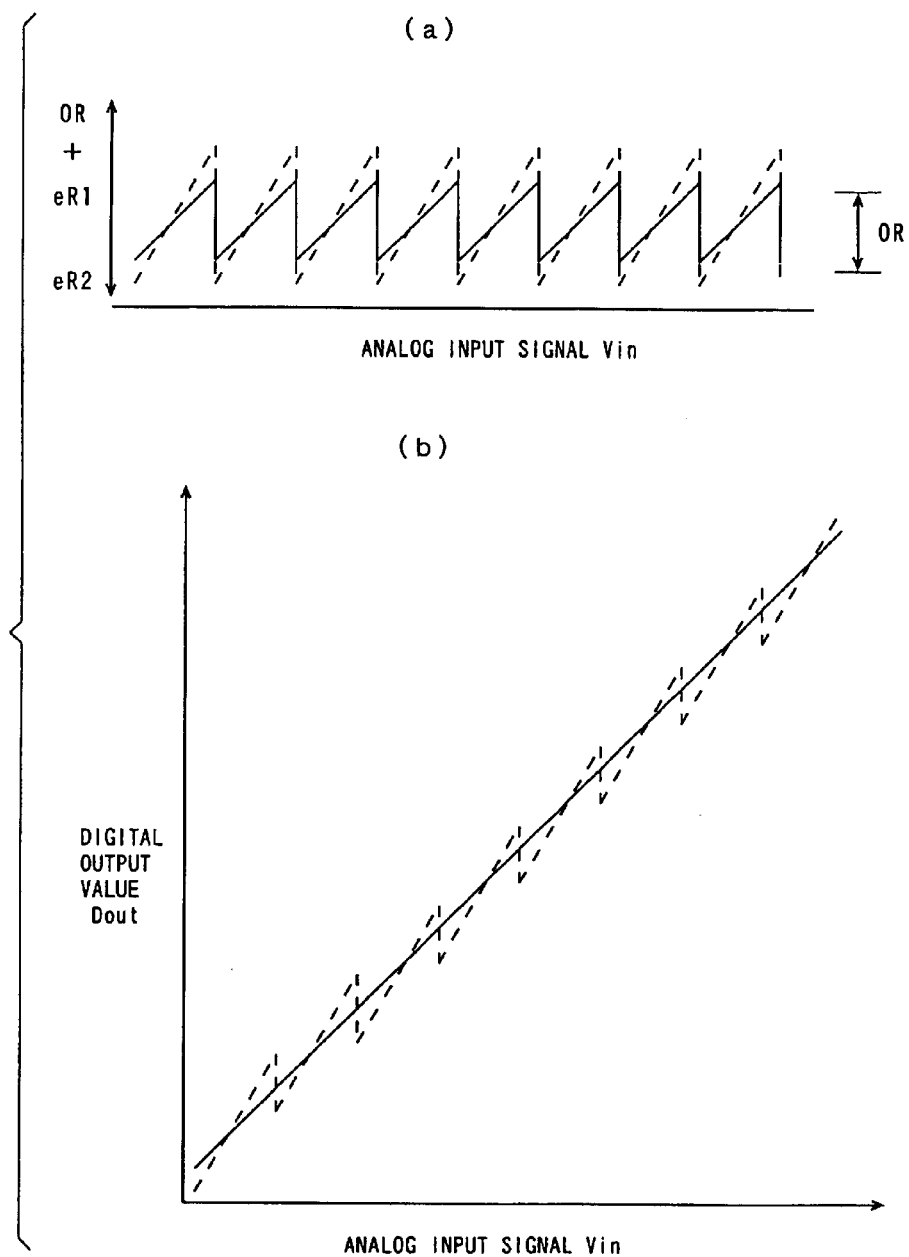

FIG. 33(a) is a diagram showing the output voltage of the operational amplifier 11 in a case where the operational amplifier 11 in the first-stage circuit 3 has a gain error, and FIG. 33(b) is a diagram showing the input/output characteristics of the analog-to-digital conversion circuit 1 in a case where the operational amplifier 11 in the first-stage circuit 3 has a gain error.

In FIG. 33(a), the solid line shows the output voltage of the operational amplifier 11 in a case where the operational amplifier 11 in the first-stage circuit 3 does not have a gain error, and the broken line shows the output voltage of the operational amplifier 11 in a case where the operational amplifier 11 in the first-stage circuit 3 has a gain error.

In FIG. 33(b), the solid line shows the input/output characteristics of the analog-to-digital conversion circuit 1 in a case where the operational amplifier 11 in the first-stage circuit 3 does not have a gain error, and the broken line shows the input/output characteristics of the analog-to-digital conversion circuit 1 in a case where the operational amplifier 11 in the first-stage circuit 3 has a gain error.

As shown in FIG. 33(a), with the operational amplifier 11 in the first-stage circuit 3 having a gain error, the output voltage of the operational amplifier 11 deviates from the normal range OR of the sub-A/D converter 9 in the second-stage circuit 4. In this case, the occurrence of a miscode can be avoided by providing the redundant ranges eR1 and eR2. Although an interstage gain error occurs in the input/output characteristics of the analog-to-digital conversion circuit 1 as shown in FIG. 33(b), the boundaries of the input/output characteristics of the respective stages are connected with one another.

Figure 34:
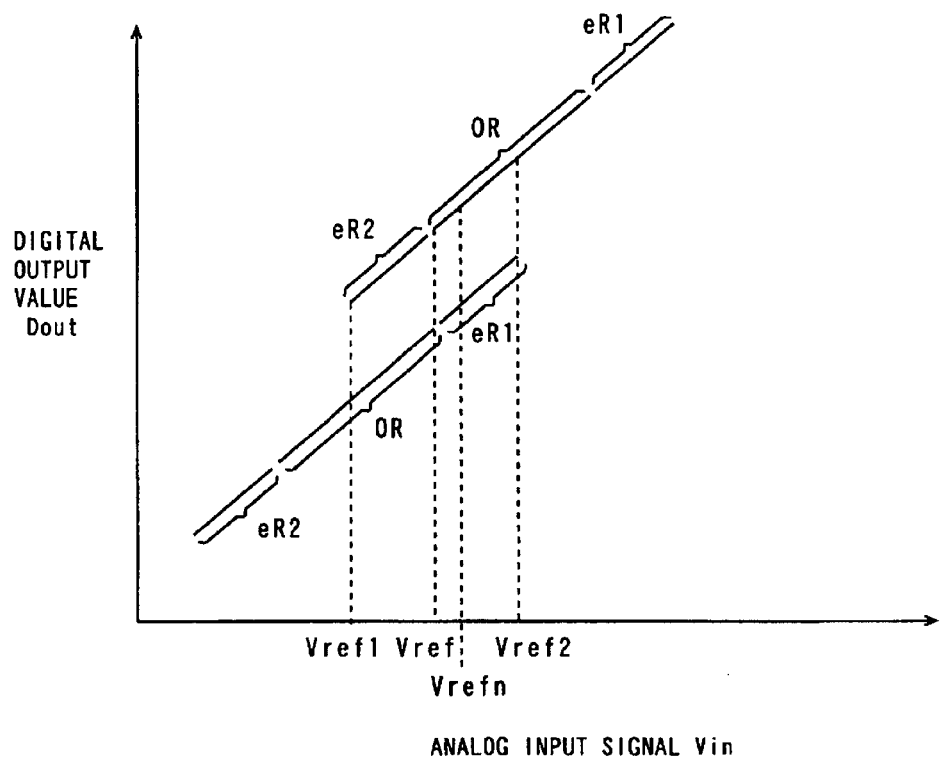
FIG. 34 is a diagram showing the input/output characteristics of an analog-to-digital conversion circuit 1 in a case where a sub-A/D converter in the second-stage circuit has redundant ranges.
Figure 35:
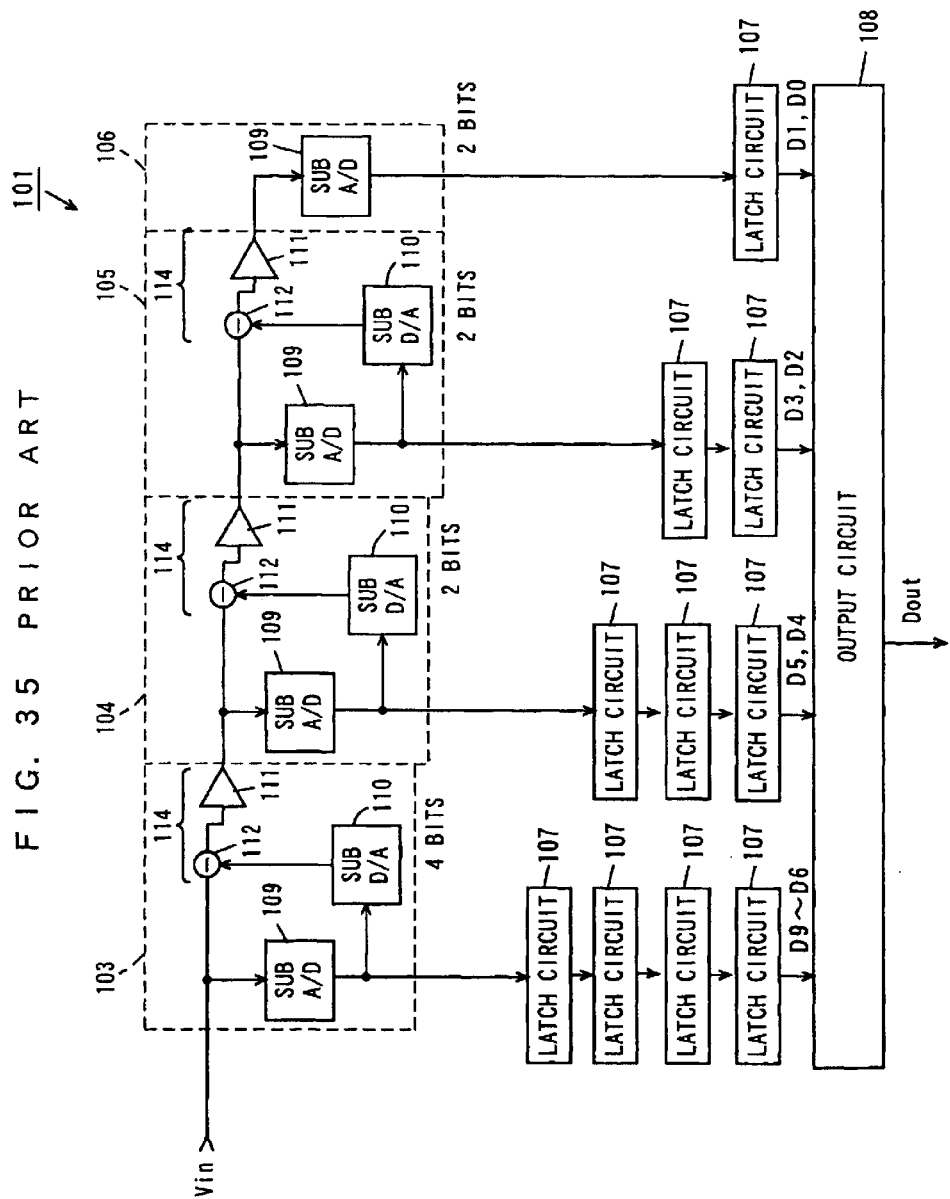
FIG. 35 is a block diagram showing the structure of an analog-to-digital conversion circuit having a conventional multi-stage pipeline structure.
Figure 36:
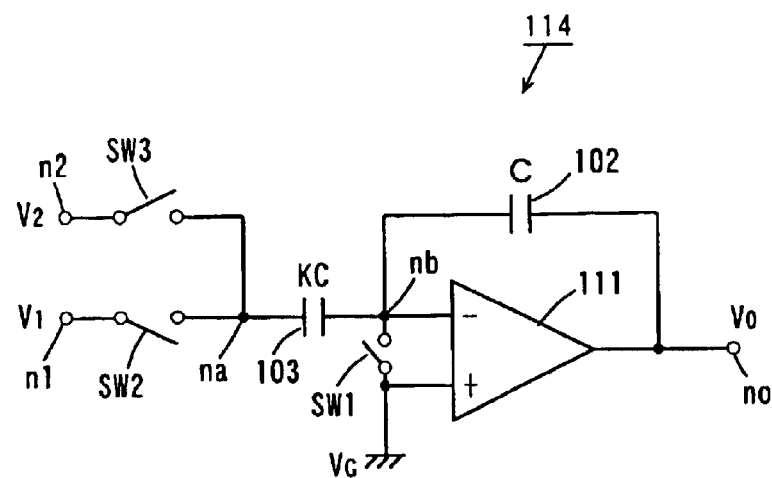
FIG. 36 is a circuit diagram showing an example of the differential amplifier circuit shown in FIG. 35.
Figure 37:
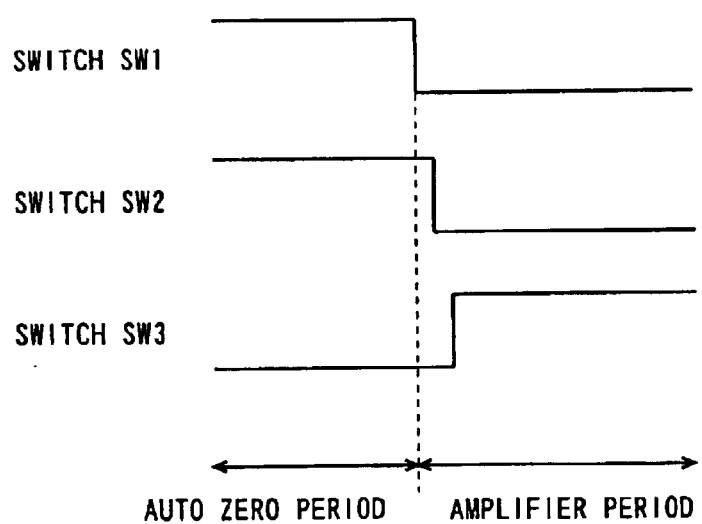
FIG. 37 is a diagram for explaining the operation of the differential amplifier circuit shown in FIG. 36
Figure 38:
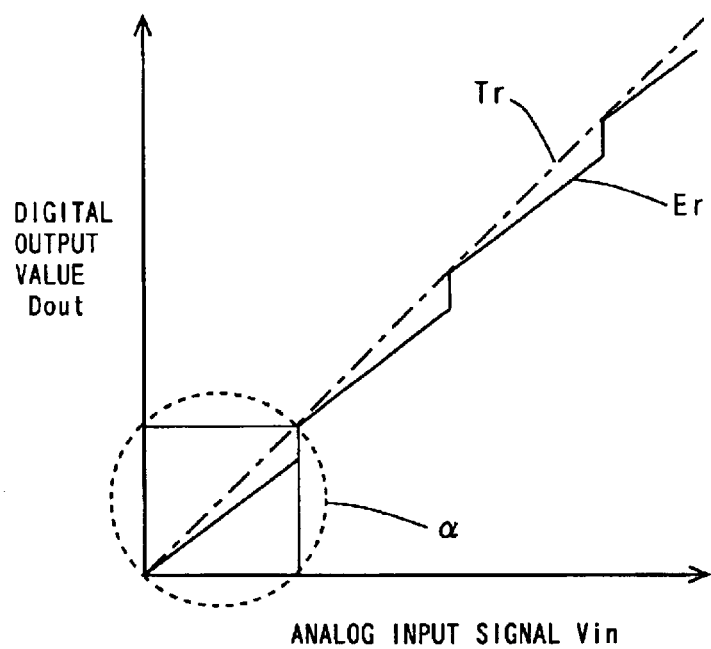
FIG. 38 is a diagram showing the input/output characteristics of the analog-to-digital conversion circuit shown in FIG. 35.
Figure 39:
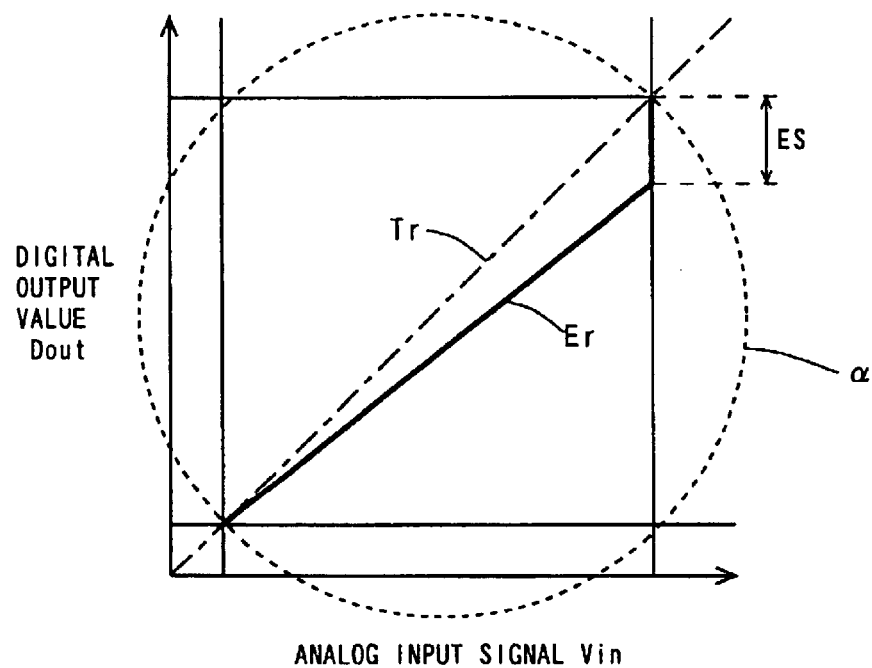
FIG. 39 is an enlarged diagram of α part of the input/output characteristics shown in FIG. 38.
Figure 40:
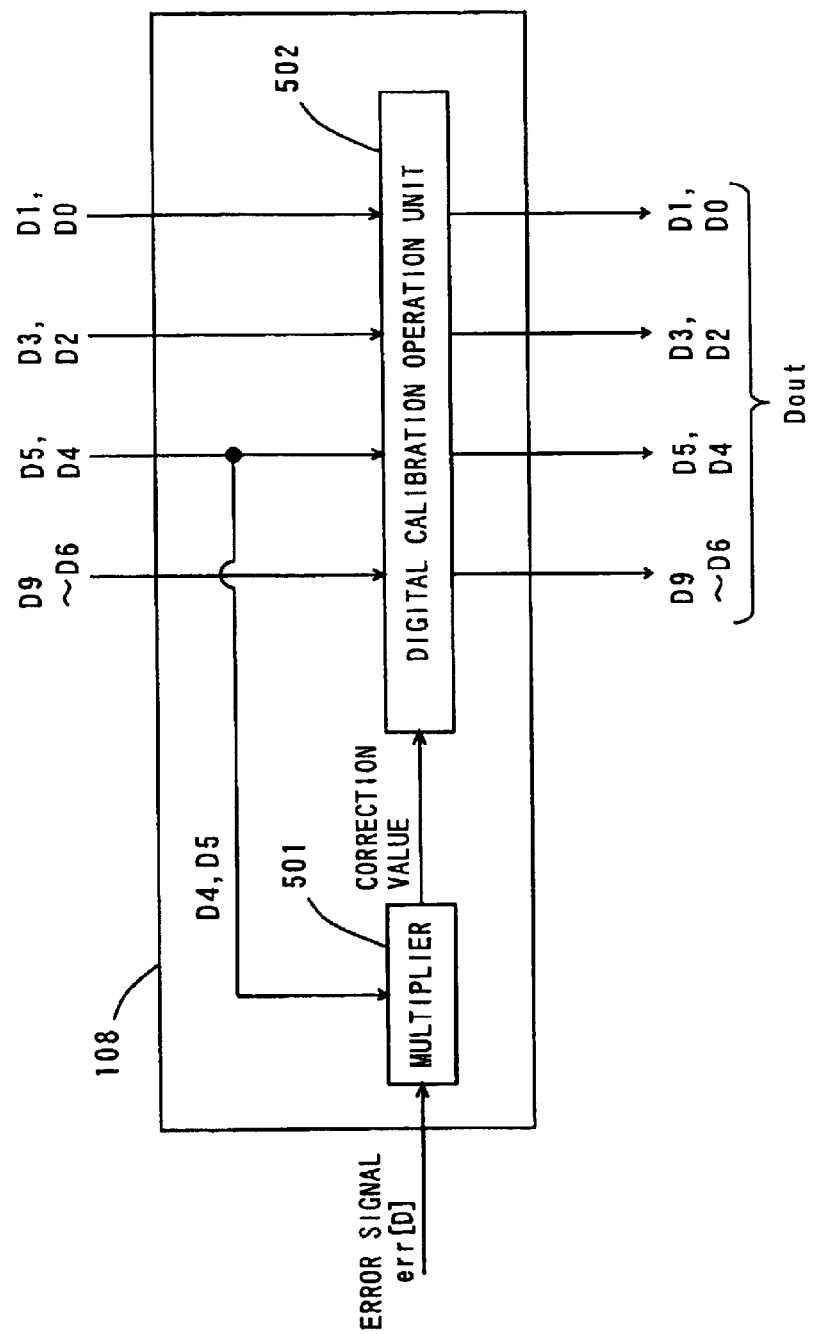
FIG. 40 is a block diagram showing one example of the structure of the output circuit shown in FIG. 40.
Figure 41:
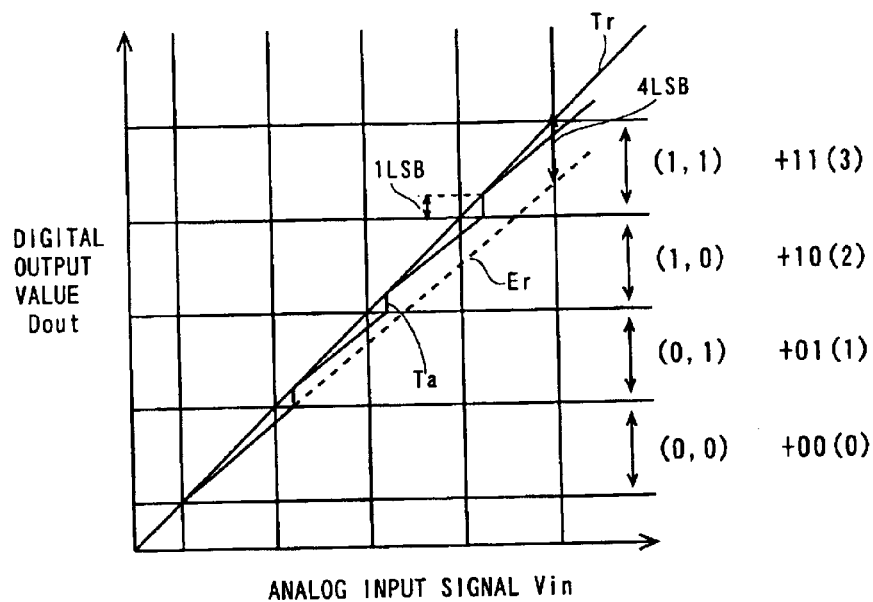
FIG. 41 is a diagram showing one example of the interstage gain error correction in the output circuit shown in FIG. 40.
Figure 42:
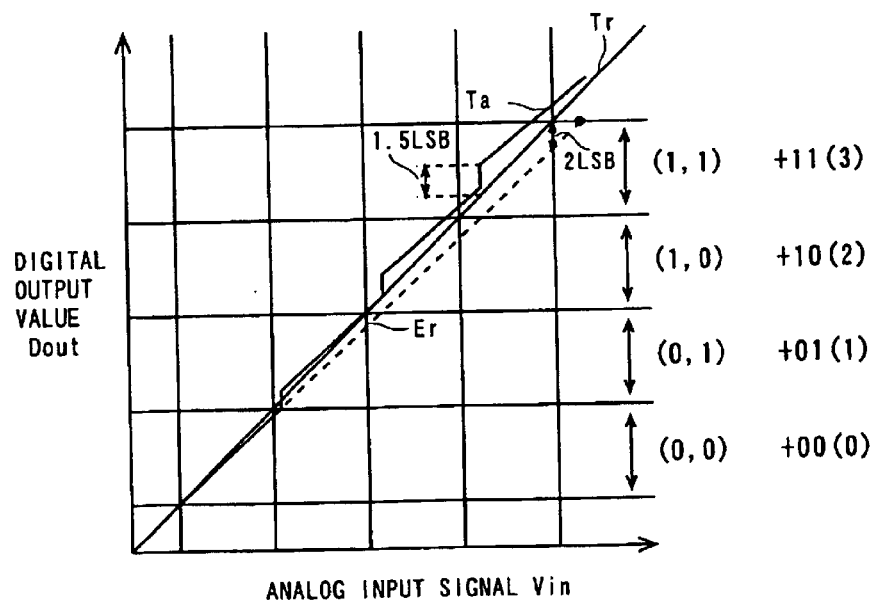
FIG. 42 is a diagram showing still another example of the interstage gain error correction in the output circuit shown in FIG. 40.

FIG. 34 is a diagram showing the input/output characteristics of the analog-to-digital conversion circuit 1 in a case where the sub-A/D converter 9 in the second-stage circuit 4 has redundant ranges.

In FIG. 34, a reference voltage Vref is either one of the reference voltages generated by the reference resistances R1 to R15 shown in FIG. 15. As described in the foregoing, where the sub-A/D converter 9 in the second-stage circuit 4 has the redundant ranges eR1 and eR2, there exists an area where the normal range OR and each of the redundant ranges eR1 and eR2 overlap in the input/output characteristics (hereinafter referred to as an overlap area). In the example of FIG. 34, the overlap area is defined in the range of a voltage Vref1, i.e., a lower limit of the redundant range eR2, to a voltage Vref2, i.e., an upper limit of the redundant range eR1.

In this case, during the detection of an interstage gain error, an arbitrary voltage in the overlap area can be supplied to the differential amplifier 14 and the sub-A/D converter 9a in place of the reference voltage Vref. In other words, during the detection of an interstage gain error, the arbitrary voltage Vrefn in the overlap area is supplied to the switch SW31 shown in FIG. 12 in place of the reference voltage Vrefa, thereby making it possible to detect the size of the interstage gain error.

In this case, too, the differential value between the digital output value Dout obtained when the external input signal CDSa is "0" and the digital output value Dout obtained when the external input signal CDSa is "1" corresponds to the size of the interstage gain error.

Similarly in the analog-to-digital conversion circuit 1a according to the third embodiment, during the detection of an interstage gain error, arbitrary voltages in the overlap area are supplied to the differential amplifier circuit 14 and the sub-A/D converter 9b in place of the reference voltages Vrefa and Vrefb through the switches SW31 and SW33, thereby making it possible to detect the size of the interstage gain error.

Similarly in the analog-to-digital conversion circuit 1b according to the fourth embodiment, too, during the detection of an interstage gain error, arbitrary voltages in the overlap area are supplied to the differential amplifier circuit 14 and the sub-A/D converters 9a and 9c in place of the reference voltages Vrefa, Vrefc, and Vrefd through the switches SW31, SW41, and SW51, thereby making it possible to detect the size of the interstage gain error.

Similarly in the analog-to-digital conversion circuit 1c in the fifth embodiment, too, during the detection of an interstage gain error, an arbitrary voltage in the overlap area is supplied to the input node N1 in place of the reference voltage Vrefe through the switch SW71, thereby making it possible to detect the size of the interstage gain error.

Similarly in the analog-to-digital conversion circuit 1d according to the sixth embodiment, too, during the detection of an interstage gain error, an arbitrary voltage in the overlap area is supplied to the comparator 25 and sample and hold circuit 26 in place of the reference voltage Vreff through the switch SW31, thereby making it possible to detect the size of the interstage gain error.

Similarly in the analog-to-digital conversion circuit 1e according to the seventh embodiment, too, during the detection of an interstage gain error, an arbitrary voltage in the overlap area is supplied to the differential amplifier circuit 14 and sub-A/D converter 9b in place of the reference voltage Vrefa through the switches SW31, SW33, thereby making it possible to detect the size of the interstage gain error.

While in the above-described first to sixth embodiments, the switches SW31, SW32, SW33, SW41, SW42, SW51, SW52, SW61, SW62, SW71, SW11, and SW12 are, for example, composed of CMOS switches, they can also be composed of various other switching devices, such as field effect transistors, bipolar transistors, and so on, without being limited to the ones employed herein.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An analog-to-digital conversion circuit having a multi-stage pipeline structure composed of a plurality of stages of circuits for converting an analog input signal to a digital output value, wherein each of the stages of circuits except the final stage includes:

an analog-to-digital converter that converts an inputted analog signal into a digital signal;

a digital-to-analog converter that converts the digital signal outputted from said analog-to-digital converter into an analog signal; and a differential amplifier circuit that amplifies the difference between the inputted analog signal and the analog signal outputted from said digital-to-analog converter, digital signals outputted from the analog-to-digital converters in said plurality of stages of circuits constituting said digital output value, a correction value for correcting an error of said digital output value due to a gain error of said differential amplifier circuit in at least one stage of circuit of said plurality of stages being preset for each value of the digital signal outputted from said analog-to-digital converter in a subsequent stage of circuit, said analog-to-digital conversion circuit comprising:

a correction value output circuit that outputs a corresponding correction value based on the digital signal outputted from said analog-to-digital converter in said subsequent stage of circuit; and a correction circuit that corrects said digital output value based on the correction value outputted from said correction value output circuit.

2. The analog-to-digital conversion circuit according to claim 1, wherein said correction value output circuit includes:

a storage circuit that stores a correction value for each value of the digital signal outputted from said analog-to-digital converters in said subsequent stage of circuit; and a selection circuit that selects a corresponding correction value among said correction values stored in said storage circuit based on the digital signal outputted from said analog-to-digital converter in said subsequent stage of circuit for output.

3. The analog-to-digital conversion circuit according to claim 2, wherein said storage circuit stores a plurality of groups of correction values each group of correction values being set for each value of the digital signal outputted from said analog-to-digital converter in said subsequent stage of circuit, and said selection circuit selects a corresponding correction value among said correction values stored in said storage circuit based on a predetermined control signal and the digital signal outputted from said analog-to-digital converter in said subsequent stage of circuit for output.

4. The analog-to-digital conversion circuit according to claim 3, further comprising:

an error detector that detects an error of said digital output value due to the gain error of said differential amplifier circuit in said one stage of circuit; and a control signal generator that generates said control signal based on the error detected by said error detector.

5. The analog-to-digital conversion circuit according to claim 3, further comprising:

a control signal holder that holds said control signal preset based on an error of said digital output value due to the gain error of said differential amplifier circuit in said one stage of circuit.

6. The analog-to-digital conversion circuit according to claim 1, wherein said one stage of circuit is an initial stage of circuit.

7. An analog-to-digital conversion circuit having a multi-stage pipeline structure composed of a plurality of stages for converting an analog signal into a digital output value, wherein at least one stage of circuit of said plurality of stages of circuits comprises:

a comparator that compares an inputted analog signal with a reference voltage;

an operational amplifier that operates in response to an output signal from said comparator; and a first switch that selectively inputs a reference voltage equivalent to said reference voltage and said analog signal, said analog-to-digital conversion circuit correcting an interstage gain error using the digital output value obtained when said equivalent reference voltage is inputted.

8. An analog-to-digital conversion circuit having a multi-stage pipeline structure composed of a plurality of stages for converting an analog signal into a digital output value, wherein at least one stage of circuit of said plurality of stages of circuits comprises:

a comparator that compares an inputted analog signal with a reference voltage;

an operational amplifier that operates in response to an output signal from said comparator;

a first switch that selectively inputs a reference voltage equivalent to said reference voltage and said analog signal; and a signal generation circuit that generates a first signal having a first logic value and a second signal having a second logic value, said operational amplifier operating in response to the first signal and second signal generated by said signal generation circuit when said equivalent reference voltage is inputted to said comparator by said first switch.

9. An analog-to-digital conversion circuit having a multi-stage pipeline structure composed of a plurality of stages for converting an analog signal into a digital output value, wherein each of the stages of circuits except the final stage comprises:

an analog-to-digital converter that converts an inputted analog signal into a digital signal;

a digital-to-analog converter that converts the digital signal outputted from said analog-to-digital converter into an analog signal; and a differential amplifier that amplifies the difference between the inputted analog signal and the analog signal outputted from said digital-to-analog converter, said analog-to-digital converter including:

a plurality of comparators that compare said inputted analog signal with a plurality of reference voltages respectively; and an encoder that encodes output signals from said plurality of comparators to generate a digital signal, at least one stage of circuit of said plurality of stages of circuits including:

a first switch that selectively inputs an analog signal supplied from an external source or preceding stage of circuit and a reference voltage equivalent to the reference voltage supplied to at least one comparator of said plurality of comparators;

a signal generation circuit that generates a first signal having a first logic value and a second signal having a second logic value; and a second switch that supplies output signals from said digital-to-analog converter corresponding to the first signal and second signal generated by said signal generation circuit to said differential amplifier when said equivalent reference voltage is inputted by said first switch.

10. The analog-to-digital conversion circuit according to claim 9, wherein the voltage range in the stage of circuit subsequent to said at least one stage of circuit includes a normal range and a redundant range, and said equivalent reference voltage is an arbitrary voltage within an area where said normal range including a reference voltage supplied to said at least one comparator and said redundant range overlap with each other.

11. The analog-to-digital conversion circuit according to claim 9, further comprising a subtracter that calculates the difference between the digital output value obtained when said first signal is supplied to said encoder and the digital output value obtained when said second signal is supplied to said encoder.

12. The analog-to-digital conversion circuit according to claim 11, further comprising a correction circuit that corrects the digital output value based on an output signal from said subtracter.

13. The analog-to-digital conversion circuit according to claim 9, wherein said first switch selectively inputs an analog signal supplied from an external source or preceding stage of circuit and a plurality of reference voltages equivalent to the plurality of reference voltages supplied respectively to a plurality of comparators among said plurality of comparators, and said second switch supplies the first signal and second signal generated by said signal generation circuit to said encoder in place of the output signal from the corresponding comparator when any of said plurality of equivalent reference voltages is inputted by said first switch.

14. The analog-to-digital conversion circuit according to claim 9, wherein said at least one stage of circuit includes a plurality of stages of circuits, and each of said plurality of stages of circuits includes:

a first switch that selectively inputs an analog signal supplied from an external source or preceding stage of circuit and a reference voltage equivalent to the reference voltage supplied to at least one comparator of said plurality of comparators;

a signal generation circuit that generates a first signal having a first logic value and a second signal having a second logic value; and a second switch that sequentially supplies the first signal and second signal generated by said signal generation circuit to said encoder in place of the output signal from said at least one comparator, when said equivalent reference voltage is inputted by said first switch.

15. An analog-to-digital conversion circuit comprising:

a first circuit having a first and second nodes;

a selector that selectively supplies one of an inputted analog signal and an analog signal at said second node to said first node; and a control device that controls said first switch, wherein said first circuit includes:

an analog-to-digital converter that converts the analog signal from said first node into a digital signal;

a digital-to-analog converter that converts the digital signal outputted from said analog-to-digital converter into an analog signal; and a differential amplifier that amplifies the difference between the analog signal from said first node and the analog signal outputted from said digital-to-analog converter and outputs the amplified difference to said second node, said control device controls said selector such that conversion operation of said analog-to-digital converter, conversion operation of said digital-to-analog converter, and amplifying operation of said differential amplifier are carried out a predetermined number of cycles after the inputted analog signal is supplied to said first node, said analog-to-digital converter includes:

a plurality of comparators that compare said inputted analog signal with a plurality of reference voltages respectively; and an encoder that encodes output signals from said plurality of comparators to generate a digital signal, said first circuit includes:

a first switch that selectively inputs an analog signal supplied from an external source or preceding stage of circuit and a reference voltage equivalent to the reference voltage supplied to at least one comparator of said plurality of comparators;

a signal generation circuit that generates a first signal having a first logic value and a second signal having a second logic value; and a second switch that supplies the output signals from said digital-to-analog converter corresponding to the first signal and second signal generated by said signal generation circuit to said differential amplifier when said equivalent reference voltage is inputted by said first switch.

16. The analog-to-digital conversion circuit according to claim 15, wherein the voltage range in said first circuit includes a normal range and a redundant range, and said equivalent reference voltage is an arbitrary voltage within an area where said normal range including the reference voltage supplied to said at least one comparator and said redundant range overlap with each other.

17. The analog-to-digital conversion circuit according to claim 15, further comprising a subtracter that calculates the difference between the digital output value obtained when said first signal is supplied to said encoder and the digital output value obtained when said second signal is supplied to said encoder.

18. The analog-to-digital conversion circuit according to claim 17, further comprising a correction circuit that corrects the digital output value based on an output signal from said subtracter.

19. An analog-to-digital conversion circuit having a multi-pipeline structure composed of a plurality of stages of circuits for converting an analog signal to a digital output value, wherein at least one stage of circuit of said plurality of stages of circuits includes:

an analog-to-digital converter that converts an inputted analog signal into a digital signal;

a digital-to-analog converter that converts the digital signal outputted from said analog-to-digital converter into an analog signal;

an operational amplifier that amplifies the inputted analog signal;

a differential amplifier that amplifies the difference between the analog signal outputted from said operational amplifier and the analog signal outputted from said digital-to-analog converter;

a comparator that compares said inputted analog signal with a reference voltage;

an adjustment circuit that adjusts a voltage range of the analog signal inputted to said operational amplifier and a voltage range in said digital-to-analog converter based on the output signal from said comparator;

a first switch that selectively inputs an inputted analog signal and a reference voltage equivalent to the reference voltage supplied to said comparator;

a signal generation circuit that generates a first signal having a first logic value and a second signal having a second logic value; and a second switch that sequentially supplies the first signal and second signal generated by said signal generation circuit in place of the output signal from said comparator when said equivalent voltage is inputted by said first switch.

\* \* \* \* \*